United States Patent
Ohashi et al.

(10) Patent No.: US 10,234,757 B2
(45) Date of Patent: Mar. 19, 2019

(54) POLYMER, MAKING METHOD, RESIST COMPOSITION, AND PATTERNING PROCESS

(71) Applicant: SHIN-ETSU CHEMICAL CO., LTD., Tokyo (JP)

(72) Inventors: Masaki Ohashi, Joetsu (JP); Tomohiro Kobayashi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 736 days.

(21) Appl. No.: 13/768,545

(22) Filed: Feb. 15, 2013

(65) Prior Publication Data

US 2013/0224659 A1 Aug. 29, 2013

(30) Foreign Application Priority Data

Feb. 27, 2012 (JP) ................. 2012-039622

(51) Int. Cl.
*G03F 7/004* (2006.01)
*C08F 220/18* (2006.01)
*C08F 220/38* (2006.01)
*C08F 220/24* (2006.01)
*C08F 220/28* (2006.01)

(52) U.S. Cl.
CPC ............ *G03F 7/004* (2013.01); *C08F 220/18* (2013.01); *C08F 220/38* (2013.01); *C08F 220/24* (2013.01); *C08F 2220/283* (2013.01)

(58) Field of Classification Search
None
See application file for complete search history.

(56) References Cited

U.S. PATENT DOCUMENTS

| 5,650,483 A | 7/1997 | Malik et al. |
| 5,945,250 A | 8/1999 | Aoai et al. |
| 6,048,672 A | 4/2000 | Cameron et al. |
| 6,187,504 B1 | 2/2001 | Suwa et al. |

(Continued)

FOREIGN PATENT DOCUMENTS

| EP | 0 473 547 A1 | 3/1992 |
| EP | 2112554 A2 | 10/2009 |

(Continued)

OTHER PUBLICATIONS

Machine translation JP 2011-118310. Jun. 16, 2011.*

(Continued)

*Primary Examiner* — Cynthia H Kelly
*Assistant Examiner* — Alyssa L Cepluch
(74) *Attorney, Agent, or Firm* — Westerman, Hattori, Daniels & Adrian, LLP

(57) ABSTRACT

A sulfonic acid anion-containing polymer having an alkylsulfonium cation not in covalent bond thereto can be readily prepared by reacting a sulfonic acid anion-containing polymer having an ammonium or metal cation with an alkylsulfonium salt under mild conditions. A resist composition comprising the inventive polymer is effective for suppressing acid diffusion since the sulfonium salt is bound to the polymer backbone. When processed by the ArF lithography, the polymer exhibits a lower absorption at the exposure wavelength than the triarylsulfonium salt form PAGs, resulting in improved resolution, mask fidelity, and LWR.

13 Claims, 5 Drawing Sheets

(56) References Cited

U.S. PATENT DOCUMENTS

| | | |
|---|---|---|
| 6,312,867 B1 | 11/2001 | Kinsho et al. |
| 6,830,866 B2 | 12/2004 | Kobayashi et al. |
| 6,849,374 B2 | 2/2005 | Cameron et al. |
| 6,908,722 B2 | 6/2005 | Ebata et al. |
| 7,514,202 B2 | 4/2009 | Ohsawa et al. |
| 7,527,912 B2 | 5/2009 | Ohsawa et al. |
| 7,556,909 B2 | 7/2009 | Kobayashi et al. |
| 7,569,326 B2 | 8/2009 | Ohsawa et al. |
| 7,622,242 B2 | 11/2009 | Hatakeyama et al. |
| 7,704,668 B1 | 4/2010 | Cameron et al. |
| 7,771,914 B2 | 8/2010 | Hatakeyama et al. |
| 7,812,105 B2 | 10/2010 | Nagai et al. |
| 7,919,226 B2 | 4/2011 | Ohsawa et al. |
| 7,932,334 B2 | 4/2011 | Ando et al. |
| 7,956,142 B2 | 6/2011 | Nagai et al. |
| 8,057,981 B2 | 11/2011 | Harada et al. |
| 8,057,985 B2 | 11/2011 | Ohashi et al. |
| 8,101,335 B2 | 1/2012 | Harada et al. |
| 8,114,570 B2 | 2/2012 | Ohsawa et al. |
| 8,114,571 B2 | 2/2012 | Ohashi et al. |
| 8,173,354 B2 | 5/2012 | Ohasawa et al. |
| 8,252,504 B2 | 8/2012 | Harada et al. |
| 8,268,528 B2 | 9/2012 | Harada et al. |
| 8,283,104 B2 | 10/2012 | Ohashi et al. |
| 8,313,886 B2 | 11/2012 | Harada et al. |
| 2003/0134227 A1* | 7/2003 | Cameron et al. .......... 430/270.1 |
| 2005/0069819 A1* | 3/2005 | Shiobara ................... 430/327 |
| 2005/0208424 A1 | 9/2005 | Hasegawa et al. |
| 2009/0234155 A1 | 9/2009 | Oh et al. |
| 2009/0269696 A1* | 10/2009 | Ohsawa et al. ............ 430/270.1 |
| 2010/0035185 A1 | 2/2010 | Hagiwara et al. |
| 2010/0055608 A1* | 3/2010 | Ohashi et al. ............. 430/270.1 |
| 2010/0112482 A1 | 5/2010 | Watanabe et al. |
| 2010/0233617 A1* | 9/2010 | Wada ...................... 430/270.1 |
| 2011/0014569 A1 | 1/2011 | Kasahara et al. |
| 2011/0165513 A1 | 7/2011 | Yamashita et al. |
| 2011/0177453 A1 | 7/2011 | Masubuchi et al. |
| 2011/0244392 A1* | 10/2011 | Hirano et al. ............. 430/270.1 |
| 2012/0003590 A1* | 1/2012 | Hirano et al. ................ 430/325 |
| 2012/0076997 A1* | 3/2012 | Hirano et al. ................ 428/199 |
| 2012/0135350 A1* | 5/2012 | Kobayashi et al. ....... 430/285.1 |
| 2012/0135357 A1* | 5/2012 | Kobayashi et al. .......... 430/326 |
| 2012/0164577 A1* | 6/2012 | Taniguchi et al. ......... 430/283.1 |
| 2012/0328993 A1 | 12/2012 | Utsumi et al. |
| 2013/0040096 A1 | 2/2013 | Iwato et al. |

FOREIGN PATENT DOCUMENTS

| | | | |
|---|---|---|---|
| EP | 1 270 553 B1 | | 11/2009 |
| JP | 4-230645 A | | 8/1992 |
| JP | 11-282168 A | | 10/1999 |
| JP | 2000-336121 A | | 12/2000 |
| JP | 2003-66612 A | | 3/2003 |
| JP | 2004157158 A | * | 6/2004 |
| JP | 3613491 B2 | | 1/2005 |
| JP | 3632410 B2 | | 3/2005 |
| JP | 2005-264103 A | | 9/2005 |
| JP | 2007-145797 A | | 6/2007 |
| JP | 2007-145804 A | | 6/2007 |
| JP | 2007-197718 A | | 8/2007 |
| JP | 3995575 B2 | | 10/2007 |
| JP | 2007-298569 A | | 11/2007 |
| JP | 2007-304490 A | | 11/2007 |
| JP | 2008-106045 A | | 5/2008 |
| JP | 2008-122932 A | | 5/2008 |
| JP | 2008-133448 A | | 6/2008 |
| JP | 4110319 B2 | | 7/2008 |
| JP | 2009-7327 A | | 1/2009 |
| JP | 4211971 B2 | | 1/2009 |
| JP | 4244755 B2 | | 3/2009 |
| JP | 2009-98638 A | | 5/2009 |
| JP | 2009-191151 A | | 8/2009 |
| JP | 2009-192784 A | | 8/2009 |
| JP | 2009-221454 A | | 10/2009 |
| JP | 2009-258695 A | | 11/2009 |
| JP | 2009-269953 A | | 11/2009 |
| JP | 2009-276363 A | | 11/2009 |
| JP | 4421707 B2 | | 2/2010 |
| JP | 2010-77404 A | | 4/2010 |
| JP | 2010-107695 A | | 5/2010 |
| JP | 2010-134012 A | | 6/2010 |
| JP | 2010-215608 A | | 9/2010 |
| JP | 2010-250105 A | | 11/2010 |
| JP | 2010256872 A | * | 11/2010 |
| JP | 2011-16746 A | | 1/2011 |
| JP | 2011-42789 A | | 3/2011 |
| JP | 2011118310 A | * | 6/2011 |
| JP | 2011-1568896 A | | 8/2011 |
| JP | 2011150211 A | * | 8/2011 |
| JP | 2011-215428 A | | 10/2011 |
| JP | 2011-248019 A | | 12/2011 |
| JP | 2011-256390 A | | 12/2011 |
| JP | 2013-1715 A | | 1/2013 |
| JP | 2013-95880 A | | 5/2013 |
| WO | 02/42845 A2 | | 5/2002 |
| WO | 2006/121096 A1 | | 11/2006 |
| WO | WO 2011149035 A1 | * | 12/2011 |

OTHER PUBLICATIONS

Machine translation JP 2011-150211. Aug. 4, 2011.*
Machine translation JP 2004-157158. Jun. 3, 2004.*
English Abstract JP 2010-256872. Nov. 11, 2010.*
Extended European Search Report dated Oct. 23, 2013, issued in corresponding European Patent Application No. 13156383.5.
Dammel et al., "193 nm Immersion Lithography—Taking the Plunge", Journal of Photopolymer Science and Technology, vol. 17, No. 4, 2004, pp. 587-601.
Qian et al., "Perfluoro-Enolate Chemistry: Facile Generation and Unique Reactivites of Metal F-1-PROPEN-2-OLATES", Tokyo Institue of Technology, vol. 29, No. 33, 1988, pp. 4119-4122.
Japanese Office Action dated Jun. 17, 2014, issued in corresponding Japanese Patent Application No. 2012-039622 (4 pages).

* cited by examiner

POLYMER, MAKING METHOD, RESIST COMPOSITION, AND PATTERNING PROCESS

CROSS-REFERENCE TO RELATED APPLICATION

This non-provisional application claims priority under 35 U.S.C. § 119(a) on Patent Application No. 2012-039622 filed in Japan on Feb. 27, 2012, the entire contents of which are hereby incorporated by reference.

TECHNICAL FIELD

This invention relates to (1) a polymer comprising an ionic compound consisting of an anion moiety bound to the polymer backbone and a cation moiety in the form of alkylsulfonium and capable of generating sulfonic acid in response to high-energy radiation or heat, (2) a resist composition comprising the polymer, (3) a pattern forming process using the resist composition, and (4) a method of preparing the polymer.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, extreme ultraviolet (EUV) lithography of 13.5 nm wavelength, and double patterning version of the ArF lithography, on which active research efforts have been made. Also, resist materials sensitive to high-energy radiation of short wavelength, typically electron beam (EB) find use in the mask image writing application.

The ArF lithography started partial use from the fabrication of 130-nm node devices and became the main lithography since 90-nm node devices. Although lithography using $F_2$ laser (157 nm) was initially thought promising as the next lithography for 45-nm node devices, its development was retarded by several problems. A highlight was suddenly placed on the ArF immersion lithography that introduces a liquid having a higher refractive index than air (e.g., water, ethylene glycol, glycerol) between the projection lens and the wafer, allowing the projection lens to be designed to a numerical aperture (NA) of 1.0 or higher and achieving a higher resolution. See Non-Patent Document 1.

In the photolithography using an ArF excimer laser (wavelength 193 nm) as the light source, a high sensitivity resist material capable of achieving a high resolution at a small dose of exposure is needed to prevent the degradation of precise and expensive optical system materials. Among several measures for providing high sensitivity resist material, the most common is to select each component which is highly transparent at the wavelength of 193 nm. For example, polymers of acrylic acid and derivatives thereof, norbornene-maleic anhydride alternating copolymers, polynorbornene, ring-opening metathesis polymerization (ROMP) polymers, and hydrogenated ROMP polymers have been proposed as the base resin. This choice is effective to some extent in that the transparency of a resin alone is increased.

Studies have also been made on photoacid generators. PAGs capable of generating perfluoroalkanesulfonic acids having a high acid strength are generally used in ArF chemically amplified resist compositions. These PAGs capable of generating perfluoroalkanesulfonic acids were already developed for use in the KrF resist compositions. For instance, Patent Documents 1 and 2 describe PAGs capable of generating perfluorohexanesulfonic acid, perfluorooctanesulfonic acid, perfluoro-4-ethylcyclohexanesulfonic acid, and perfluorobutanesulfonic acid.

Among these, perfluorooctanesulfonic acid and homologues thereof (collectively referred to as PFOS) are considered problematic with respect to their non-degradability and biological concentration in the environment. Manufacturers made efforts to develop partially fluorinated alkane sulfonic acids having a reduced degree of fluorine substitution as the replacement to PFOS. For instance, Patent Document 3 refers to the synthesis of $\alpha,\alpha$-difluoroalkanesulfonic acid salts from $\alpha,\alpha$-difluoroalkene and a sulfur compound and discloses a resist composition comprising a PAG which generates such sulfonic acid upon exposure, specifically di(4-tert-butyl-phenyl)iodonium 1,1-difluoro-2-(1-naphthyl)ethanesulfonate. Patent Document 4 refers to the development of $\alpha,\alpha,\beta,\beta$-tetrafluoroalkanesulfonic acid salts from $\alpha,\alpha,\beta,\beta$-tetrafluoro-$\alpha$-iodoalkane and sulfur compound and discloses a resist composition comprising a PAG capable of generating such a sulfonic acid.

However, as the circuit line width is reduced by the recent rapid advance of technology, the degradation of contrast by acid diffusion becomes more serious for the resist material even when partially fluorinated alkanesulfonic acid generators as mentioned above are used. The reason is that the pattern feature size is approaching the diffusion length of acid, and this causes degradations of mask fidelity, line width roughness (LWR) and pattern rectangularity. Accordingly, to gain more benefits from a reduction of exposure light wavelength and an increase of lens NA, the resist material is required to increase a dissolution contrast or restrain acid diffusion, as compared with the prior art materials.

Under the circumstances, it was proposed to incorporate a PAG into a polymer for suppressing acid diffusion. For instance, Patent Document 5 describes a polymer using an acryloyloxyphenyldiphenylsulfonium salt as a monomer. Patent Document 6 proposes to incorporate the monomer into a polyhydroxystyrene resin for improving the LWR of this base resin. However, since the sulfonium salt is bound at its cation side to the polymer, the sulfonic acid generated therefrom upon exposure to high-energy radiation is equivalent to the sulfonic acids generated by conventional PAGs. These proposals are thus insufficient to suppress acid diffusion and unsatisfactory to overcome the outstanding problem. Also, Patent Document 7 discloses sulfonium salts having an anion side incorporated into the polymer backbone such as polystyrenesulfonic acid. The acids generated therefrom are arenesulfonic and alkylsulfonic acid derivatives which have too low an acid strength to sever acid labile groups, especially acid labile groups in ArF chemically amplified resist compositions. Patent Document 8 discloses polymers having three partially fluorinated sulfonic acid anions in combination with a specific lactone compound. Patent Document 9 describes exemplary three anions. Since they are esters of carboxylic acids which are strong acids, they are expected to be readily hydrolyzable and low stable. Copolymers derived therefrom have an insufficient solubility in resist solvents. Furthermore, Patent Document 10 discloses a sulfonium salt having a partially fluorinated alkane sulfonic acid anion as a polymerizable unit, which has insufficient resist performance in terms of resolution and LWR.

A resist material based on a polymer having PAG incorporated as polymerizable units, especially having an anion moiety incorporated in the polymer backbone is effective for suppressing acid diffusion because the acid-generating moiety is bound to the polymer backbone. The resist material, however, has the drawback that the resist film has a low transmittance and low resolution. This is because triphenylsulfonium is generally used as the counter cation.

Triphenylsulfonium salts are most often used as the PAG in the ArF lithography. They advantageously have good stability and acid generation efficiency in the resist film, but undesirably serve to reduce the transmittance and resolution of the resist film due to high absorption at the ArF exposure wavelength (193 nm). Aiming at a higher sensitivity and resolution, Patent Document 11 reports the development of alkylsulfonium salt form PAGs, specifically 4-alkoxynaphthyl-1-tetrahydrothiophenium cations and Patent Document 12 discloses a resist composition comprising a resin having a plurality of acid labile groups in combination with such salt. The acid diffusion suppression is still insufficient to gain acceptable mask fidelity and LWR.

There is a possibility that acid diffusion is suppressed without a substantial loss of transmittance by following the same concept as triphenylsulfonium salts, specifically by introducing a polymerizable functional group to a cation or anion moiety of an alkylsulfonium salt and incorporating the salt into a base polymer. However, in an attempt to synthesize an alkylsulfonium salt-containing base polymer, alkylsulfonium salt-containing units can be decomposed during polymerization, making it difficult to produce the desired polymer. This is because the alkylsulfonium salt is highly reactive with a nucleophile or the like and unstable. Patent Document 13 mentions to incorporate into a base polymer a sulfonium salt having a polymerizable functional group introduced in its anion moiety and lists up alkylsulfonium cations as typical counter cation, but describes nowhere actual synthesis examples.

Extreme ultraviolet (EUV) lithography is regarded promising as the exposure technology following the ArF lithography while electron beam (EB) lithography is adopted for mask image writing. For these lithography processes, it would be desirable to have a resist composition exhibiting improved properties including resolution, mask fidelity and LWR while minimizing the impact of acid diffusion so that the resist may comply with the current requirement of further pattern miniaturization.

CITATION LIST

Patent Document 1: JP 4421707 (U.S. Pat. No. 7,704,668)
Patent Document 2: JP-A H11-282168 (U.S. Pat. No. 6,048,672)
Patent Document 3: JP 4211971 (WO 02/42845)
Patent Document 4: JP 4110319 (U.S. Pat. No. 6,908,722, EP 1270553)
Patent Document 5: JP-A H04-230645
Patent Document 6: JP 4244755
Patent Document 7: JP 3613491 (U.S. Pat. No. 5,945,250)
Patent Document 8: WO 06/121096
Patent Document 9: JP-A 2007-197718
Patent Document 10: JP-A 2008-133448
Patent Document 11: JP 3632410 (U.S. Pat. No. 6,187,504)
Patent Document 12: JP 3995575
Patent Document 13: JP-A 2011-215428
Non-Patent Document 1: Journal of Photopolymer Science and Technology, Vol. 17, No. 4, p 587 (2004)

DISCLOSURE OF INVENTION

An object of the invention is to provide a polymer comprising an ionic compound consisting of an anion moiety bound to the polymer backbone and a cation moiety in the form of alkylsulfonium; a method of preparing the polymer; a resist composition comprising the polymer as base resin, which exhibits high resolution, minimal LWR and improved mask fidelity when processed by photolithography using high-energy radiation such as ArF excimer laser, EUV or EB; and a pattern forming process using the resist composition.

The inventors have found that a polymer comprising an ionic compound consisting of an anion moiety bound to the polymer backbone and a cation moiety in the form of alkylsulfonium can be prepared in a stable manner without the risk of decomposition, and that a resist composition comprising the polymer as a base resin exhibits improved properties including resolution, mask fidelity and LWR. The resist composition is very effective for precise micropatterning.

The invention provides (1) a polymer comprising an ionic compound consisting of an anion moiety bound to the polymer backbone and a cation moiety in the form of alkylsulfonium and capable of generating sulfonic acid in response to high-energy radiation or heat, (2) a resist composition comprising the polymer, (3) a pattern forming process using the resist composition, and (4) a method of preparing the polymer.

In one aspect, the invention provides a sulfonic acid anion-containing polymer having an alkylsulfonium cation not in covalent bond thereto.

In one preferred embodiment, the anion moiety of sulfonic acid anion-containing unit is of the structure having the general formula (1):

(1)

wherein $R^1$ is hydrogen, fluorine, methyl or trifluoromethyl, and L is a divalent $C_1$-$C_{20}$ organic group which may contain a heteroatom, and the alkylsulfonium cation is of the structure having the general formula (4):

(4)

wherein $R^{11}$, $R^{12}$ and $R^{13}$ are each independently a substituted or unsubstituted, straight, branched or cyclic $C_1$-$C_{10}$ alkyl, alkenyl or oxoalkyl group or a substituted or unsubstituted $C_6$-$C_{18}$ aryl, aralkyl or aryloxoalkyl group, or two of $R^{11}$, $R^{12}$ and $R^{13}$ may bond together to form a ring with the sulfur atom, with the proviso that at least one of $R^{11}$, $R^{12}$ and $R^{13}$ is an alkyl group.

In a preferred embodiment, the polymer may further comprise recurring units having the general formula (2):

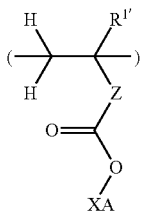

(2)

wherein $R^{1\prime}$ is hydrogen, fluorine, methyl or trifluoromethyl, Z is a single bond, phenylene, naphthylene or (backbone)-C(=O)-O-Z'-, Z' is a straight, branched or cyclic $C_1$-$C_{10}$ alkylene group which may contain a hydroxyl radical, ether bond, ester bond, or lactone ring, or a phenylene or naphthylene group, and XA is an acid labile group.

In a preferred embodiment, the polymer may further comprise recurring units having the general formula (3):

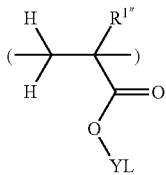

(3)

wherein $R^{1\prime\prime}$ is hydrogen, fluorine, methyl or trifluoromethyl, and YL is a polar group having one or more structures selected from the group consisting of hydroxyl, cyano, carbonyl, ether bond, ester bond, sulfonic acid ester bond, carbonate, lactone ring, sultone ring, and carboxylic anhydride.

In another aspect, the invention provides a resist composition comprising the polymer defined above. The resist composition may further comprise one or more of a photoacid generator, quencher, solvent, and surfactant.

In a further aspect, the invention provides a method of preparing the polymer defined above, comprising the step of reacting a sulfonic acid anion-containing polymer having an ammonium or metal cation not in covalent bond thereto with an alkylsulfonium salt.

In a preferred embodiment, an alkylsulfonium salt having the general formula (7) acts on a polymer having the general formula (5) to induce cation exchange reaction.

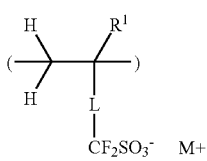

(5)

Herein $R^1$ is hydrogen, fluorine, methyl or trifluoromethyl, L is a divalent $C_1$-$C_{20}$ organic group which may contain a heteroatom, and $M^+$ is an ammonium or metal cation.

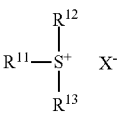

(7)

Herein $R^{11}$, $R^{12}$ and $R^{13}$ are each independently a substituted or unsubstituted, straight, branched or cyclic $C_1$-$C_{10}$ alkyl, alkenyl or oxoalkyl group or a substituted or unsubstituted $C_6$-$C_{18}$ aryl, aralkyl or aryloxoalkyl group, or two of $R^{11}$, $R^{12}$ and $R^{13}$ may bond together to form a ring with the sulfur atom, with the proviso that at least one of $R^{11}$, $R^{12}$ and $R^{13}$ is an alkyl group, and $X^-$ is an anion.

Preferably, the step of reacting a sulfonic acid anion-containing polymer having an ammonium or metal cation not in covalent bond thereto with an alkylsulfonium salt is performed in a two-layer system using water and an organic solvent separable from water.

In a still further aspect, the invention provides a pattern forming process comprising the steps of coating the resist composition defined above onto a substrate, baking to form a resist film, exposing the resist film to high-energy radiation, and developing it in a developer.

In a preferred embodiment, the high-energy radiation has a wavelength in the range of 180 to 250 nm.

In another preferred embodiment, the step of exposing to high-energy radiation includes immersion lithography of exposing the resist film to radiation via a liquid. The pattern forming process may further comprise the step of forming a protective film on the resist film, so that the protective film intervenes between the resist film and the liquid during the immersion lithography.

In another preferred embodiment, the high-energy radiation is EUV or EB.

The resist composition is not only effective in the ArF dry lithography and ArF immersion lithography, but is also applicable to other lithography processes using high-energy radiation such as KrF excimer laser, EUV, and EB.

Advantageous Effects of Invention

The resist composition comprising the inventive polymer is effective for suppressing acid diffusion since the sulfonium salt is incorporated in and bound to the polymer backbone. When processed by the ArF lithography, the polymer exhibits a lower absorption at the exposure wavelength than the triarylsulfonium salt form PAGs, and as a result, resolution, mask fidelity, LWR and other resist properties are improved. The resist composition is very effective for precise micropatterning. Since the method employs very mild conditions for polymer synthesis, a sulfonic acid anion-containing polymer having an alkylsulfonium cation, which is generally unstable, can be readily prepared.

DESCRIPTION OF EMBODIMENTS

Figure 1:
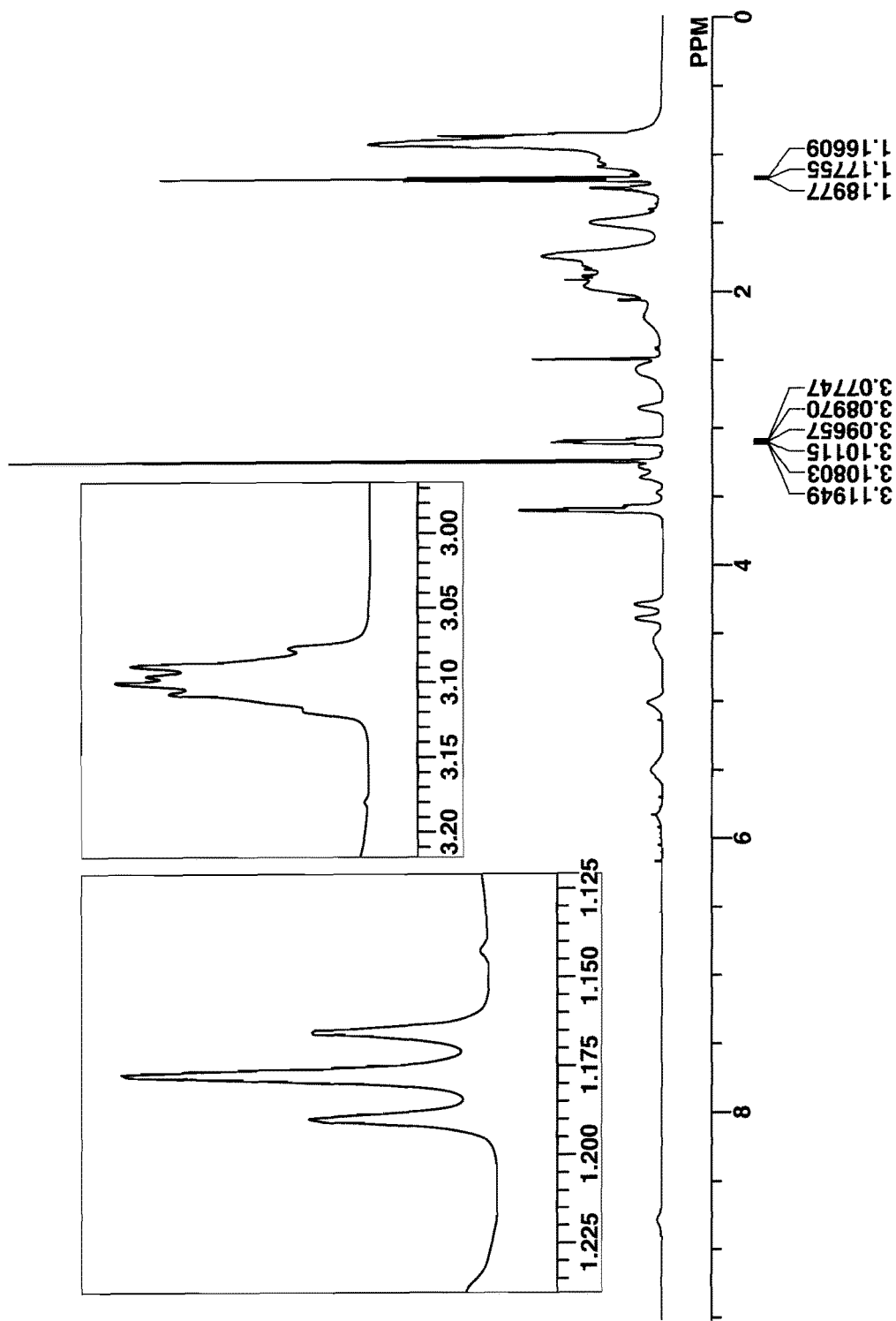
FIG. 1 is a diagram of $^1$H-NMR spectroscopy of Polymer P-1 in Synthesis Example 2-1.

The singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group.

The abbreviations have the following meaning.
EB: electron beam
UV: ultraviolet
EUV: extreme ultraviolet
PAG: photoacid generator
PEB: post-exposure bake
LWR: line width roughness The term "high-energy radiation" is intended to encompass UV, deep UV, EUV, EB, x-ray, excimer laser, gamma-ray and synchrotron radiation.

One embodiment of the invention is an alkylsulfonium salt-containing polymer having an anion moiety bound to its backbone. The term "alkylsulfonium salt" refers to a sulfonium salt in which one of the groups bonded to the sulfur atom is an alkyl group.

Typically the cation moiety of the alkylsulfonium salt has the general formula (4).

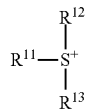

(4)

Herein $R^{11}$, $R^{12}$ and $R^{13}$ are each independently a substituted or unsubstituted, straight, branched or cyclic $C_1$-$C_{10}$ alkyl, alkenyl or oxoalkyl group or a substituted or unsubstituted $C_6$-$C_{18}$ aryl, aralkyl or aryloxoalkyl group, or two of $R^{11}$, $R^{12}$ and $R^{13}$ may bond together to form a ring with the sulfur atom, with the proviso that at least one of $R^{11}$, $R^{12}$ and $R^{13}$ is an alkyl group.

Of the groups represented by $R^{11}$ to $R^{13}$, suitable alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Suitable alkenyl groups include vinyl, allyl, propenyl, butenyl, hexenyl, and cyclohexenyl. Suitable oxoalkyl groups include 2-oxocyclopentyl, 2-oxocyclohexyl, 2-oxopropyl, and 2-oxoethyl. Suitable aryl groups include phenyl, naphthyl and thienyl, as well as hydroxyphenyl and alkoxyphenyl groups such as 4-hydroxyphenyl, 4-methoxyphenyl, 3-methoxyphenyl, 2-methoxyphenyl, 4-ethoxyphenyl, 4-tert-butoxyphenyl, and 3-tert-butoxyphenyl, alkylphenyl groups such as 2-methylphenyl, 3-methylphenyl, 4-methylphenyl, 4-ethylphenyl, 4-tert-butylphenyl, 4-n-butylphenyl, and 2,4-dimethylphenyl, hydroxynaphthyl and alkoxynaphthyl groups such as 4-hydroxynaphthyl, 4-methoxynaphthyl, 2-methoxynaphthyl, 4-ethoxynaphthyl, 4-tert-butoxynaphthyl, 2-tert-butoxynaphthyl, 4-butoxynaphthyl, 2-butoxynaphthyl, 4-(2-methoxyethoxy)naphthyl, and 4-(2,2,2-trifluoroethoxy)naphthyl, alkylnaphthyl groups such as methylnaphthyl and ethylnaphthyl, dialkylnaphthyl groups such as dimethylnaphthyl and diethylnaphthyl, and dialkoxynaphthyl groups such as dimethoxynaphthyl and diethoxynaphthyl. Suitable aralkyl groups include benzyl, 1-phenylethyl, and 2-phenylethyl. Suitable aryloxoalkyl groups include 2-phenyl-2-oxoethyl, 2-(1-naphthyl)-2-oxoethyl, and 2-(2-naphthyl)-2-oxoethyl. In these hydrocarbon groups, one or more hydrogen atoms may be substituted by a heteroatom or atoms such as oxygen, sulfur, nitrogen or halogen atom, to eventually form a hydroxyl, cyano, carbonyl, ether bond, ester bond, sulfonic acid ester link, carbonate, lactone ring, sultone ring, carboxylic anhydride, or haloalkyl group.

Alternatively, at least two of $R^{11}$, $R^{12}$ and $R^{13}$ bond together to form a ring with the sulfur atom in the formula. Exemplary ring structures are given below.

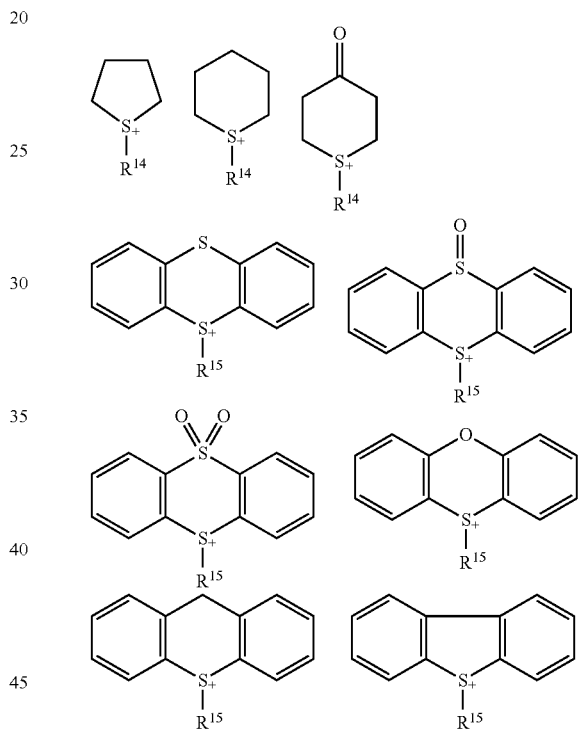

Herein $R^{14}$ is a substituted or unsubstituted, straight, branched or cyclic $C_1$-$C_{10}$ alkyl, alkenyl or oxoalkyl group or a substituted or unsubstituted $C_6$-$C_{18}$ aryl, aralkyl or aryloxoalkyl group, and $R^{15}$ is a substituted or unsubstituted, straight, branched or cyclic $C_1$-$C_{10}$ alkyl group.

Examples of the $C_1$-$C_{10}$ alkyl, alkenyl or oxoalkyl group or $C_6$-$C_{18}$ aryl, aralkyl or aryloxoalkyl group represented by $R^{14}$ are as illustrated above in conjunction with $R^{11}$ to $R^{13}$. Examples of the $C_1$-$C_{10}$ alkyl group represented by $R^{15}$ are as illustrated above in conjunction with $R^{11}$ to $R^{13}$.

Illustrative, non-limiting examples of the sulfonium cation include trimethylsulfonium, tribenzylsulfonium, 2-oxocyclohexylcyclohexylmethylsulfonium, dimethylphenylsulfonium, dimethylnaphthylsulfonium, dimethyl(2-naphthyl)sulfonium, 4-hydroxyphenyldimethylsulfonium, 4-methoxyphenyldimethylsulfonium, diphenylmethylsulfonium, 1-(2-oxo-2-phenylethyl)tetrahydrothiophenium, 1-[2-(1-naphthyl)-2-oxoethyl]tetrahydrothiophenium, 1-[2-(2-naphthyl)-2-oxoethyl]tetrahydrothiophenium, diphenyl-2- thienylsulfonium, 1-(4-n-butoxyphenyl)tetrahydrothiophenium, 1-(4-methoxyphenyl)tetrahydrothiophenium, 1-(4-cyclohexyloxyphenyl)tetrahydrothiophenium, 1-{4-(2-methoxyethoxy)phenyl}tetrahydrothiophenium, 1-(4-benzyloxyphenyl)tetrahydrothiophenium, 1-(4-phenethyloxyphenyl)tetrahydrothiophenium, 1-{4-(2,2,2-trifluoroethoxy)phenyl}tetrahydrothiophenium, 1-(4-hydroxyphenyl)tetrahydrothiophenium, 1-(4-n-butoxy-1-naphthalenyl)tetrahydrothiophenium, 1-(2-n-butoxy-1-naphthalenyl)tetrahydrothiophenium, 1-(4-methoxy-1-naphthalenyl)tetrahydrothiophenium, 1-(2-methoxy-1-naphthalenyl)tetrahydrothiophenium, 1-(4-cyclohexyloxy-1-naphthalenyl)tetrahydrothiophenium, 1-(2-cyclohexyloxy-1-naphthalenyl)tetrahydrothiophenium, 1-[4-(2-methoxyethoxy)-1-naphthalenyl)tetrahydrothiophenium, 1-[2-(2-methoxyethoxy)-1-naphthalenyl)tetrahydrothiophenium, 1-(4-benzyloxy-1-naphthalenyl)tetrahydrothiophenium, 1-(2-benzyloxy-1-naphthalenyl)tetrahydrothiophenium, 1-(4-phenethyloxy-1-naphthalenyl)tetrahydrothiophenium, 1-(2-phenethyloxy-1-naphthalenyl)tetrahydrothiophenium, 1-[4-(2,2,2-trifluoroethoxy)-1-naphthalenyl)tetrahydrothiophenium, 1-[2-(2,2,2-trifluoroethoxy)-1-naphthalenyl)tetrahydrothiophenium, 1-(4-hydroxy-1-naphthalenyl)tetrahydrothiophenium, 1-(4-n-butoxyphenyl)tetrahydrothiopyranium, 1-(4-methoxyphenyl)tetrahydrothiopyranium, 1-(4-cyclohexyloxyphenyl)tetrahydrothiopyranium, 1-[4-(2-methoxyethoxy)phenyl]tetrahydrothiopyranium, 1-(4-benzyloxyphenyl)tetrahydrothiopyranium, 1-(4-phenethyloxyphenyl)tetrahydrothiopyranium, 1-[4-(2,2,2-trifluoroethoxy)phenyl]tetrahydrothiopyranium, 1-(4-hydroxyphenyl)tetrahydrothiopyranium, 1-(4-n-butoxy-1-naphthalenyl)tetrahydrothiopyranium, 1-(2-n-butoxy-1-naphthalenyl)tetrahydrothiopyranium, 1-(4-methoxy-1-naphthalenyl)tetrahydrothiopyranium, 1-(2-methoxy-1-naphthalenyl)tetrahydrothiopyranium, 1-(4-cyclohexyloxy-1-naphthalenyl)tetrahydrothiopyranium, 1-(2-cyclohexyloxy-1-naphthalenyl)tetrahydrothiopyranium, 1-(4-methoxyethoxy-1-naphthalenyl)tetrahydrothiopyranium, 1-(2-methoxyethoxy-1-naphthalenyl)tetrahydrothiopyranium, 1-(4-benzyloxy-1-naphthalenyl)tetrahydrothiopyranium, 1-(2-benzyloxy-1-naphthalenyl)tetrahydrothiopyranium, 1-(4-phenethyloxy-1-naphthalenyl)tetrahydrothiopyranium, 1-(2-phenethyloxy-1-naphthalenyl)tetrahydrothiopyranium, 1-[4-(2,2,2-trifluoroethoxy)-1-naphthalenyl)tetrahydrothiopyranium, 1-[2-(2,2,2-trifluoroethoxy)-1-naphthalenyl)tetrahydrothiopyranium, 1-(4-hydroxy-1-naphthalenyl)tetrahydrothiopyranium. Inter alia, 1-(4-hydroxy-1-naphthalenyl)tetrahydrothiophenium and 1-(4-alkoxy-1-naphthalenyl)tetrahydrothiophenium are preferred.

The polymer is characterized by an alkylsulfonium salt whose anion moiety is bound to the polymer backbone. The preferred anion moiety has the structure of α,α'-difluorosulfonate having the general formula (1).

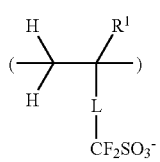

(1)

Herein R¹ is hydrogen, fluorine, methyl or trifluoromethyl, and L is a divalent $C_1$-$C_{20}$ organic group which may contain a heteroatom.

Examples of the divalent organic group represented by L include straight alkanediyl groups such as methylene, ethylene, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, and heptadecane-1,17-diyl; branched alkanediyl groups obtained by adding a side chain such as methyl, ethyl, propyl, isopropyl, butyl, sec-butyl or tert-butyl to the foregoing straight alkanediyl groups; divalent saturated cyclic hydrocarbon groups such as cyclopentanediyl, cyclohexanediyl, norbornanediyl, and adamantanediyl; and divalent unsaturated cyclic hydrocarbon groups such as phenylene and naphthylene. L may also be a combination of two or more of the foregoing groups. Also included are substituted forms of the foregoing groups in which one or more hydrogen atoms are substituted by a heteroatom or atoms such as oxygen, sulfur, nitrogen, and halogen atom to eventually form a hydroxyl, cyano, carbonyl, ether bond, ester bond, sulfonic acid ester link, carbonate, lactone ring, sultone ring, carboxylic anhydride or haloalkyl group.

Illustrative examples of the anion having formula (1) are given below. The structure of the anion moiety of the polymer is not limited thereto.

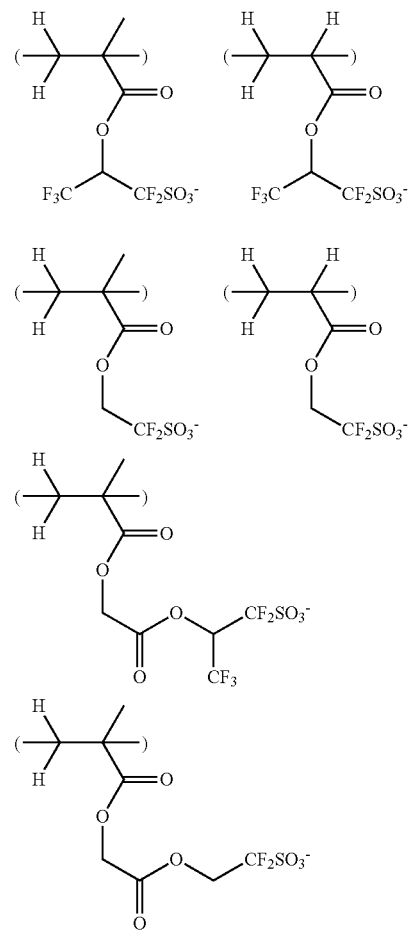

-continued
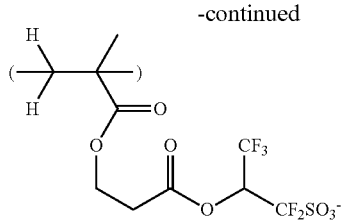
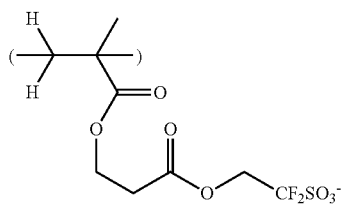
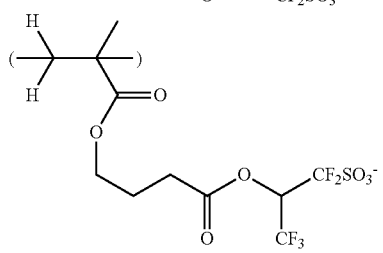
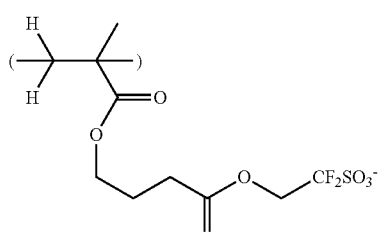
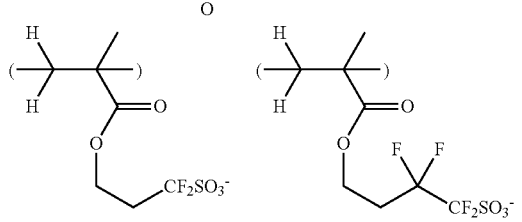
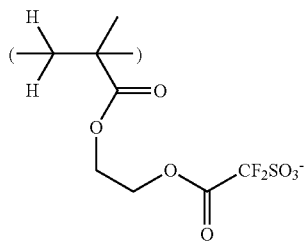
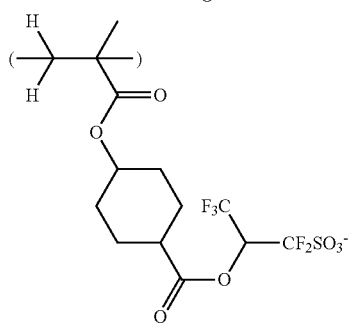
-continued
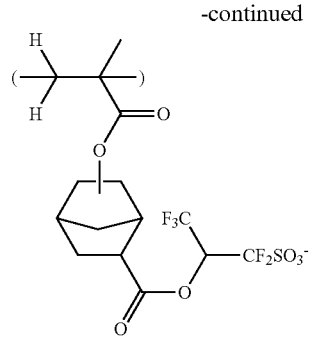
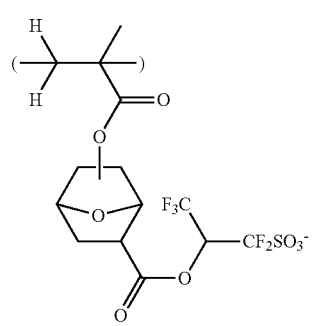
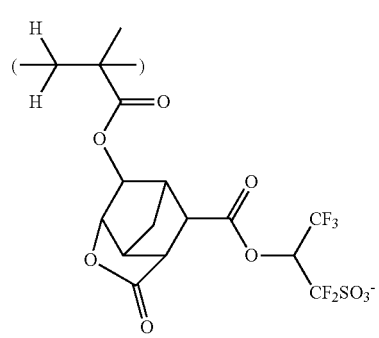
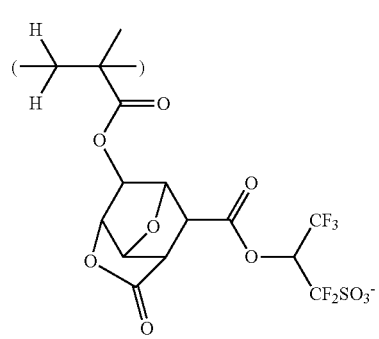
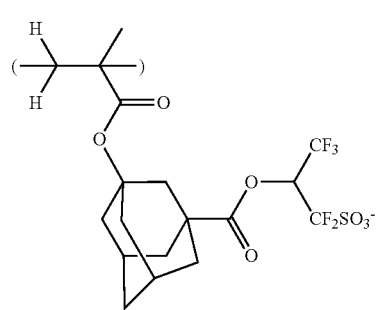

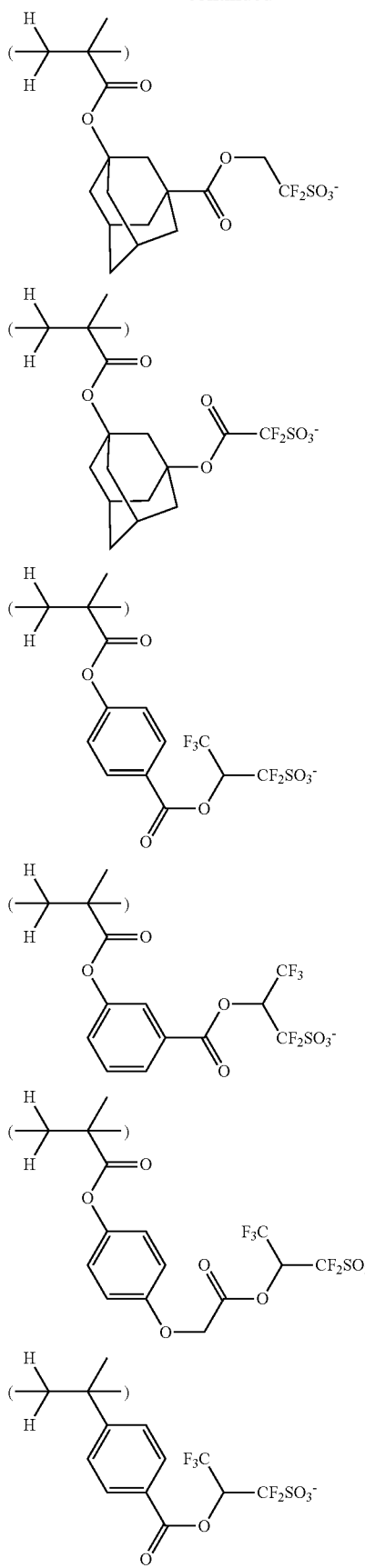
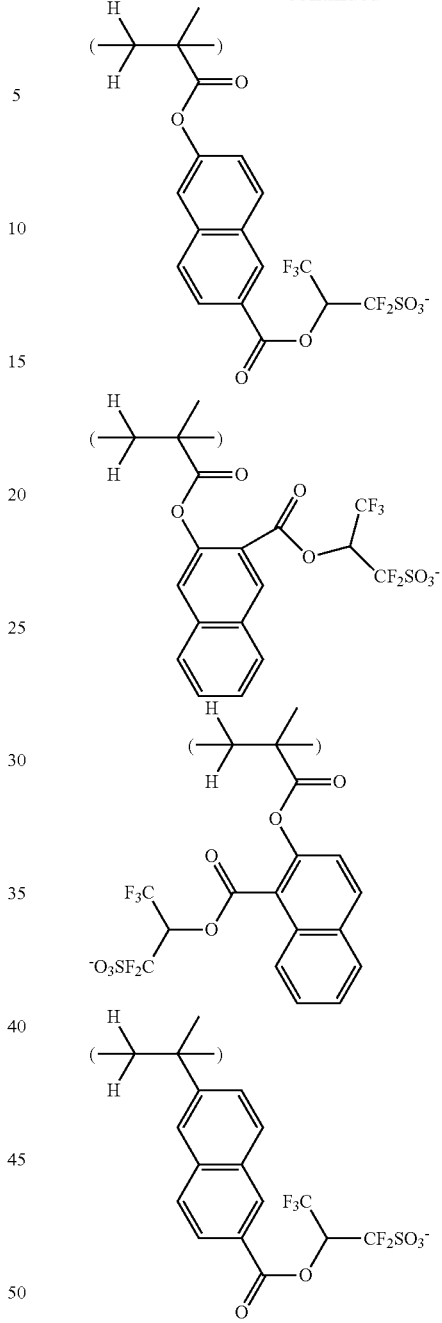

While the polymer is defined as comprising recurring units of an ionic compound consisting of an anion moiety bound to the polymer backbone and a cation moiety in the form of alkylsulfonium, it is specifically a combination of the anion structure having formula (1) with the cation structure having formula (4), for example, a combination of an exemplary anion structure with an exemplary cation structure as illustrated above.

In addition to the recurring units of an ionic compound consisting of an anion moiety bound to the polymer backbone and a cation moiety in the form of alkylsulfonium, the polymer may further comprise recurring units having an acid labile group. The recurring unit having an acid labile group typically has the general formula (2).

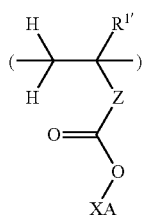
(2)

Herein $R^1$ is hydrogen, fluorine, methyl or trifluoromethyl. Z is a single bond, phenylene, naphthylene or (backbone)-C(=O)—O—Z'—, wherein Z' is a straight, branched or cyclic $C_1$-$C_{10}$ alkylene group which may contain a hydroxyl radical, ether bond, ester bond or lactone ring, or Z' is a phenylene or naphthylene group. XA is an acid labile group.

Examples of the unit having formula (2) wherein Z is a variant are shown below.

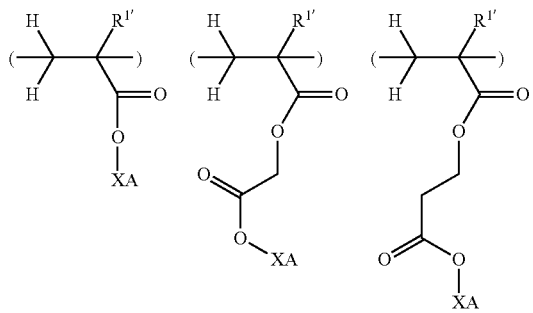

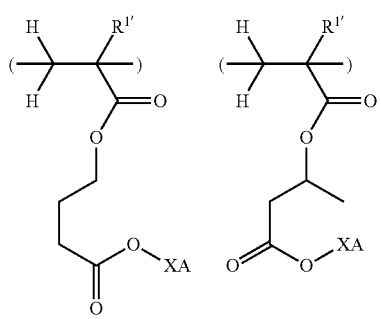

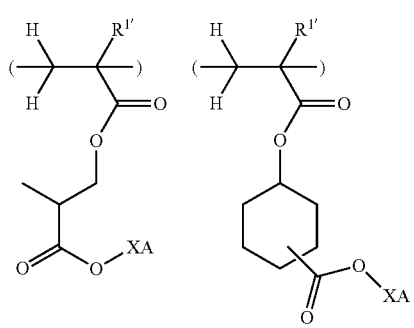

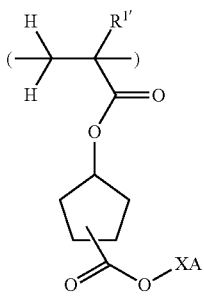
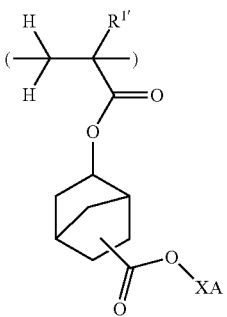

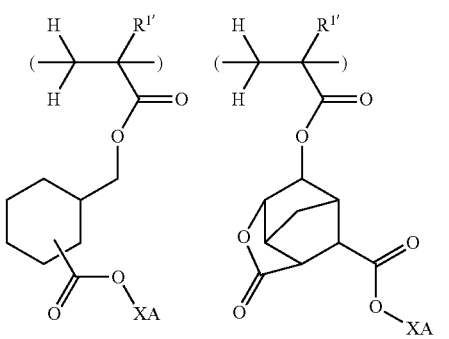

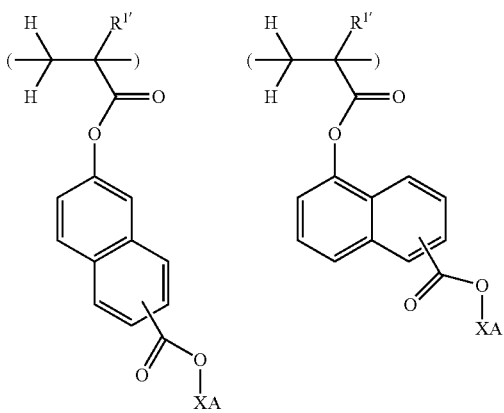

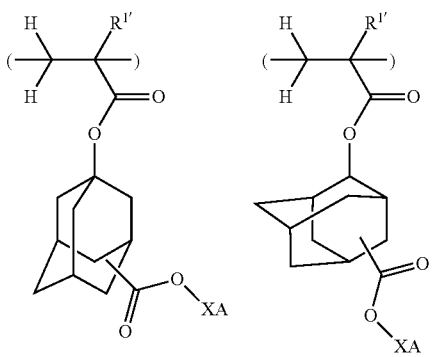

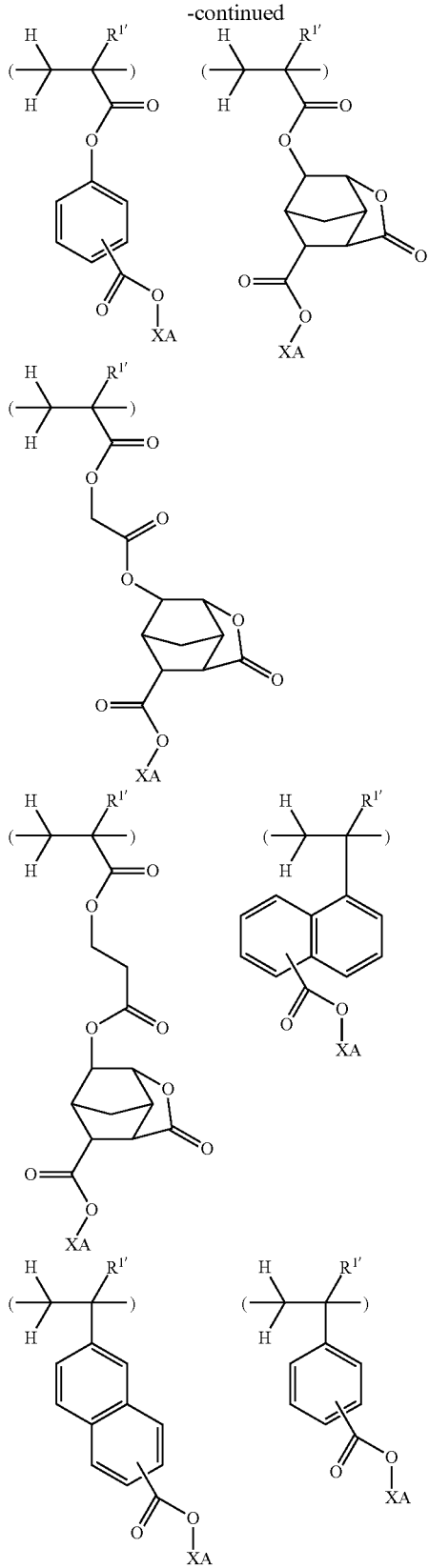

group represented by XA may be selected from a variety of such groups. Examples of the acid labile group include groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

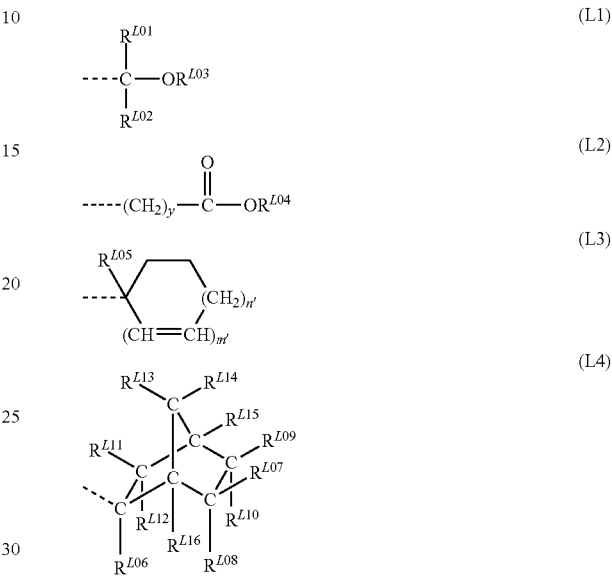

In these formulae, the broken line denotes a valence bond.

In formula (L1), $R^{L01}$ and $R^{L02}$ each are hydrogen or a straight, branched or cyclic alkyl group of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, n-octyl, norbornyl, tricyclodecanyl, tetracyclododecanyl, and adamantyl. $R^{L03}$ is a monovalent hydrocarbon group of 1 to 18 carbon atoms, preferably 1 to 10 carbon atoms, which may contain a hetero atom such as oxygen, examples of which include unsubstituted straight, branched or cyclic alkyl groups and substituted forms of such alkyl groups in which some hydrogen atoms are replaced by hydroxyl, alkoxy, oxo, amino, alkylamino or the like, or in which an oxygen atom is interposed between carbon atoms. Exemplary straight, branched or cyclic alkyl groups include methyl, ethyl, propyl, isopropyl, n-butyl, sec-butyl, tert-butyl, cyclopentyl, cyclohexyl, 2-ethylhexyl, n-octyl, norbornyl, tricyclodecanyl, tetracyclododecanyl, and adamantyl. Illustrative examples of the substituted alkyl groups are shown below.

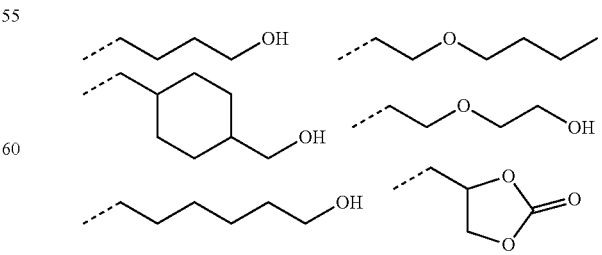

Under the action of acid, a polymer comprising recurring units of formula (2) is decomposed to generate carboxylic acid, turning to be an alkali soluble polymer. The acid labile A pair of $R^{L01}$ and $R^{L02}$, $R^{L01}$ and $R^{L03}$, or $R^{L02}$ and $R^{L03}$ may bond together to form a ring with the carbon and oxygen atoms to which they are attached. Each of $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)pro- pan-2-yl, 2-(adamantan-1-yl)propan-2-yl, 1-ethylcyclopen- tyl, 1-butylcyclopentyl, 1-ethylcyclohexyl, 1-butylcyclo- hexyl, 1-ethyl-2-cyclopentenyl, 1-ethyl-2-cyclohexenyl, 2-methyl-2-adamantyl, and 2-ethyl-2-adamantyl. Exem- plary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl- 2-oxooxolan-5-yl. Letter y is an integer of 0 to 6.

In formula (L3), $R^{L05}$ is a substituted or unsubstituted, straight, branched or cyclic $C_1$-$C_8$ alkyl group or a substi- tuted or unsubstituted $C_6$-$C_{20}$ aryl group. Examples of the optionally substituted alkyl group include straight, branched or cyclic alkyl groups such as methyl, ethyl, propyl, isopro- pyl, n-butyl, sec-butyl, tert-butyl, tert-amyl, n-pentyl, n-hexyl, cyclopentyl, and cyclohexyl, and substituted forms of such groups in which some hydrogen atoms are substi- tuted by hydroxyl, alkoxy, carboxyl, alkoxycarbonyl, oxo, amino, alkylamino, cyano, mercapto, alkylthio, sulfo or other groups. Examples of the optionally substituted aryl groups include phenyl, methylphenyl, naphthyl, anthryl, phenanthryl, and pyrenyl. Letter m' is equal to 0 or 1, n' is equal to 0, 1, 2 or 3, and 2 m'+n' is equal to 2 or 3.

In formula (L4), $R^{L06}$ is a substituted or unsubstituted, straight, branched or cyclic $C_1$-$C_8$ alkyl group or a substi- tuted or unsubstituted $C_6$-$C_{20}$ aryl group. Examples of these groups are the same as exemplified for $R^{L05}$. $R^{L07}$ to $R^{L16}$ independently represent hydrogen or monovalent $C_1$-$C_{15}$ hydrocarbon groups. Exemplary hydrocarbon groups are straight, branched or cyclic alkyl groups such as methyl, ethyl, propyl, isopropyl, n-butyl, sec-butyl, tert-butyl, tert- amyl, n-pentyl, n-hexyl, n-octyl, n-nonyl, n-decyl, cyclo- pentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxyl, alkoxycarbonyl, oxo, amino, alkylamino, cyano, mercapto, alkylthio, sulfo or other groups. Alterna- tively, $R^{L07}$ to $R^{L16}$ taken together, form a ring with the carbon atom to which they are attached (for example, a pair of $R^{L07}$ and $R^{L08}$, $R^{L07}$ and $R^{L09}$, $R^{L07}$ and $R^{L10}$, $R^{L08}$ and $R^{L10}$, $R^{L09}$ and $R^{L10}$, $R^{L11}$ and $R^{L12}$, or $R^{L13}$ and $R^{L14}$ form a ring). Each of $R^{L07}$ to $R^{L16}$ represents a divalent $C_1$-$C_{15}$ hydrocarbon group when they form a ring, examples of which are the ones exemplified above for the monovalent hydrocarbon groups, with one hydrogen atom being elimi- nated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or $R^{L14}$ and $R^{L15}$).

Of the acid labile groups of formula (L1), the straight and branched ones are exemplified by the following groups.

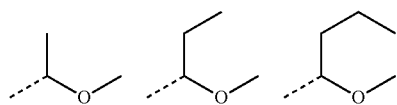

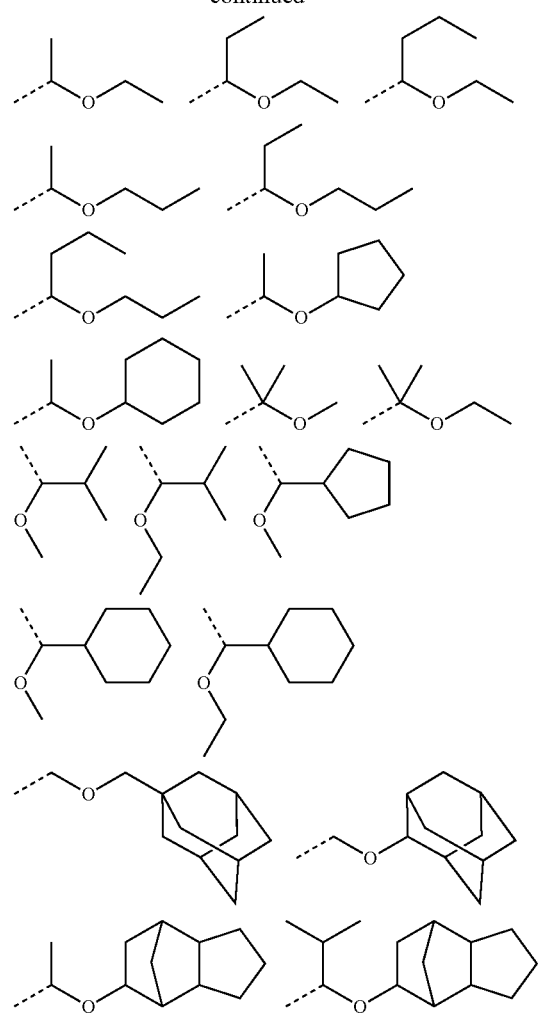

Of the acid labile groups of formula (L1), the cyclic ones are, for example, tetrahydrofuran-2-yl, 2-methyltetrahydro- furan-2-yl, tetrahydropyran-2-yl, and 2-methyltetrahydropy- ran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-di- ethylpropyloxycarbonyl, 1,1-diethylpropyloxycarbonylm- ethyl, 1-ethyl cyclopentyloxycarbonyl, 1-ethylcyclopenty- loxycarbonylmethyl, 1-ethyl-2-cyclopentenyloxycarbonyl, 1-ethyl-2-cyclopentenyloxycarbonylmethyl, 1-ethoxy- ethoxycarbonylmethyl, 2-tetrahydropyranyloxycarbonylm- ethyl, and 2-tetrahydrofuranyloxycarbonylmethyl groups.

Examples of the acid labile groups of formula (L3) include 1-methylcyclopentyl, 1-ethylcyclopentyl, 1-n-pro- pylcyclopentyl, 1-isopropylcyclopentyl, 1-n-butylcyclopen- tyl, 1-sec-butylcyclopentyl, 1-cyclohexylcyclopentyl, 1-(4- methoxy-n-butyl)cyclopentyl, 1-methylcyclohexyl, 1-ethylcyclohexyl, 3-methyl-1-cyclopenten-3-yl, 3-ethyl-1- cyclopenten-3-yl, 3-methyl-1-cyclohexen-3-yl, and 3-ethyl- 1-cyclohexen-3-yl groups.

Of the acid labile groups having formula (L4), groups having the following formulas (L4-1) to (L4-4) are pre- ferred.

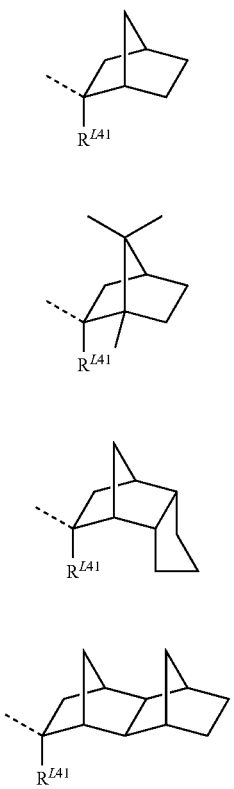

(L4-1)

(L4-2)

(L4-3)

(L4-4)

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

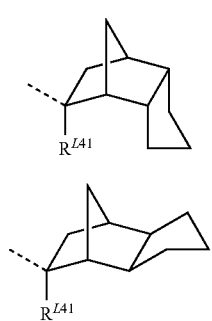

(L4-3-1)

(L4-3-2)

Similarly, the general formula (L4-4) represents one or a mixture of two or more selected from groups having the following general formulas (L4-4-1) to (L4-4-4).

(L4-4-1)

(L4-4-2)

(L4-4-3)

(L4-4-4)

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1] heptane ring, which ensures high reactivity for acid catalyzed elimination reaction (see JP-A 2000-336121). In preparing these monomers having a tertiary exo-alkyl group of bicyclo[2.2.1]heptane skeleton as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

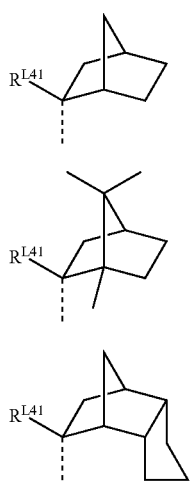

(L4-1-endo)

(L4-2-endo)

(L4-3-endo)

(L4-4-endo)
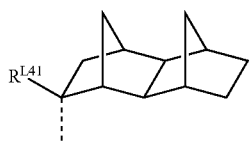
Illustrative examples of the acid labile group of formula (L4) are given below.
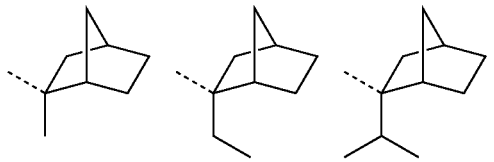
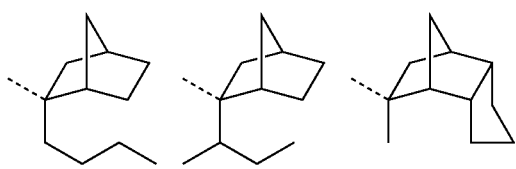
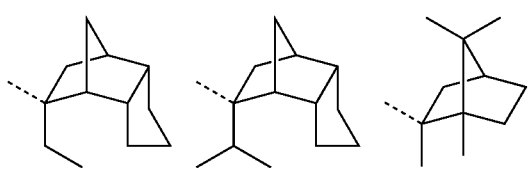
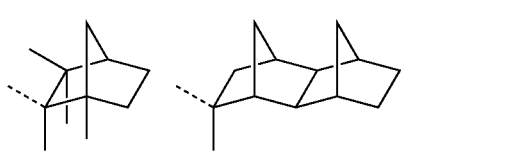
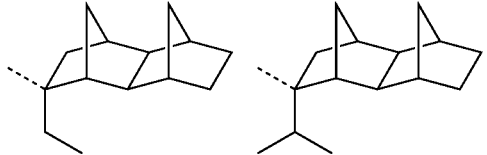
Examples of the tertiary $C_4$-$C_{20}$ alkyl groups, trialkylsilyl groups in which each alkyl moiety has 1 to 6 carbon atoms, and $C_4$-$C_{20}$ oxoalkyl groups are as exemplified for $R^{L04}$.
Illustrative examples of the recurring units of formula (2) are given below, but not limited thereto.
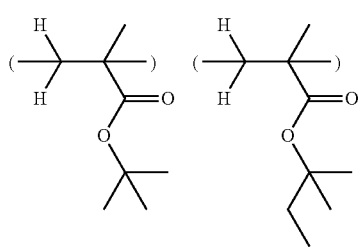
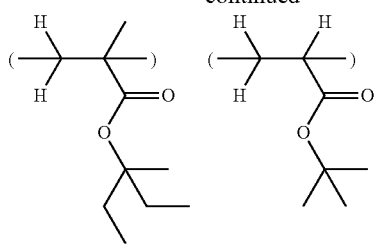
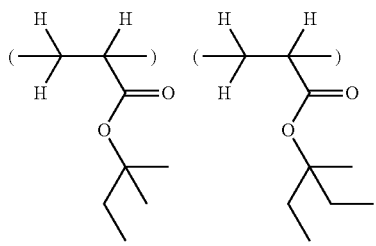
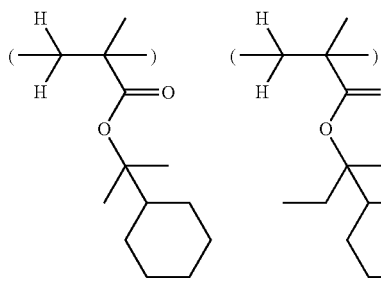
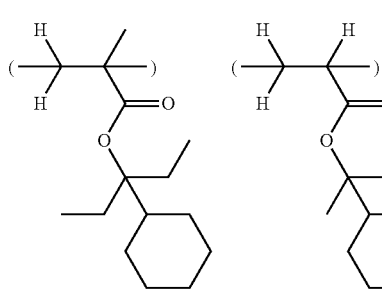
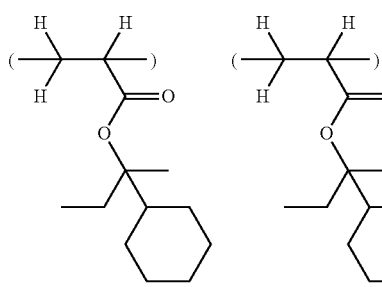
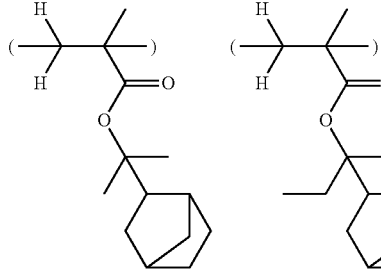

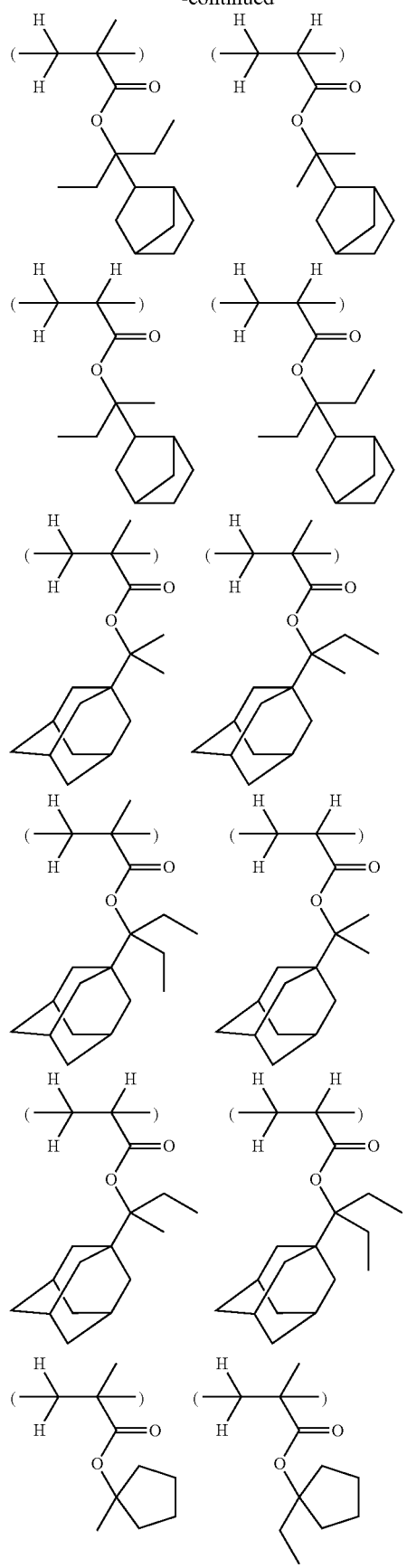
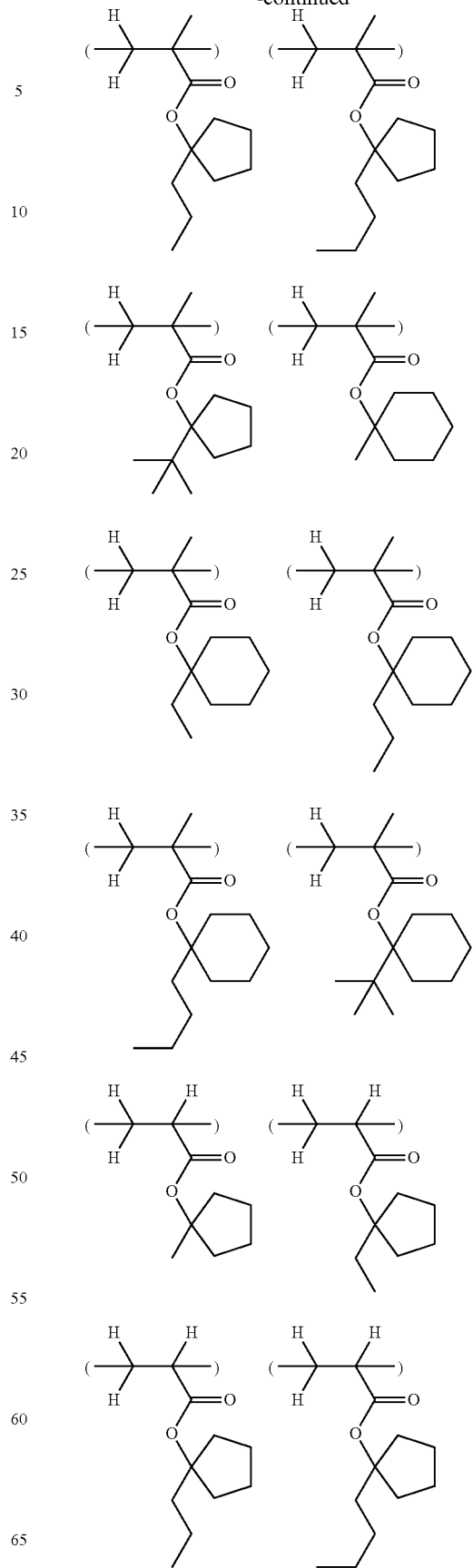

-continued
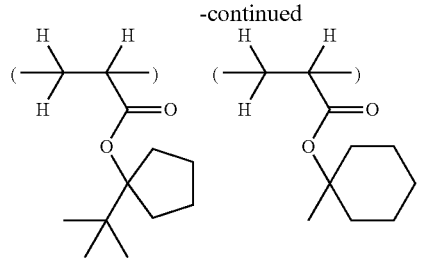
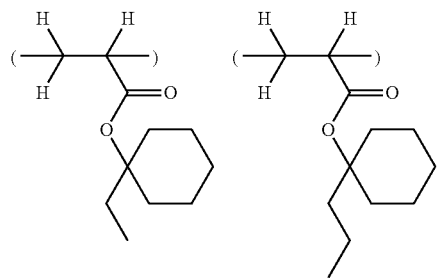
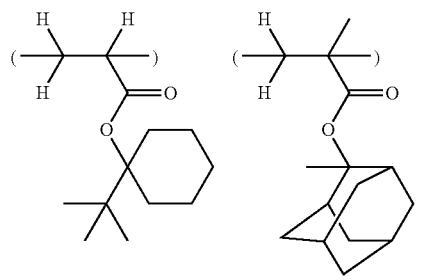
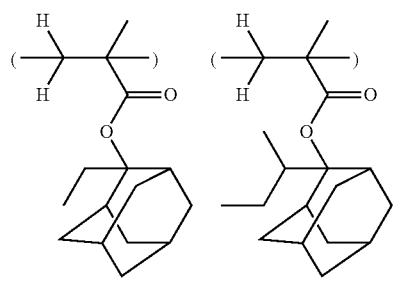
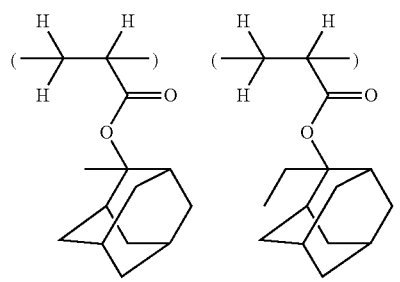
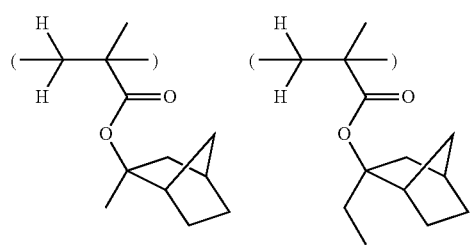
-continued
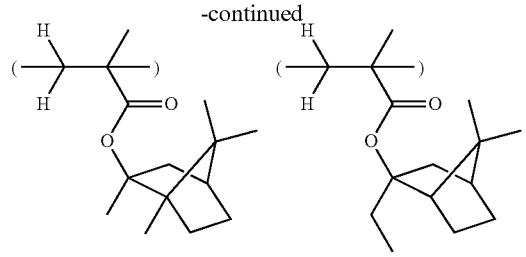
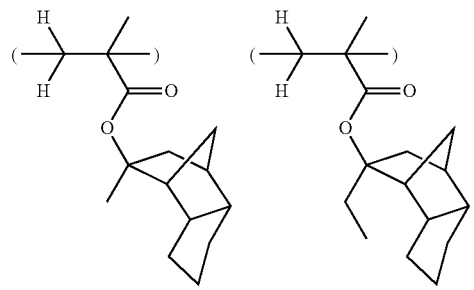
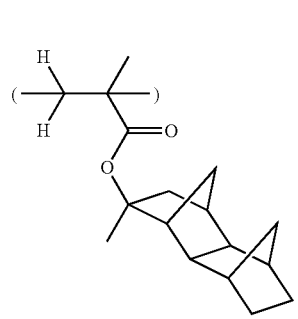
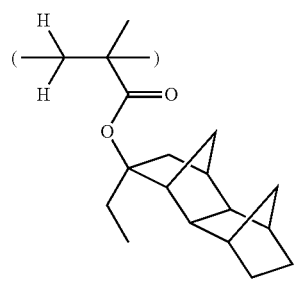
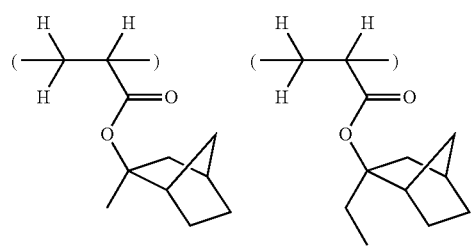
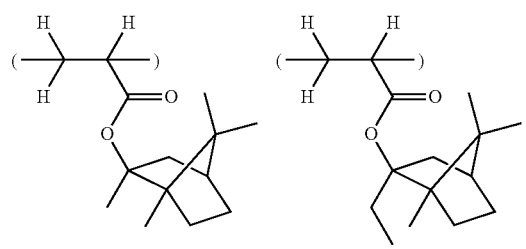

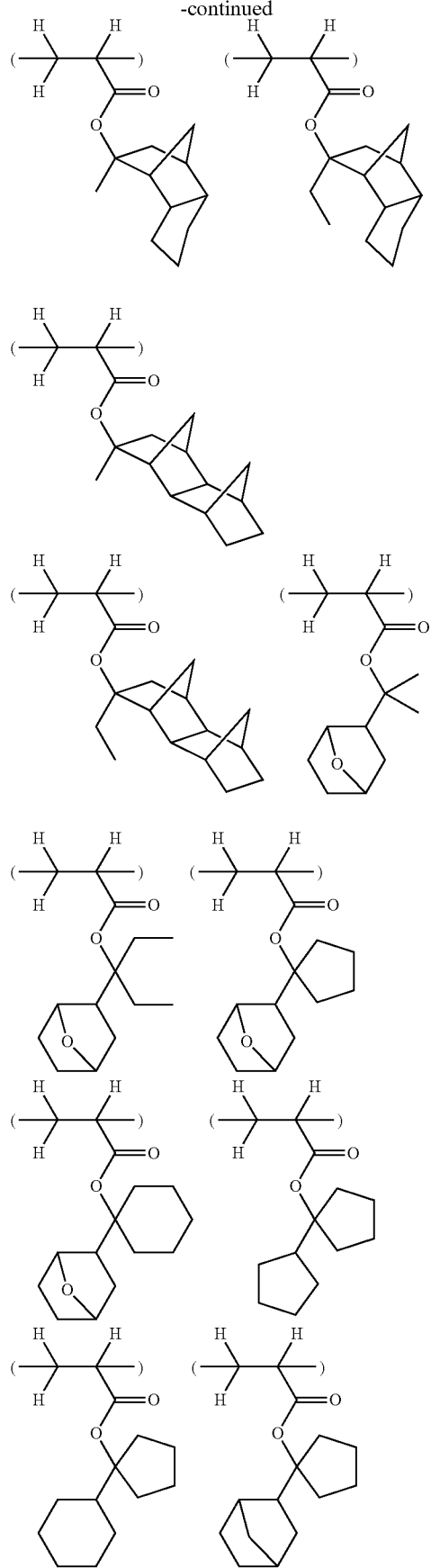
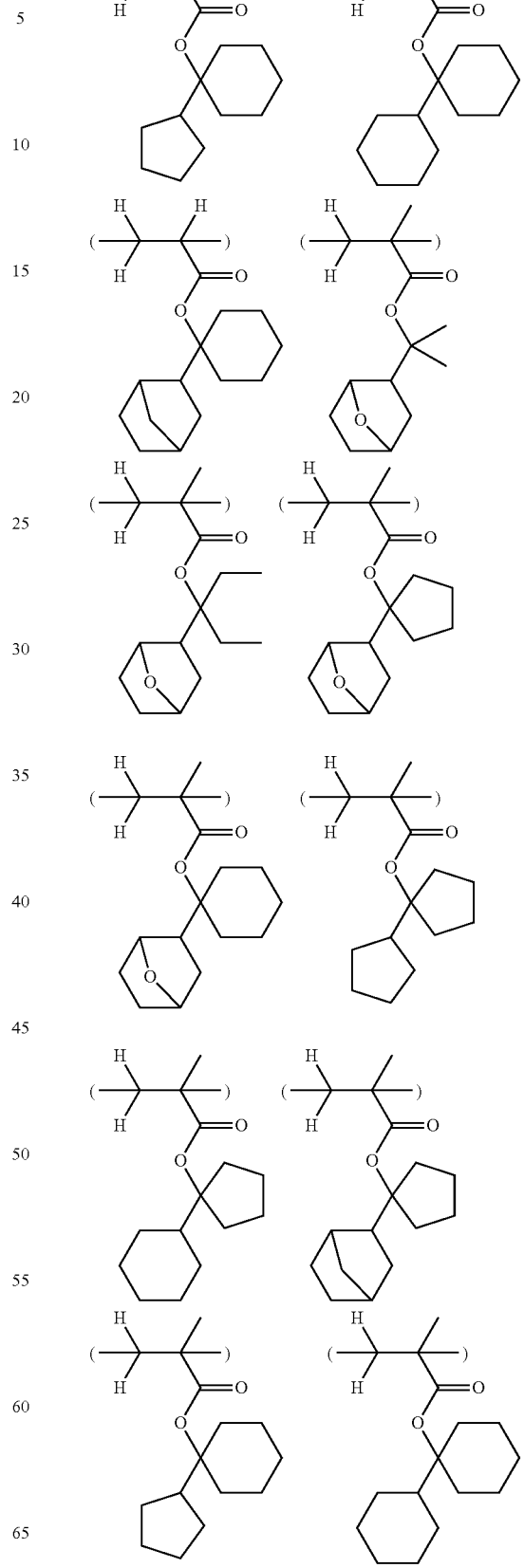

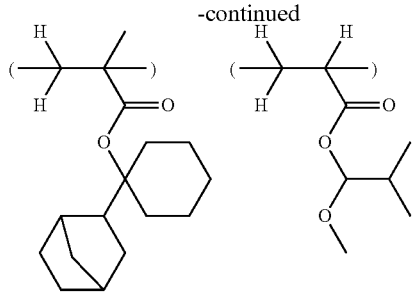
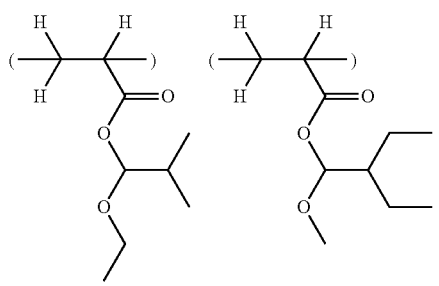
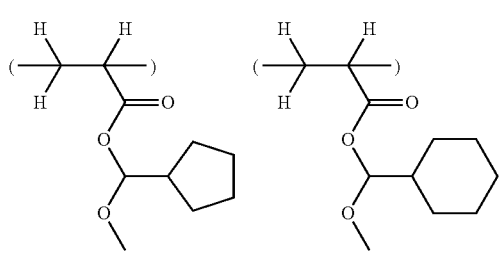
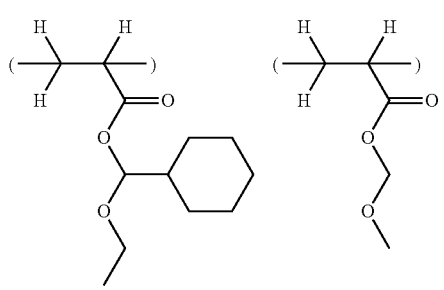
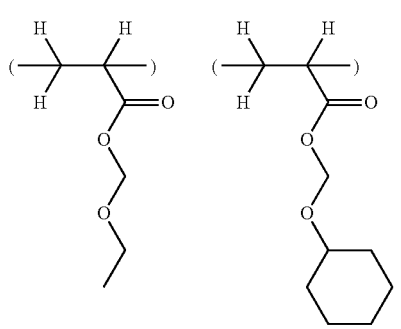
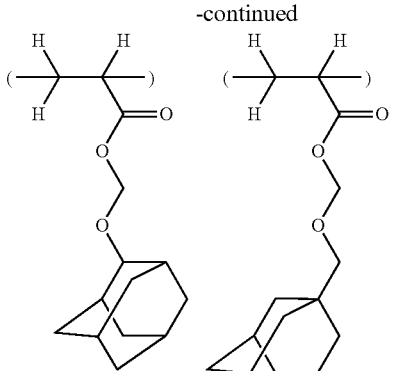
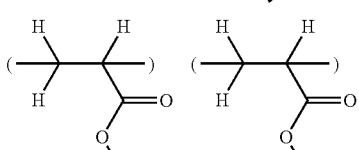
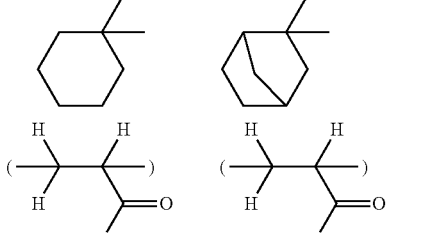
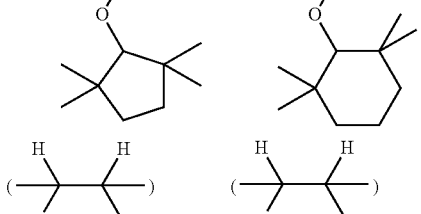
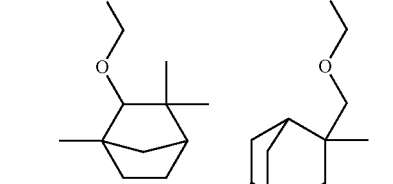
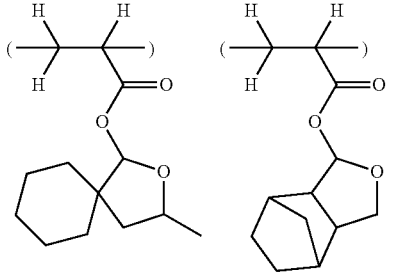

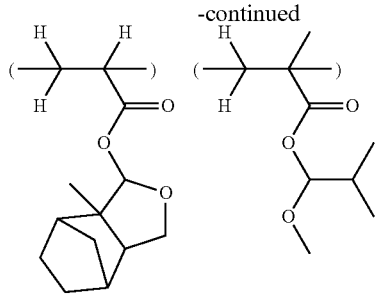
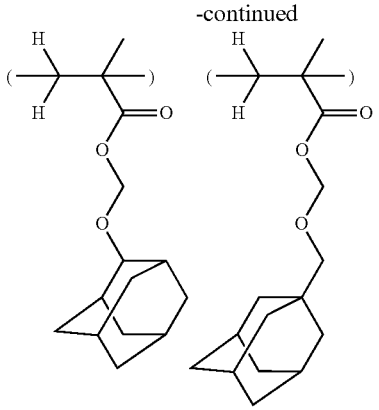

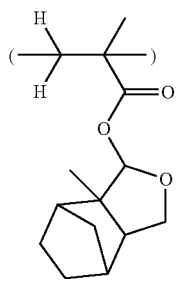

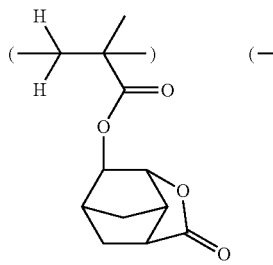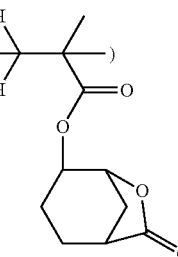

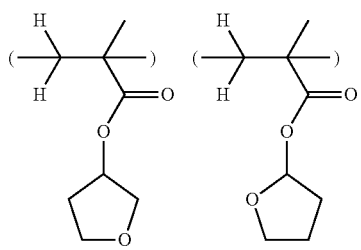

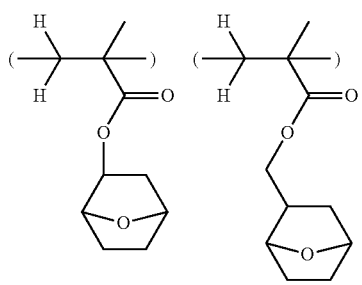

While the foregoing examples correspond to those units wherein Z is a single bond, Z which is other than a single bond may be combined with similar acid labile groups. Examples of units wherein Z is other than a single bond are substantially the same as illustrated above.

Besides the acid labile group-containing units having formula (2), the polymer may further comprise additional units, typically recurring units having the general formula (3).

(3)

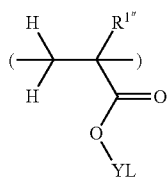

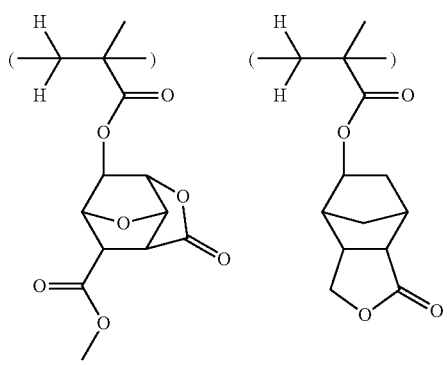

Herein $R^{1'''}$ is hydrogen, fluorine, methyl or trifluoromethyl. YL is a polar group having one or more structures selected from the group consisting of hydroxyl, cyano, carbonyl, ether bond, ester bond, sulfonic acid ester link, carbonate, lactone ring, sultone ring, and carboxylic anhydride.

Illustrative, non-limiting examples of the recurring units having formula (3) are shown below.

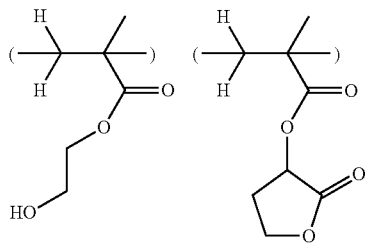

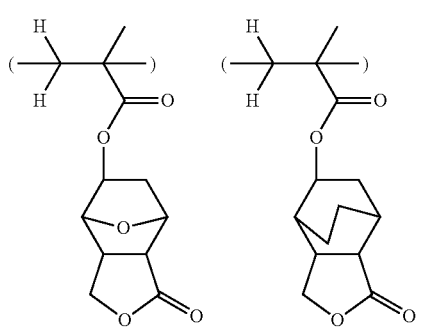

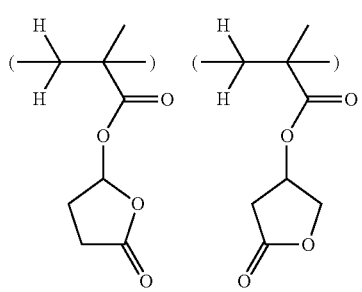

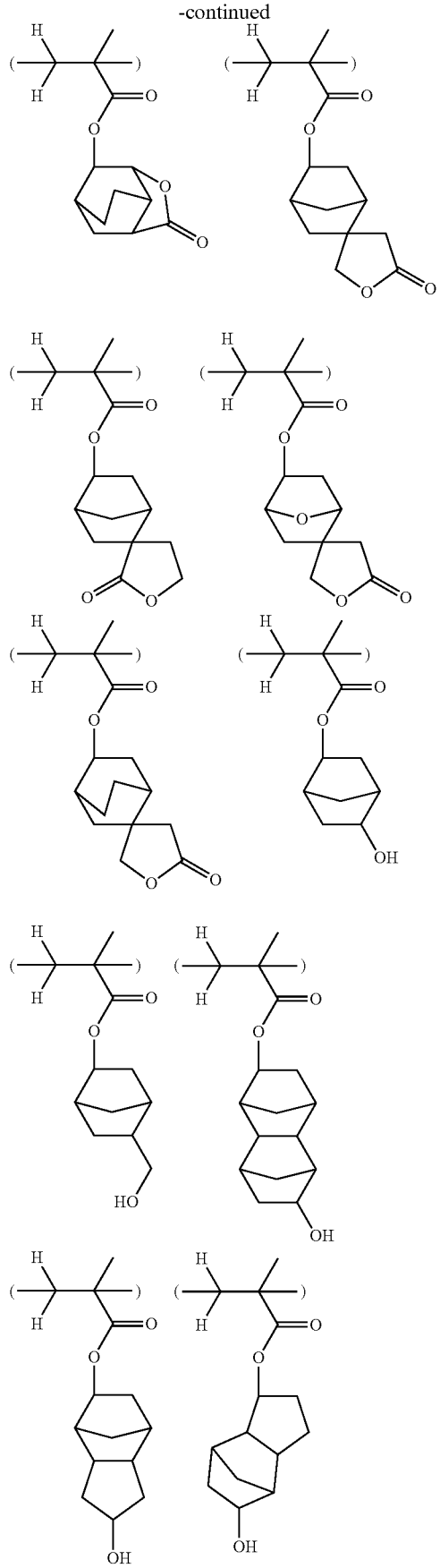
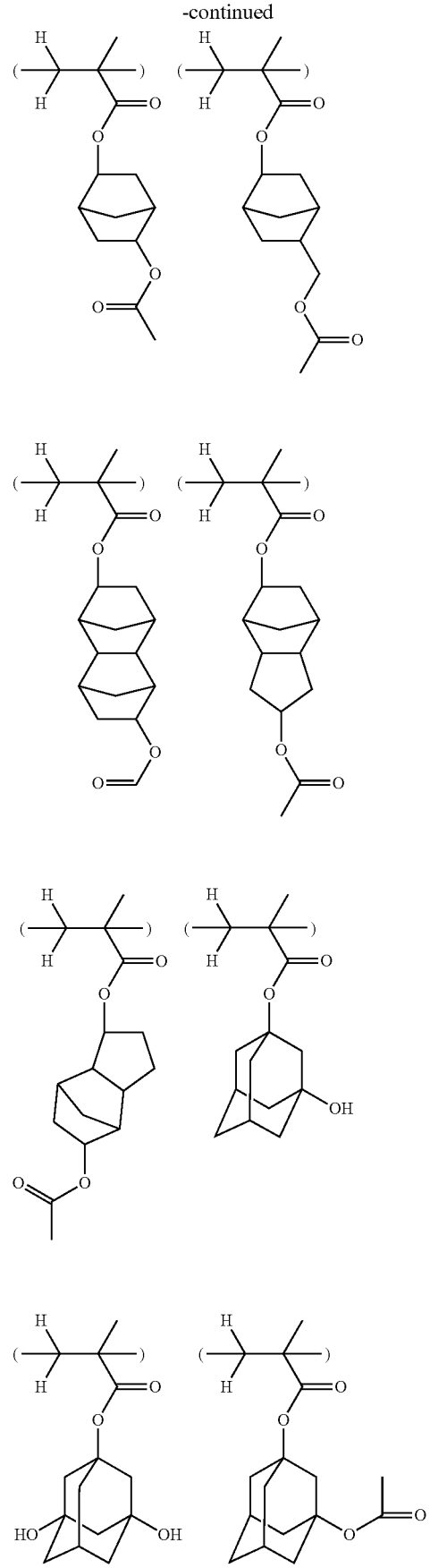

-continued
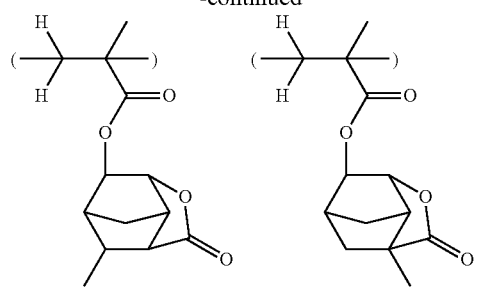
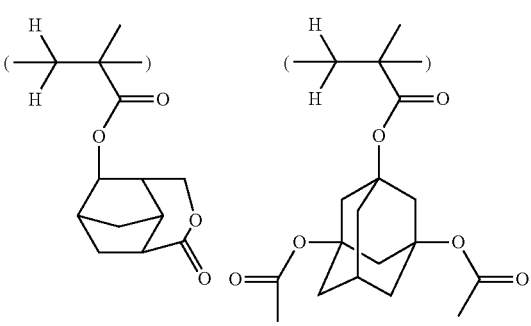
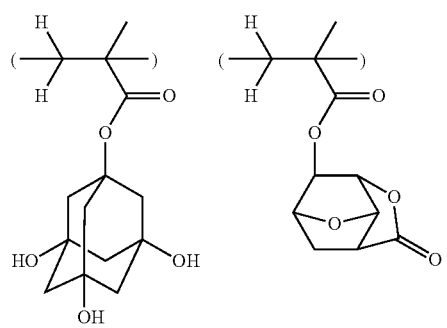
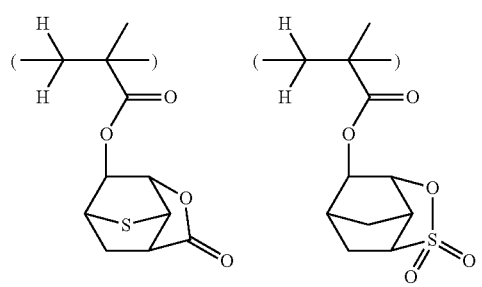
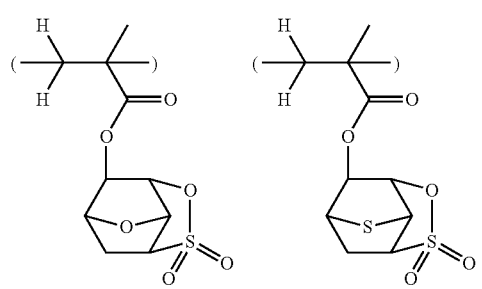
-continued
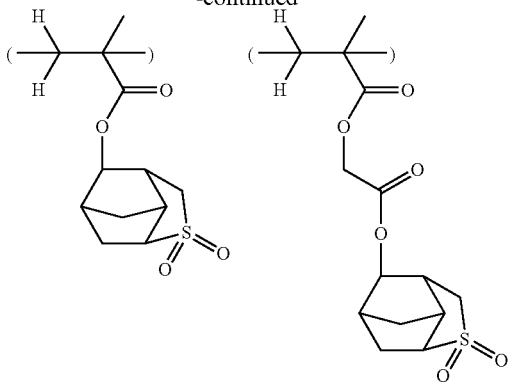
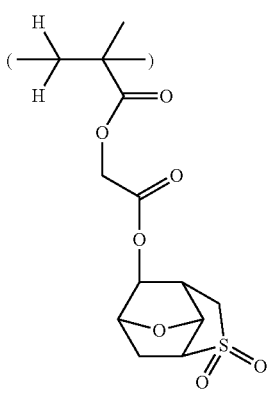
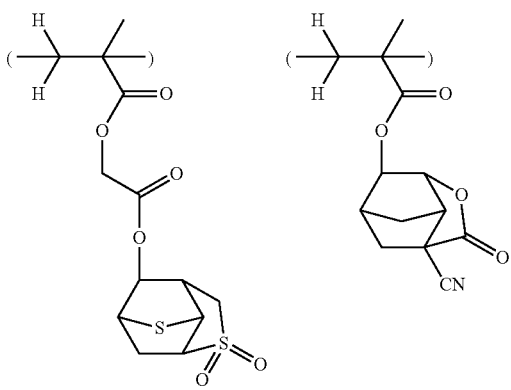
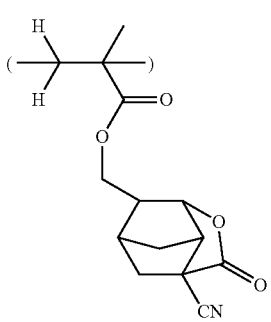

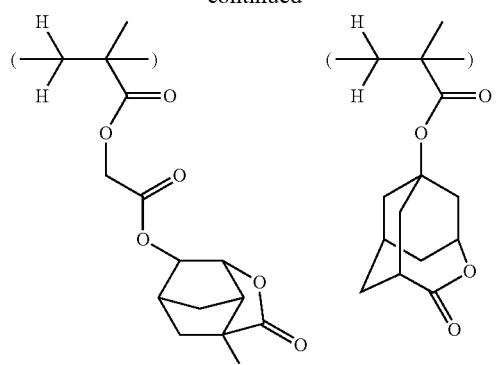
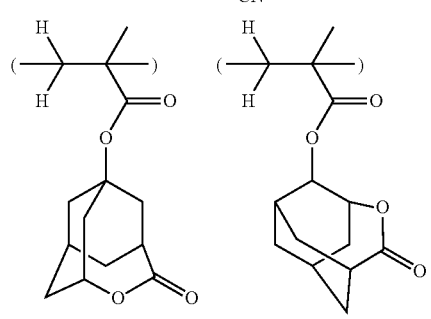
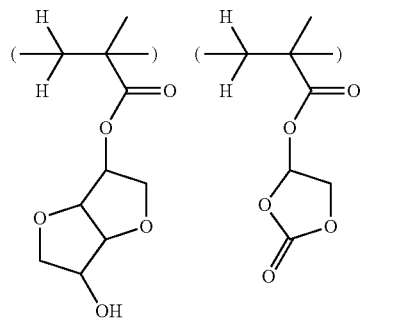
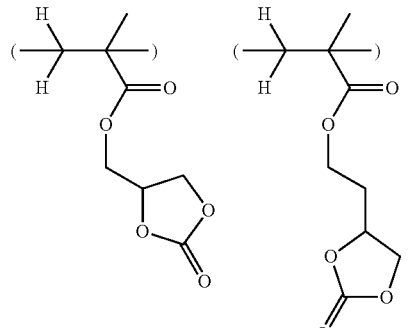
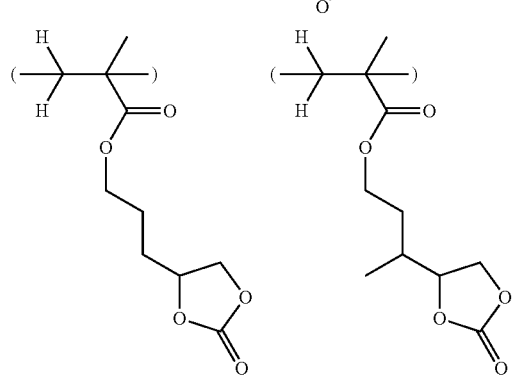
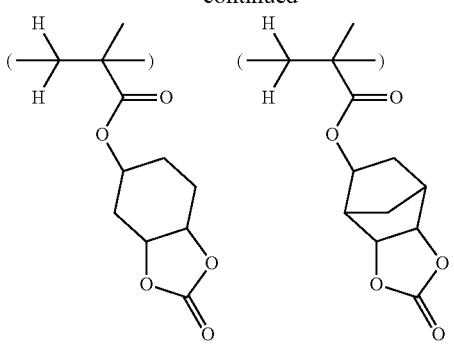
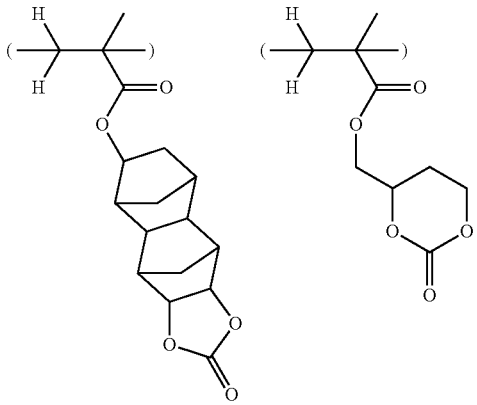
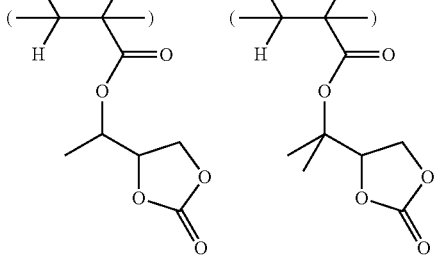
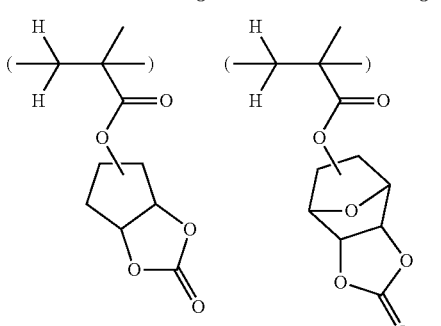
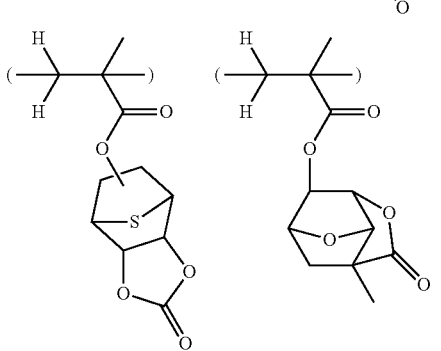

-continued
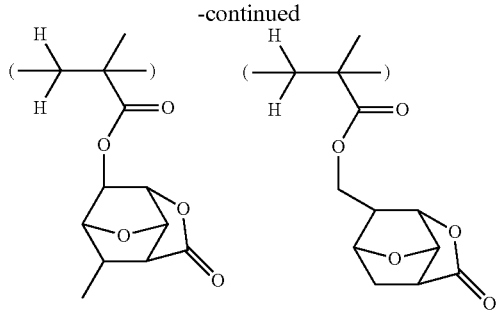
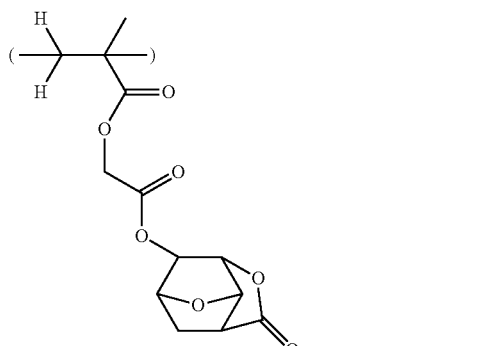
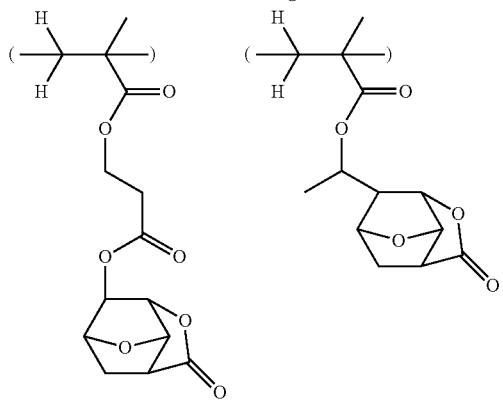
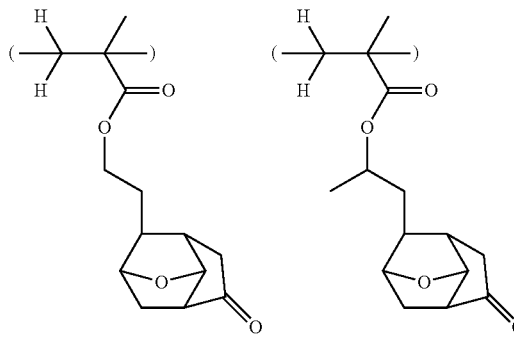
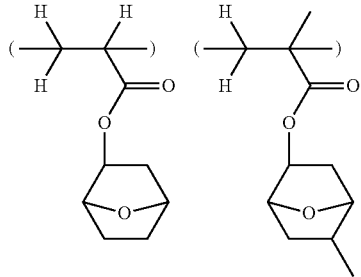
-continued
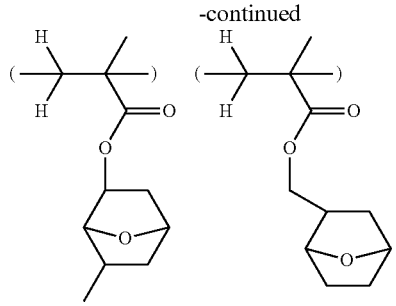
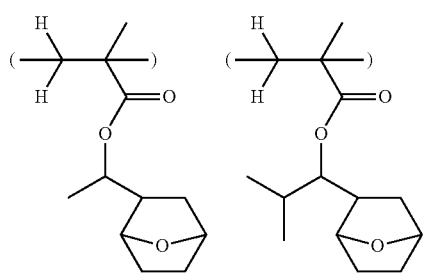
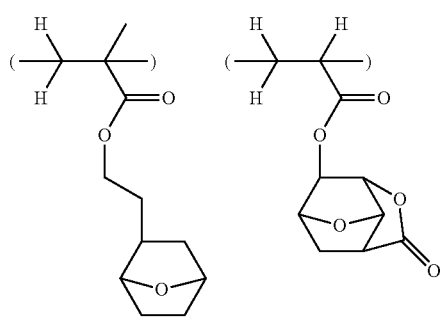
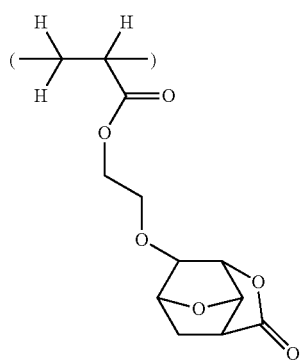
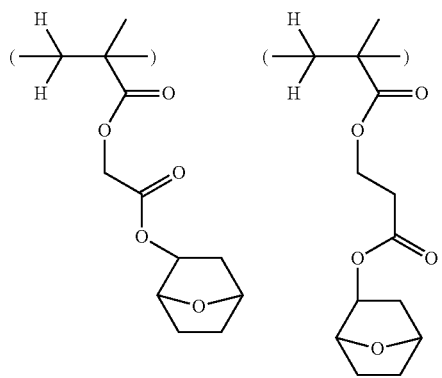

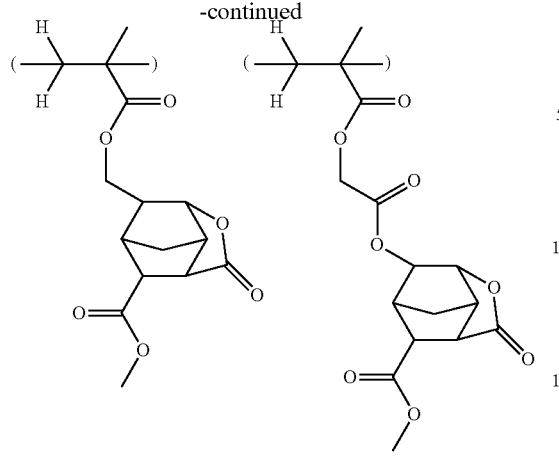
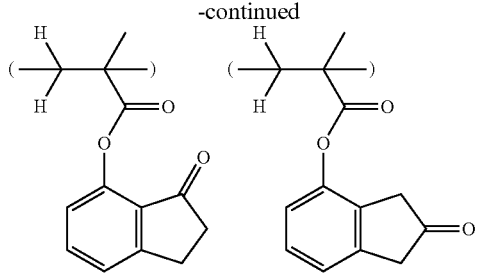
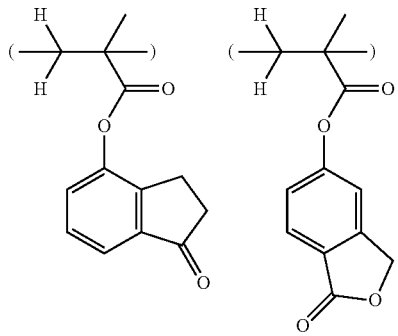
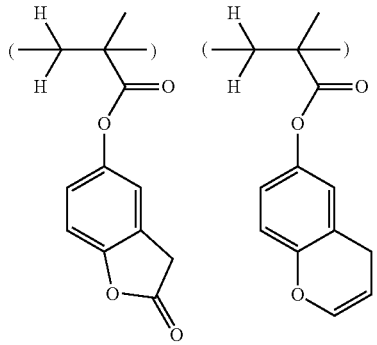
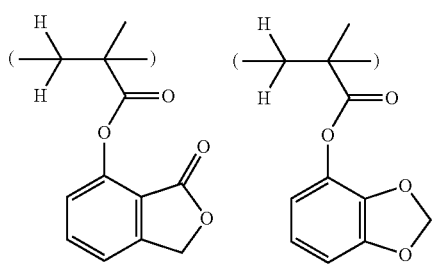
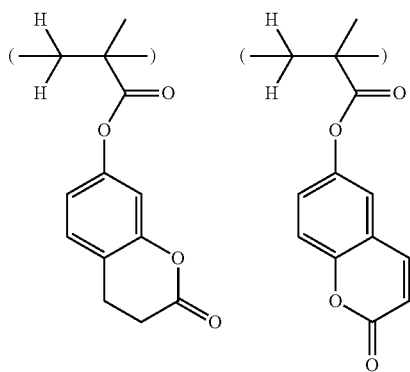

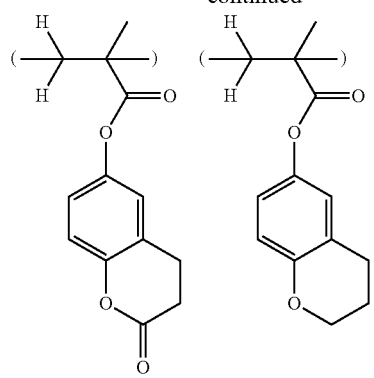
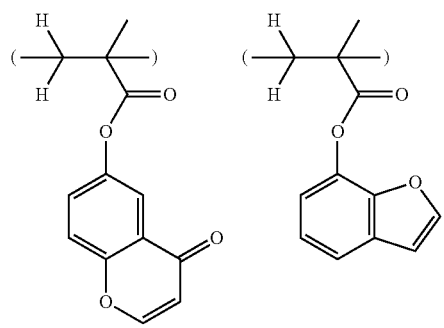
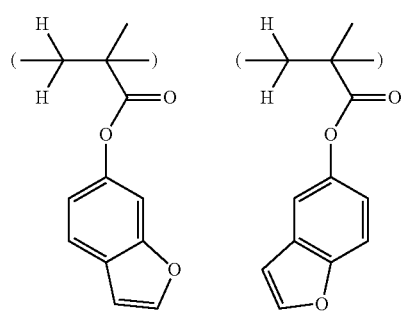
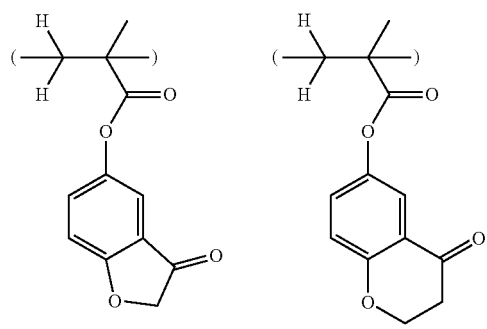
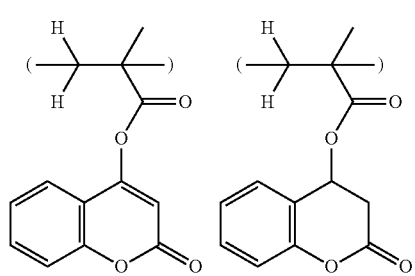
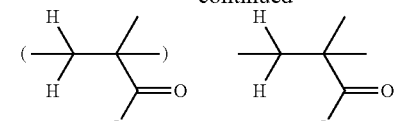
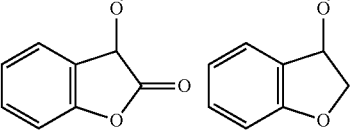
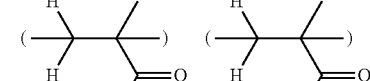
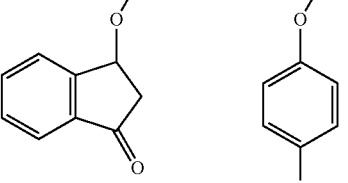
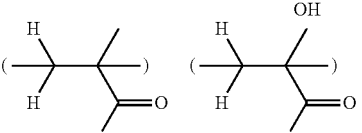
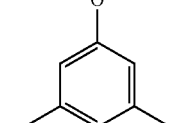
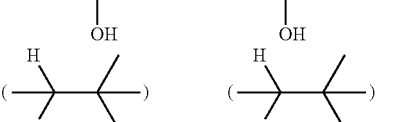
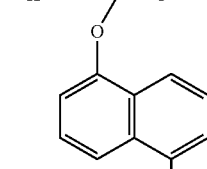
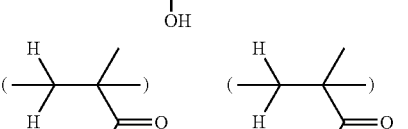
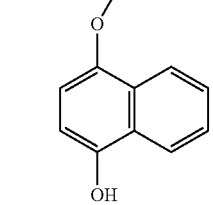
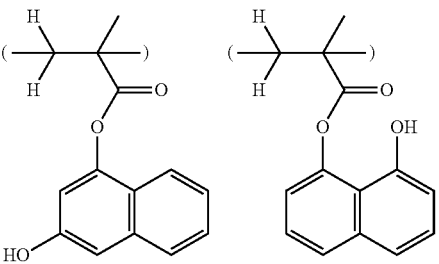

-continued
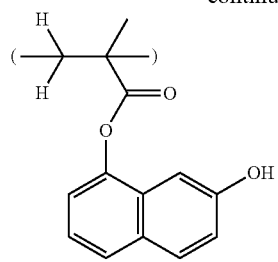
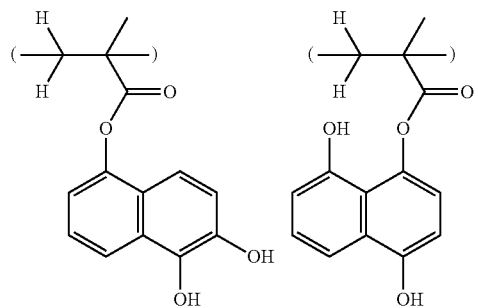
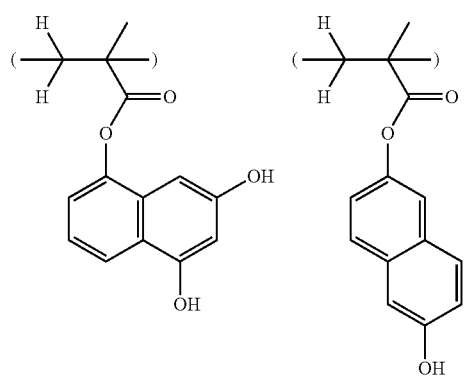
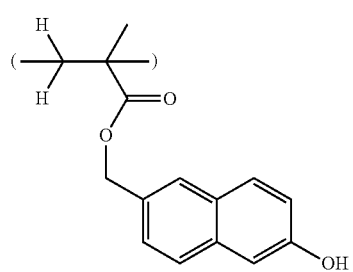
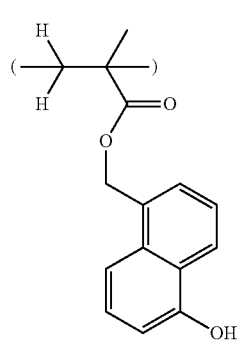
-continued
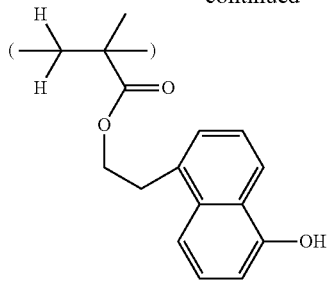
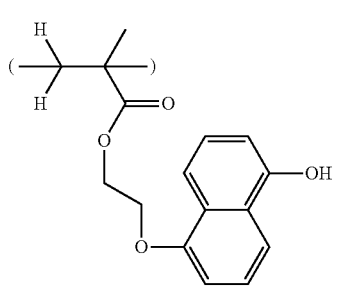
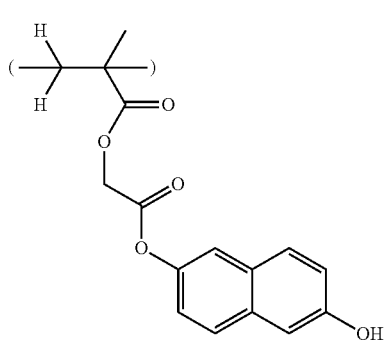
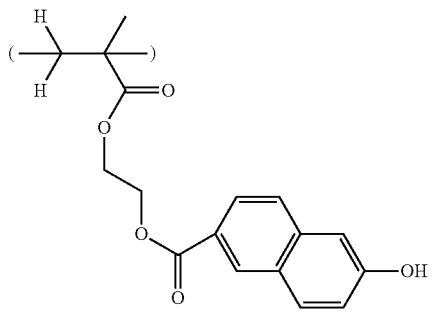
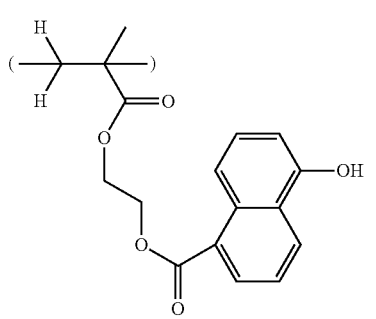

51
-continued
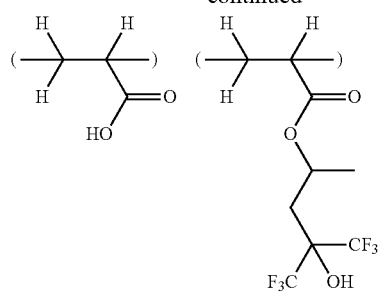
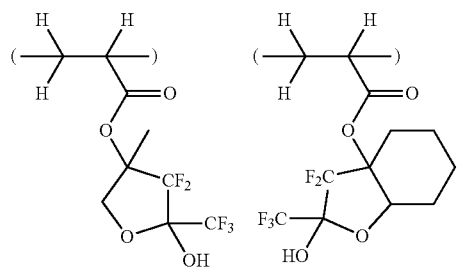
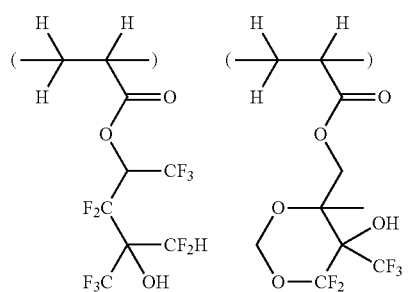
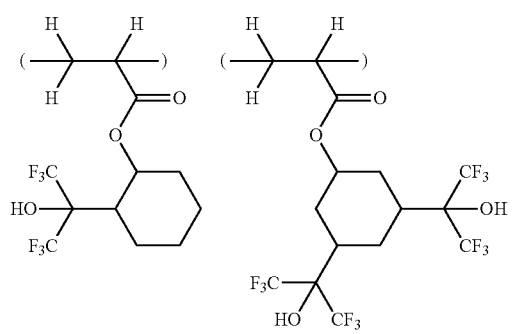
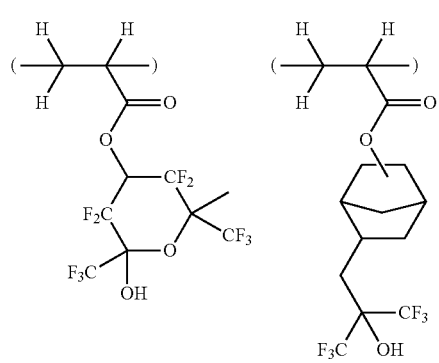
52
-continued
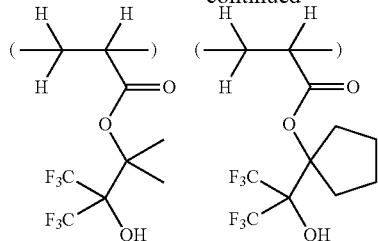
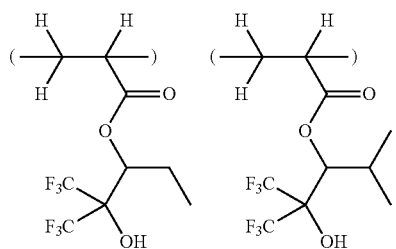
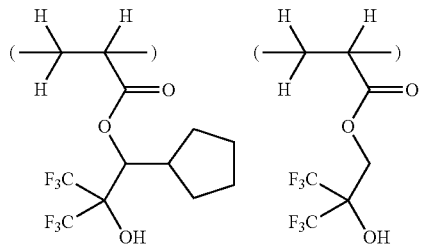
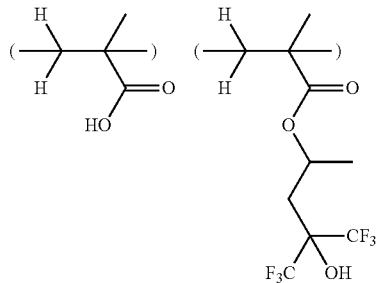
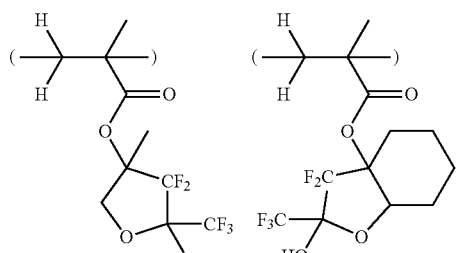
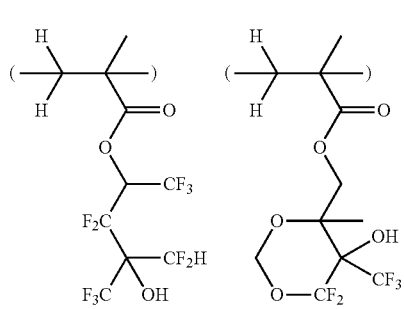

-continued
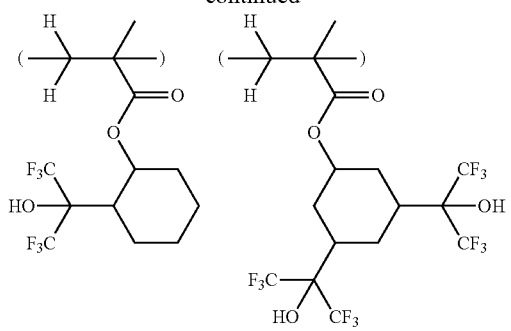
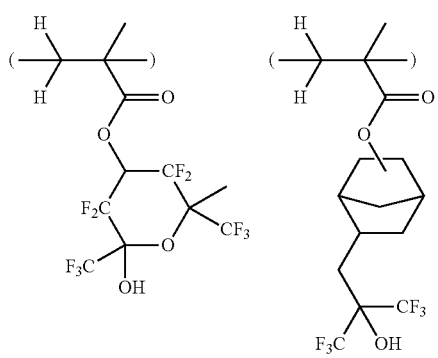
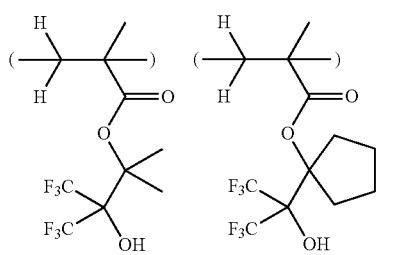
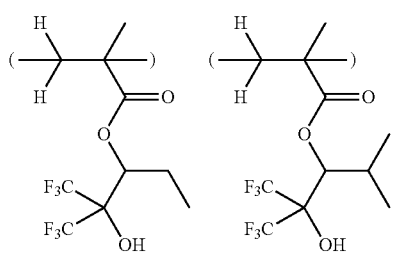
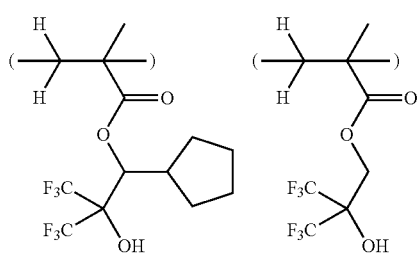
-continued
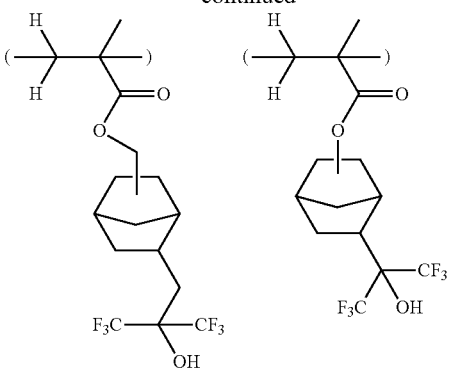
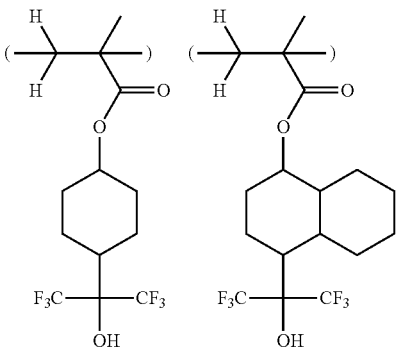
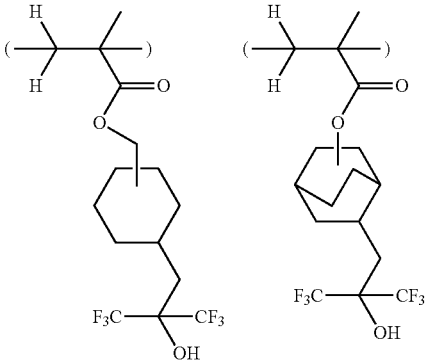
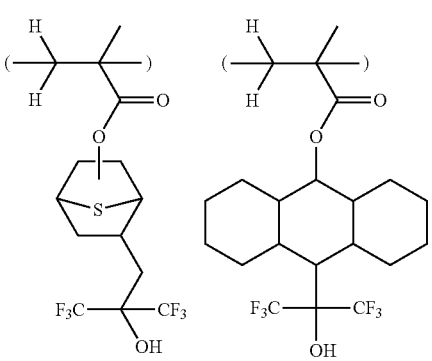

-continued
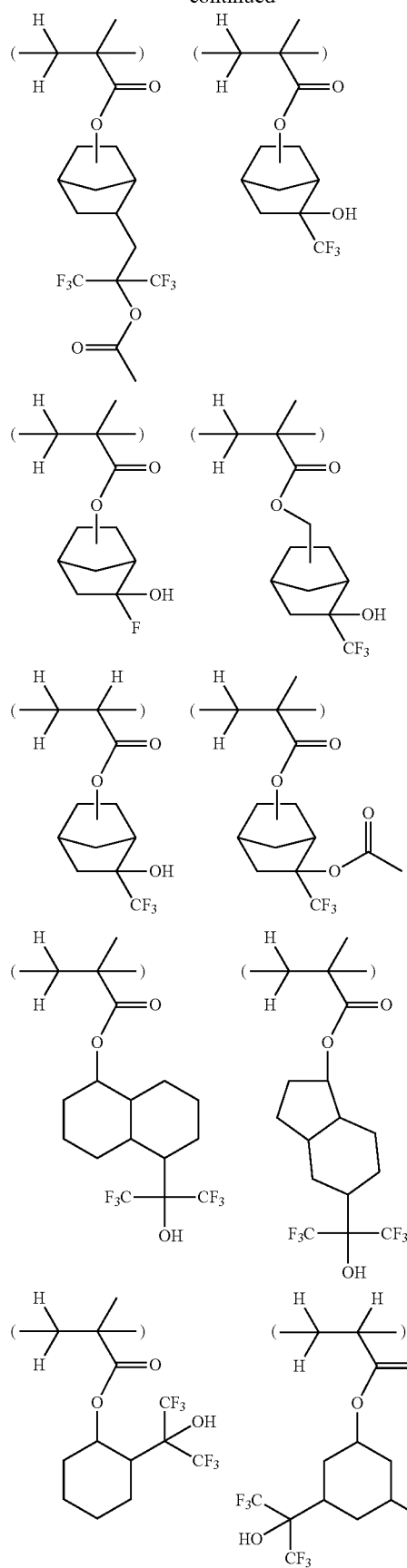
-continued
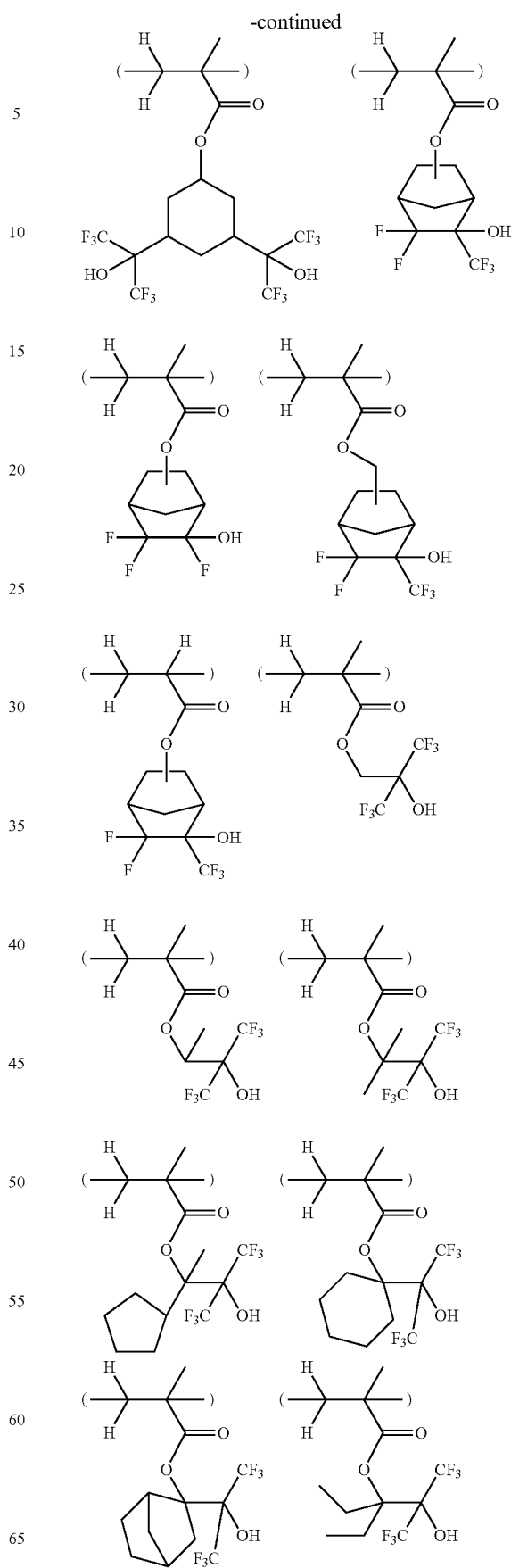

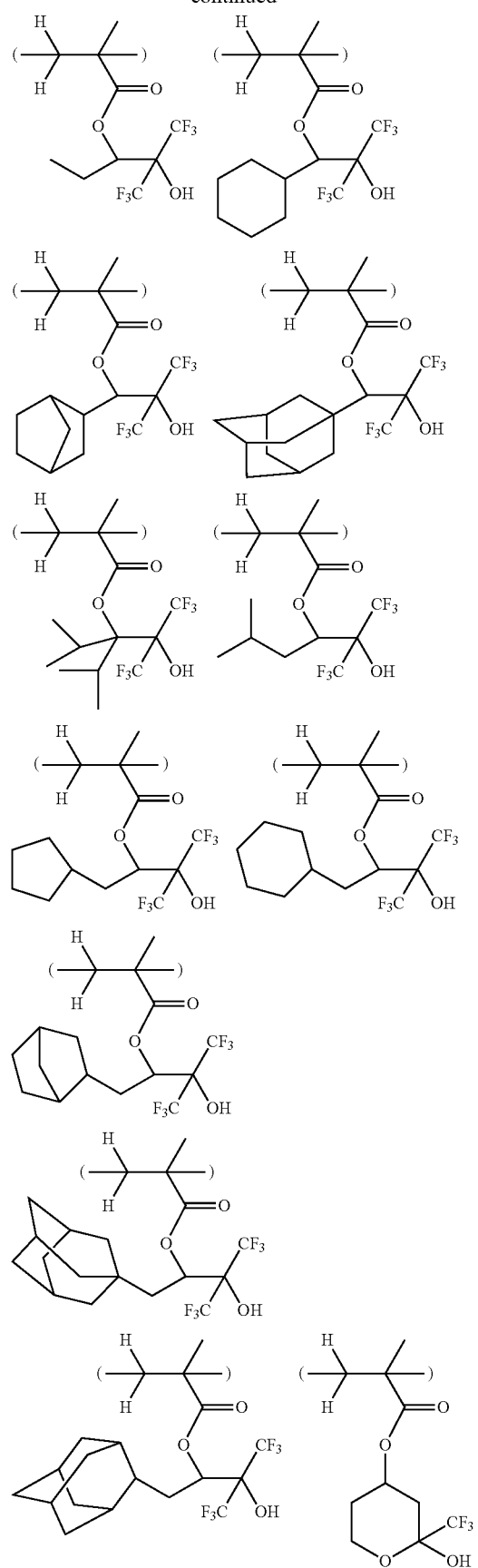
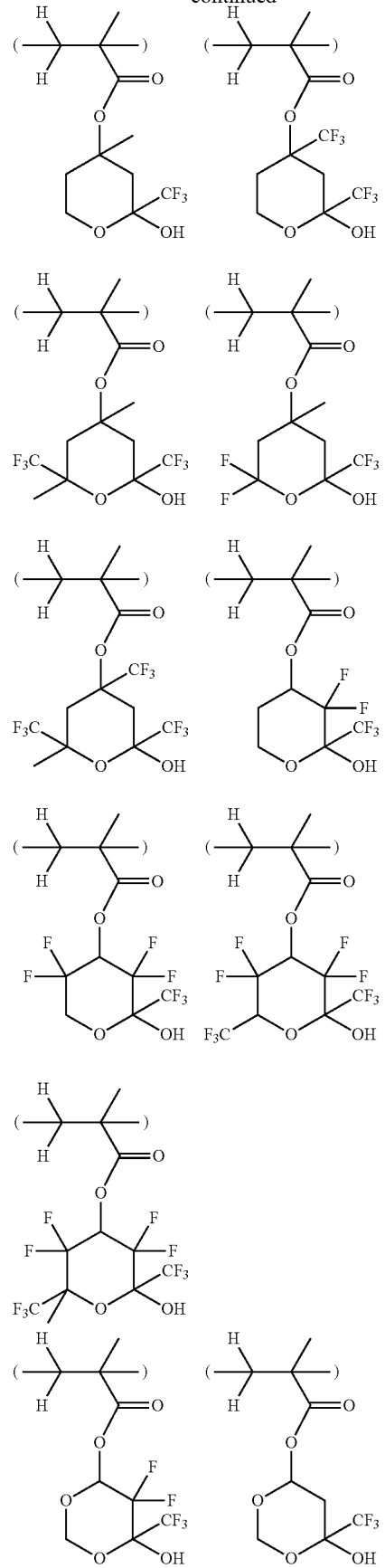

-continued

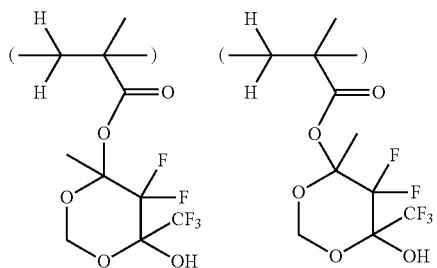

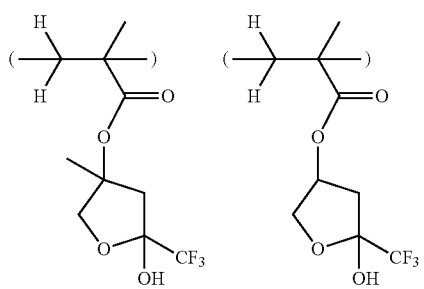

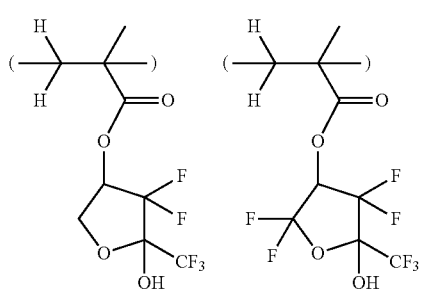

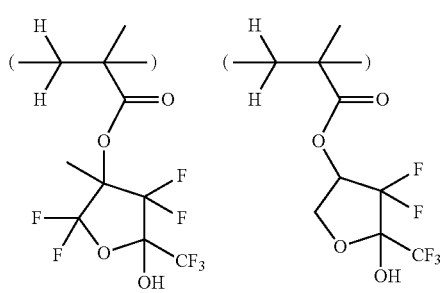

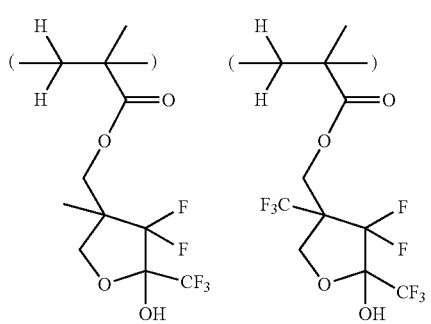

-continued

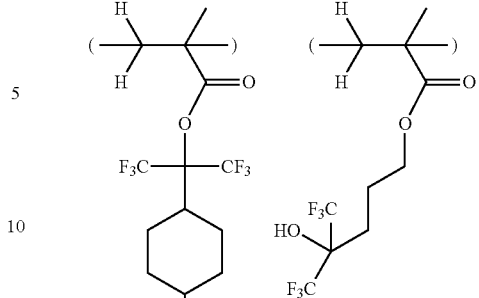

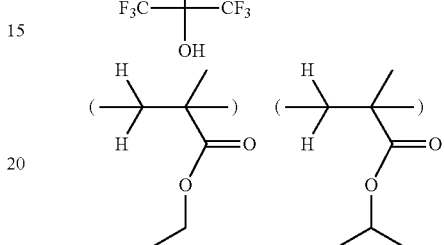

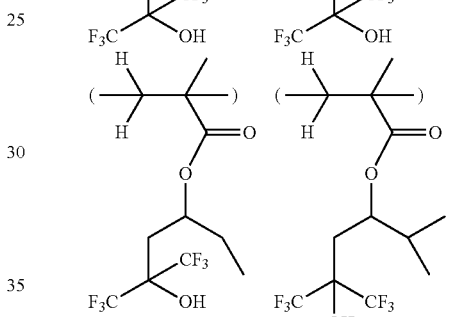

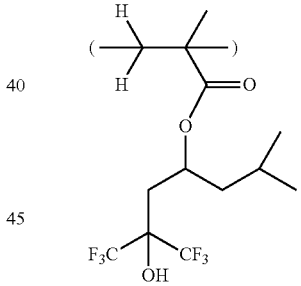

Of the recurring units having formula (3), if used, those units having a lactone ring as the polar group are most preferred.

On use, the recurring units having formula (3) are copolymerized with the recurring units having formulae (1) and (2), although they may be further copolymerized with other recurring units.

In addition to the foregoing units, the polymer may further comprise recurring units derived from carbon-to-carbon double bond-bearing monomers other than the above-described ones, for example, substituted acrylic acid esters such as methyl methacrylate, methyl crotonate, dimethyl maleate and dimethyl itaconate, unsaturated carboxylic acids such as maleic acid, fumaric acid, and itaconic acid, cyclic olefins such as norbornene, norbornene derivatives, and tetracyclo[$6.2.1.1^{3,6}.0^{2,7}$]dodecene derivatives, unsaturated acid anhydrides such as itaconic anhydride, and other monomers. Also, hydrogenated products of ROMP polymers as described in JP-A 2003-066612 may be used.

The polymer generally has a weight average molecular weight (Mw) of 1,000 to 500,000, and preferably 3,000 to 100,000, as measured by gel permeation chromatography (GPC) using polystyrene standards. Outside the range, there may result an extreme drop of etch resistance, and a drop of resolution due to difficulty to gain a dissolution rate difference before and after exposure.

The general method of synthesizing the polymer is, for example, by dissolving one or more unsaturated bond-bearing monomers in an organic solvent, adding a radical initiator, and effecting heat polymerization. Reference may be made to many documents including JP-A 2005-264103. JP-A 2010-077404 describes the synthesis of a polymer comprising copolymerized units having a triphenylsulfonium salt-containing compound whose anion is bound to the polymer backbone, which method is similar to the above-mentioned one.

Undesirably, if the synthesis of an alkylsulfonium salt-containing polymer is performed by the above method, the alkylsulfonium salt can be decomposed during polymerization reaction, interfering with synthesis of the desired polymer. Once the alkylsulfonium salt is decomposed, the sulfonic acid anion as counter anion releases sulfonic acid. Furthermore, if an acid labile group-containing unit is incorporated as the copolymerized unit, there can occur a side reaction that the resulting sulfonic acid promotes deprotection reaction of the acid labile group-containing unit. This is because the alkylsulfonium salt is unstable as compared with the triarylsulfonium salt such as triphenylsulfonium salt.

The method of the invention is designed to avoid the above-discussed problem. According to the invention, a sulfonic acid anion-containing polymer having alkylsulfonium cation can be prepared by reacting a sulfonic acid anion-containing polymer having an ammonium or metal cation not bound to the polymer with an alkylsulfonium salt. Specifically, a sulfonic acid anion-containing polymer having an ammonium or metal cation not bound to the polymer is first polymerized by a standard technique, followed by cation exchange reaction to form a sulfonic acid anion-containing polymer having alkylsulfonium cation. With the inventive method, the desired polymer can be synthesized while avoiding any decomposition of alkylsulfonium cation or other copolymerizable units.

The precursor to the inventive polymer is a sulfonic acid anion-containing polymer having an ammonium or metal cation not bound to the polymer. Typically the sulfonic acid anion-containing polymer comprises recurring units having the general formula (5).

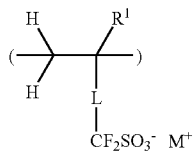

(5)

Herein $R^1$ is hydrogen, fluorine, methyl or trifluoromethyl, L is a divalent $C_1$-$C_{20}$ organic group which may contain a heteroatom, and $M^+$ is an ammonium or metal cation.

In formula (5), L is a divalent organic group, examples of which are the same as previously illustrated in conjunction with formula (1).

$M^+$ is an ammonium or metal cation. Suitable metal cations include lithium ion, sodium ion and potassium ion. The ammonium ion is of the structure having the general formula (6).

$$(R^2)_4N^+ \quad (6)$$

Herein $R^2$ is each independently hydrogen, a substituted or unsubstituted, straight, branched or cyclic $C_1$-$C_{10}$ alkyl, alkenyl or oxoalkyl group or a substituted or unsubstituted $C_6$-$C_{18}$ aryl, aralkyl or aryloxoalkyl group, or at least two of $R^2$ may bond together to form a ring with the nitrogen atom in the formula.

Of the groups of $R^2$ in formula (6), suitable alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Suitable alkenyl groups include allyl, propenyl, butenyl, hexenyl, and cyclohexenyl. Suitable oxoalkyl groups include 2-oxocyclopentyl, 2-oxocyclohexyl, 2-oxopropyl, 2-oxoethyl, 2-cyclopentyl-2-oxoethyl, 2-cyclohexyl-2-oxoethyl, and 2-(4-methylcyclohexyl)-2-oxoethyl. Suitable aryl groups include phenyl, 1-naphthyl, 2-naphthyl and thienyl, as well as hydroxyphenyl and alkoxyphenyl groups such as 4-hydroxyphenyl, p-methoxyphenyl, m-methoxyphenyl, o-methoxyphenyl, p-ethoxyphenyl, p-tert-butoxyphenyl, and m-tert-butoxyphenyl, alkylphenyl groups such as 2-methylphenyl, 3-methylphenyl, 4-methylphenyl, ethylphenyl, 4-tert-butylphenyl, 4-butylphenyl, and 2,4-dimethylphenyl, alkylnaphthyl groups such as 1-(4-methyl)naphthyl and 2-(6-methyl)naphthyl, and alkoxynaphthyl groups such as 1-(4-methoxy)naphthyl and 2-(6-methoxy)naphthyl. Suitable aralkyl groups include benzyl, 1-phenylethyl, and 2-phenylethyl. Suitable aryloxoalkyl groups include 2-aryl-2-oxoethyl groups such as 2-phenyl-2-oxoethyl, 2-(1-naphthyl)-2-oxoethyl, and 2-(2-naphthyl)-2-oxoethyl. In these hydrocarbon groups, one or more hydrogen atoms may be substituted by a heteroatom or atoms such as oxygen, sulfur, nitrogen or halogen atom, to eventually form a hydroxyl, cyano, carbonyl, ether bond, ester bond, sulfonic acid ester link, carbonate, lactone ring, sultone ring, carboxylic anhydride, or haloalkyl group.

Alternatively, at least two of $R^2$ groups bond together to form a ring with the nitrogen atom in the formula. Exemplary ring structures include piperidine, morpholine, pyridine, quinoline, acridine, imidazole and benzimidazole in which the nitrogen atom may be protonized or alkylated.

Illustrative examples of the ammonium ion having formula (6) include ammonium, trimethylammonium, tetramethylammonium, triethylammonium, tributylammonium, tetrabutylammonium, trioctylammonium, anilinium, 2,6-dimethylanilinium, N,N-dimethylanilinium, bezyltrimethylammonium, benzyltriethylammonium, benzyltripropylammonium, N-benzyl-N,N-dimethylanilinium, and N-(p-methoxy)benzyl-N,N-dimethylanilinium. Inter alia, trimethylammonium, tetramethylammonium, triethylammonium, anilinium, and bezyltrimethylammonium are preferred.

The monomeric compound having formula (5) may be synthesized, for example, by the method of JP-A 2007-304490. First, an aliphatic or aromatic carboxylic acid ester of 1,1,3,3,3-pentafluoropropen-2-yl, typically 1,1,3,3,3-pentafluoropropen-2-yl benzoate, which was developed by Nakai et al. (see Tetrahedron Lett., vol. 29, 4119, 1988) using 1,1,1,3,3,3-hexafluoro-2-propanol as the starting reactant, is reacted with sodium hydrogen sulfite in water, forming a corresponding sulfonic acid inorganic salt such as sodium sulfonate. The acyl group of this sulfonic acid inorganic salt is subjected to hydrolysis or solvolysis, after which it is reacted with a carboxylic acid halide having a polymerizable substituent group in a conventional manner, yielding the monomeric compound having formula (5). Alternatively, the monomeric compound having formula (5)

wherein M+ is an ammonium cation may be obtained by reacting ammonium halide, ammonium hydroxide or the like with the salt either before or after decomposition of the acyl group, and thereafter introducing a polymerizable substituent group in a similar way. Exchange reaction from metal cation to ammonium cation is a well-known procedure. For example, the reaction may be driven by mixing the corresponding metal cation-containing compound and ammonium halide in a two-layer system of organic solvent and water.

Likewise, the monomeric compound having formula (5) may also be obtained by converting the sodium salt of 2-butyl difluorosulfoacetate described in JP-A 2011-158896, the sodium salt of 1,1,2,2-tetrafluoro-4-hydroxy-butane-1-sulfonic acid described in WO 2008/56795, the sodium salt of difluorohydroxypropanesulfonic acid described in JP-A 2011-256390, or the sodium salt of difluorohydroxyethanesulfonic acid described in JP-A 2009-221454 into a metal or ammonium salt of difluorosulfonic acid having a polymerizable substituent group.

Next, the synthesis of a polymer comprising recurring units having formula (5) is described. The recurring units having formula (5) may be used as a homopolymer or copolymerized with other recurring units. Desirably, the recurring units having formula (5) are copolymerized with acid labile group-containing units having formula (2) and more desirably with units having formulae (2) and (3).

The polymer comprising recurring units having formula (5) may be synthesized by the aforementioned method, specifically by dissolving one or more unsaturated bond-containing monomers in an organic solvent, adding a radical initiator thereto, and effecting heat polymerization.

Examples of the organic solvent which can be used for polymerization include aromatic solvents such as toluene and benzene, ether solvents such as tetrahydrofuran, diethyl ether and dioxane, ketone solvents such as acetone and methyl ethyl ketone, alcohols such as methanol and propylene glycol monomethyl ether, ester solvents such as ethyl acetate and propylene glycol monomethyl ether acetate (PGMEA), and halogenated solvents such as chloroform and dichloroethane. Examples of the polymerization initiator used herein include 2,2'-azobisisobutyronitrile (AIBN), 2,2'-azobis(2,4-dimethylvaleronitrile), dimethyl 2,2'-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. When acid labile group-containing units are to be incorporated, such a unit that has been incorporated in a monomer may be kept as such, or protection or partial protection after polymerization may be adopted.

Described below is the synthesis of a sulfonic acid anion-containing polymer having an alkylsulfonium cation as used in the resist composition. The sulfonic acid anion-containing polymer having an alkylsulfonium cation is synthesized by letting an alkylsulfonium salt having the general formula (7) act on a polymer having the above formula (5) to induce cation exchange reaction.

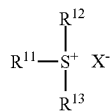
(7)

Herein $R^{11}$, $R^{12}$ and $R^{13}$ are as defined above, and $X^-$ is an anion.

In formula (7), X is an anion which may be any of conjugated bases of either inorganic acids or organic acids, for example, conjugated bases of methylsulfuric acid, methanesulfonic acid and p-toluenesulfonic acid, $I^-$, $Br^-$, $Cl^-$, $BF_4^-$, $ClO_4^-$, or the like.

With respect to the synthesis of the alkylsulfonium salt having formula (7), reference may be made to JP-A 2007-145797, JP-A 2008-106045, JP-A 2009-007327, and JP-A 2009-258695.

First, a polymer comprising recurring units having formula (5) is synthesized by the aforementioned method. The polymer thus synthesized and an alkylsulfonium salt having formula (7) are mixed in a system of water and an organic solvent separable from water whereupon the organic layer is taken out. The organic layer is washed with water, if necessary. The desired polymer may be recovered from the organic layer by conventional means such as concentration or crystallization. Any organic solvent may be used herein as long as it can be separated from water and the polymer is dissolvable therein. The preferred organic solvents include ketone solvents such as methyl ethyl ketone and methyl isobutyl ketone, and halogenated solvents such as dichloromethane and chloroform.

Alternatively, the desired polymer may be obtained by dissolving a polymer comprising recurring units having formula (5) and an alkylsulfonium salt having formula (7) in an organic solvent, and pouring it into water or another organic solvent for crystallization. Preferably the good solvent is an alcohol and the poor solvent is water.

The method for the synthesis of a sulfonic acid anion-containing polymer having an alkylsulfonium cation starts with a polymer comprising recurring units having formula (5) and proceeds under mild conditions without a need for heat, nucleophile or radical initiator as indicated above. Since the unstable alkylsulfonium cation is not decomposed under such mild conditions, the method is fully effective.

While the polymer comprises recurring units derived from monomers, the molar fractions of respective units preferably fall in the following range (mol %), but are not limited thereto.

(I) 0.2 to 20 mol %, more preferably 0.5 to 15 mol % of constituent units of sulfonic acid anion-containing compound having alkylsulfonium cation, (II) 1 to 50 mol %, more preferably 5 to 40 mol %, and even more preferably 10 to 30 mol % of constituent units of at least one type having formula (2), (III) 30 to 98.8 mol %, more preferably 45 to 94.5 mol %, and even more preferably 69.5 to 89.5 mol % of constituent units of at least one type having formula (3), and optionally, (IV) 0 to 80 mol %, more preferably 0 to 70 mol %, and even more preferably 0 to 50 mol % of constituent units of at least one type derived from another monomer(s).

The polymer is not limited to one type and a mixture of two or more polymers may be added. The use of plural polymers allows for easy adjustment of resist properties.

Resist Composition

A further embodiment of the invention is a resist composition comprising (A) the sulfonic acid anion-containing polymer having an alkylsulfonium cation defined above as essential component. The resist composition may further comprise (B) a photoacid generator capable of generating an acid upon exposure, (C) a quencher, and (D) an organic solvent. Optionally, the resist composition may further comprise (E) a surfactant which is insoluble or substantially insoluble in water and soluble in alkaline developer, and/or a surfactant which is insoluble or substantially insoluble in water and alkaline developer (hydrophobic resin), and (F) an organic acid derivative and/or fluorinated alcohol.

(B) Photoacid Generator

The PAG used herein may be any compound capable of generating an acid upon exposure to high-energy radiation including UV, DUV, EB, EUV, x-ray, excimer laser, γ-ray, and synchrotron radiation. Suitable PAGs include sulfonium salts, iodonium salts, sulfonyldiazomethane, N-sulfonyloxydicarboxylmide, O-arylsulfonyloxime, and O-alkylsulfonyloxime generators. The acid generators may be used alone or in admixture of two or more.

Sulfonium salts are salts of sulfonium cations with sulfonates, bis(substituted alkylsulfonyl)imides and tris(substituted alkylsulfonyl)methides. Exemplary sulfonium cations include those sulfonium cations described in conjunction with formula (5). Exemplary sulfonates include trifluoromethanesulfonate, pentafluoroethanesulfonate, heptafluoropropanesulfonate, nonafluorobutanesulfonate, tridecafluorohexanesulfonate, 2,2,2-trifluoroethanesulfonate, pentafluorobenzenesulfonate, 1,1-difluoro-2-naphthylethanesulfonate, 1,1,2,2-tetrafluoro-2-(norbornan-2-yl)ethanesulfonate, 1,1,2,2-tetrafluoro-2-(tetracyclo[6.2.1.1$^{3,6}$.0$^{2,7}$]dodec-3-en-8-yl)ethanesulfonate, 2-benzoyloxy-1,1,3,3,3-pentafluoropropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yl-oxycarbonyl)difluoromethanesulfonate, and 4-oxo-1-adamantyloxycarbonyldifluoromethanesulfonate. Exemplary bis(substituted alkylsulfonyl)imides include bis(trifluoromethylsulfonyl)imide, bis(pentafluoroethylsulfonyl)imide, bis(heptafluoropropylsulfonyl)imide, and perfluoro(1,3-propylenebissulfonyl)imide. A typical tris(substituted alkylsulfonyl)methide is tris(trifluoromethylsulfonyl)methide. Sulfonium salts based on combination of the foregoing examples are included.

Examples of the iodonium salt, N-sulfonyloxydicarboxylmide, O-arylsulfonyloxime, and O-alkylsulfonyloxime acid generators are described in JP-A 2009-269953.

Preferred examples of the PAG include triphenylsulfonium nonafluorobutanesulfonate, triphenylsulfonium bis(trifluoromethylsulfonyl)imide, triphenylsulfonium perfluoro(1,3-propylenebissulfonyl)imide, triphenylsulfonium tris(trifluoromethanesulfonyl)methide, N-nonafluorobutanesulfonyloxy-1,8-naphthalenedicarboxylmide, 2-(2,2,3,3,4,4-hexafluoro-1-(nonafluorobutylsulfonyloxy-imino)butyl)fluorene, and 2-(2,2,3,3,4,4,5,5-octafluoro-1-(nonafluorobutylsulfonyloxy-imino)pentyl)fluorene.

The preferred structure of PAG includes compounds having the general formula (P1).

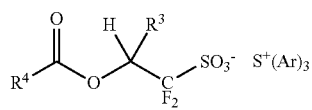

(P1)

Herein $R^4$ is a $C_1$-$C_{30}$ alkyl, alkenyl or aralkyl group which may contain a heteroatom, $R^3$ is hydrogen or trifluoromethyl, and Ar is a substituted or unsubstituted $C_6$-$C_{20}$ aryl group which may contain a heteroatom, a plurality of Ar groups may bond together directly or via an oxygen atom, methylene, sulfonyl or carbonyl moiety.

In formula (P1), $R^4$ is a $C_1$-$C_{30}$ alkyl, alkenyl or aralkyl group which may contain a heteroatom. Suitable heteroatoms contained in $R^4$ include oxygen, nitrogen, sulfur and halogen atoms, with oxygen being preferred. The $C_1$-$C_{30}$ alkyl, alkenyl or aralkyl group of $R^4$ may be straight, branched or cyclic while it is preferred for achieving a high resolution sufficient to form a fine size pattern that these groups have 6 to 30 carbon atoms. It is undesirable that $R^4$ be aryl because the resulting resist pattern may have less smooth sidewalls. Exemplary groups of $R^4$ include, but are not limited to, methyl, ethyl, propyl, isopropyl, butyl, isobutyl, s-butyl, tert-butyl, pentyl, neopentyl, cyclopentyl, hexyl, cyclohexyl, 3-cyclohexenyl, heptyl, 2-ethylhexyl, nonyl, undecyl, tridecyl, pentadecyl, heptadecyl, 1-adamantyl, 2-adamantyl, 1-adamantylmethyl, norbornyl, norbornylmethyl, tricyclodecanyl, tetracyclododecanyl, tetracyclododecanylmethyl, dicyclohexylmethyl, eicosyl, allyl, benzyl, diphenylmethyl, tetrahydrofuryl, methoxymethyl, ethoxymethyl, methylthiomethyl, acetamidomethyl, trifluoromethyl, (2-methoxyethoxy)methyl, acetoxymethyl, 2-carboxy-1-cyclohexyl, 2-oxopropyl, 4-oxo-1-adamantyl, and 3-oxocyclohexyl.

In formula (P1), Ar is a substituted or unsubstituted $C_6$-$C_{20}$ aryl group which may contain a heteroatom, or a plurality of Ar groups may bond directly or via an oxygen atom, methylene, sulfone or carbonyl moiety. Typical of the heteroatom contained are oxygen, nitrogen, sulfur and halogen atoms, with the oxygen and fluorine atoms being preferred. Suitable substituent radicals include straight, branched or cyclic $C_1$-$C_6$ alkyl radicals, straight, branched or cyclic $C_1$-$C_6$ alkoxy radicals, alkoxyalkyl radicals, alkoxyalkoxy radicals, hydroxyl radicals, fluoro, chloro, N,N-dialkylamino radicals in which the alkyl moiety has 1 to 4 carbon atoms, mono- or polycyclic lactone radicals of 4 to 10 carbon atoms, straight, branched or cyclic $C_1$-$C_{14}$ alkyloxycarbonylmethoxy radicals, methylthio radicals, phenylthio radicals, and $C_1$-$C_{11}$ acyloxy radicals. Although the number of substituent radicals is arbitrary, mono or di-substitution is preferred, if any, with mono-substitution being most preferred. Exemplary substituent radicals include methyl, ethyl, propyl, 1-methylethyl, butyl, 1,1-dimethylethyl, hexyl, cyclohexyl, methoxy, ethoxy, propoxy, butoxy, 1,1-dimethylethoxy, hexyloxy, cyclohexyloxy, 2-methoxyethoxy, 2-(2-methoxyethoxy)ethoxy, 2,2,2-trifluoroethoxy, N,N-dimethylamino, 1,1-dimethylethoxycarbonylmethoxy, 1-methyladamantan-1-yloxycarbonylmethoxy, acetyl, pivaloyloxy, and adamantan-1-ylcarbonyloxy.

Suitable groups of Ar include, but are not limited to, phenyl, naphthyl (with any substitution position to the sulfur atom of sulfonium cation), anthryl, phenanthryl, pyrenyl, tolyl, xylyl, trimethylphenyl (with any substitution position to the sulfur atom of sulfonium cation), ethylphenyl, biphenylyl, methoxyphenyl, fluorophenyl, difluorophenyl, tert-butylphenyl, ethoxyphenyl, butoxyphenyl, tert-butoxyphenyl, methylthiophenyl, trifluoromethylphenyl, acetoxyphenyl, hydroxyphenyl, N,N-dimethylaminophenyl, methylnaphthyl, hydroxynaphthyl, dihydroxynaphthyl, methoxynaphthyl, butoxynaphthyl, 2,2,2-trifluoroethoxynaphthyl, and (2-methoxyethoxy)naphthyl.

When a plurality of Ar groups bond directly or via an oxygen atom, methylene, sulfone or carbonyl moiety, dibenzothiophene skeleton, phenoxathiin skeleton, and other partial structures as shown below are exemplary.

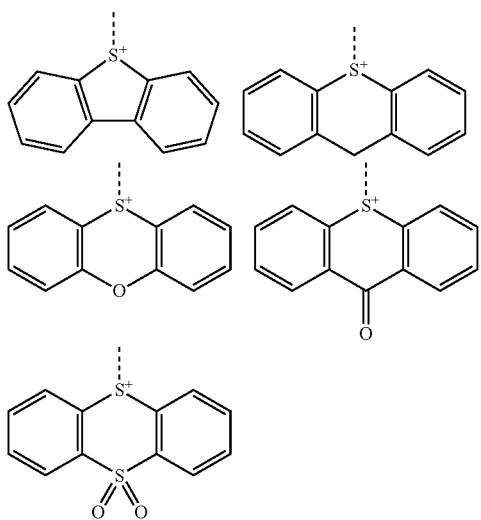

Herein the broken line denotes a bond to another Ar group.

Examples of the sulfonium cation include, but are not limited to, triphenylsulfonium, 4-hydroxyphenyldiphenylsulfonium, bis(4-hydroxyphenyl)phenylsulfonium, tris(4-hydroxyphenyl)sulfonium, 4-tert-butoxyphenyldiphenylsulfonium, bis(4-tert-butoxyphenyl)phenylsulfonium, tris(4-tert-butoxyphenyl)sulfonium, 3-tert-butoxyphenyldiphenylsulfonium, bis(3-tert-butoxyphenyl)phenylsulfonium, tris(3-tert-butoxyphenyl)sulfonium, 4-tert-butylphenyldiphenylsulfonium, tris(4-tert-butylphenyl)sulfonium, 3,4-di-tert-butoxyphenyldiphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, 10-phenylphenoxathiinium, S-phenyldibenzothiophenium, 4-tert-butoxycarbonylmethyloxyphenyldiphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, (4-hydroxy-3,5-dimethylphenyl)diphenylsulfonium, and (4-n-hexyloxy-3,5-dimethylphenyl)diphenylsulfonium. Of these, triphenylsulfonium, 4-tert-butylphenyldiphenylsulfonium, 4-tert-butoxyphenyldiphenylsulfonium, 10-phenylphenoxathiinium, and S-phenyldibenzothiophenium are more preferred. Inter alia, triphenylsulfonium, 4-tert-butylphenyldiphenylsulfonium, and 4-tert-butoxyphenyldiphenylsulfonium are most preferred.

With respect to the synthesis of the sulfonium salt having formula (P1), reference may be made to JP-A 2007-145797, JP-A 2008-106045, JP-A 2009-007327, and JP-A 2009-258695, for example.

Illustrative examples of the preferred PAG are given below.

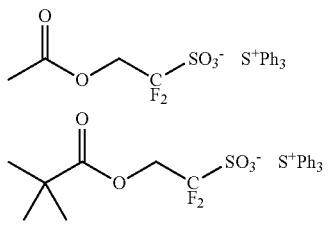

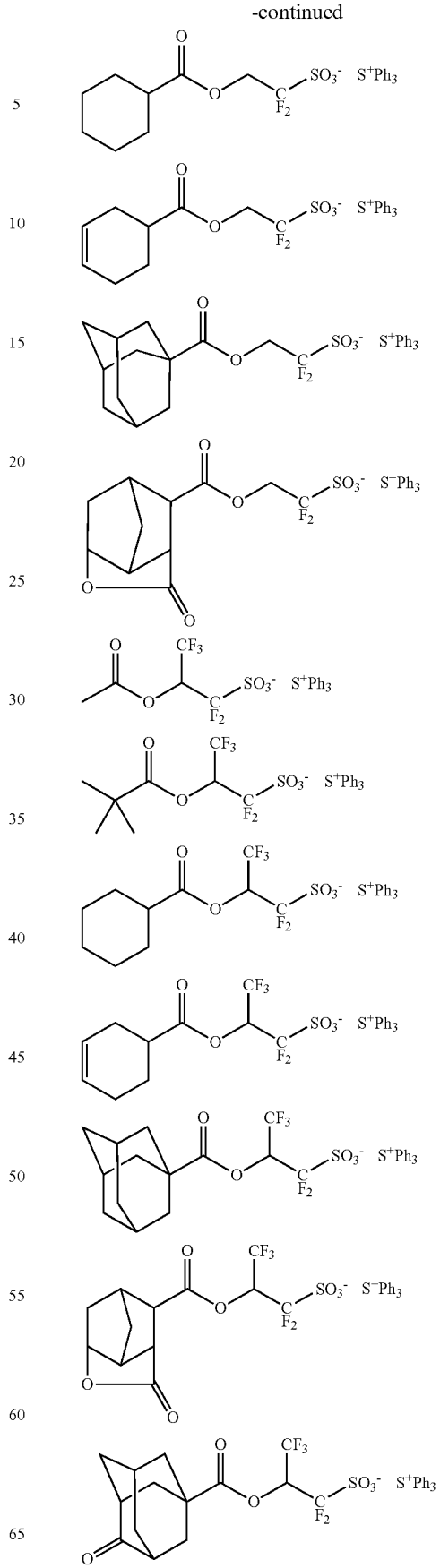

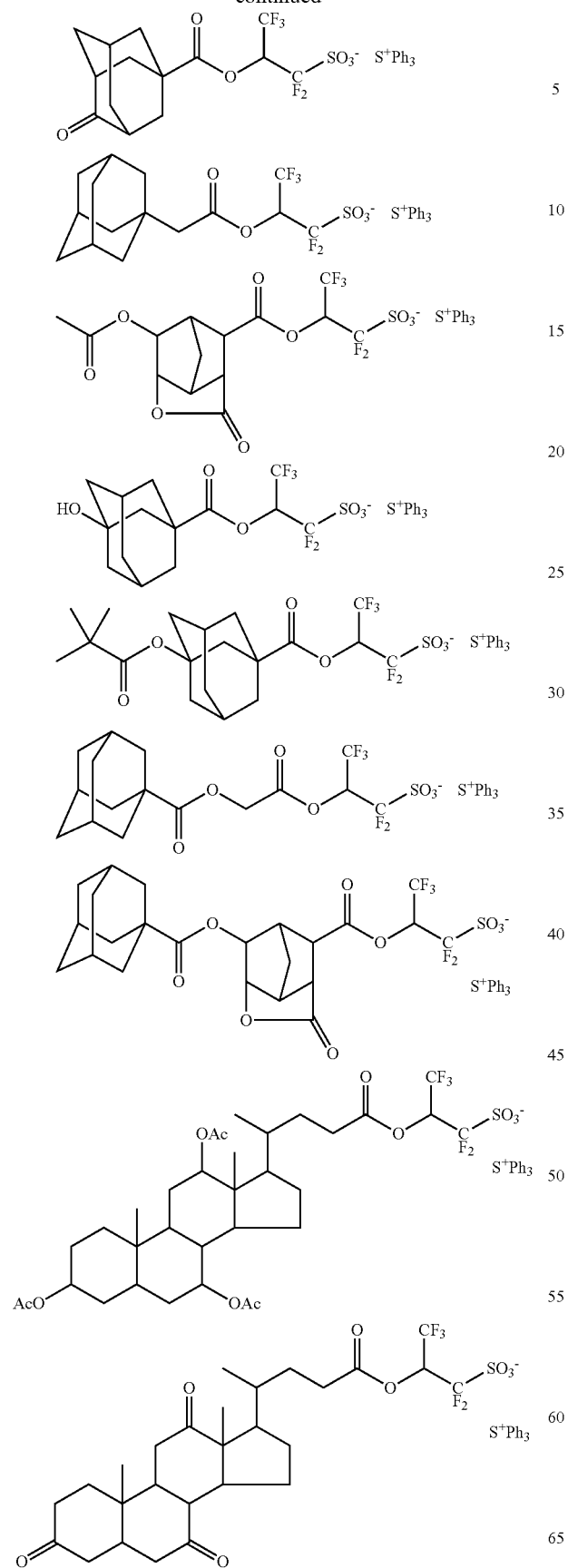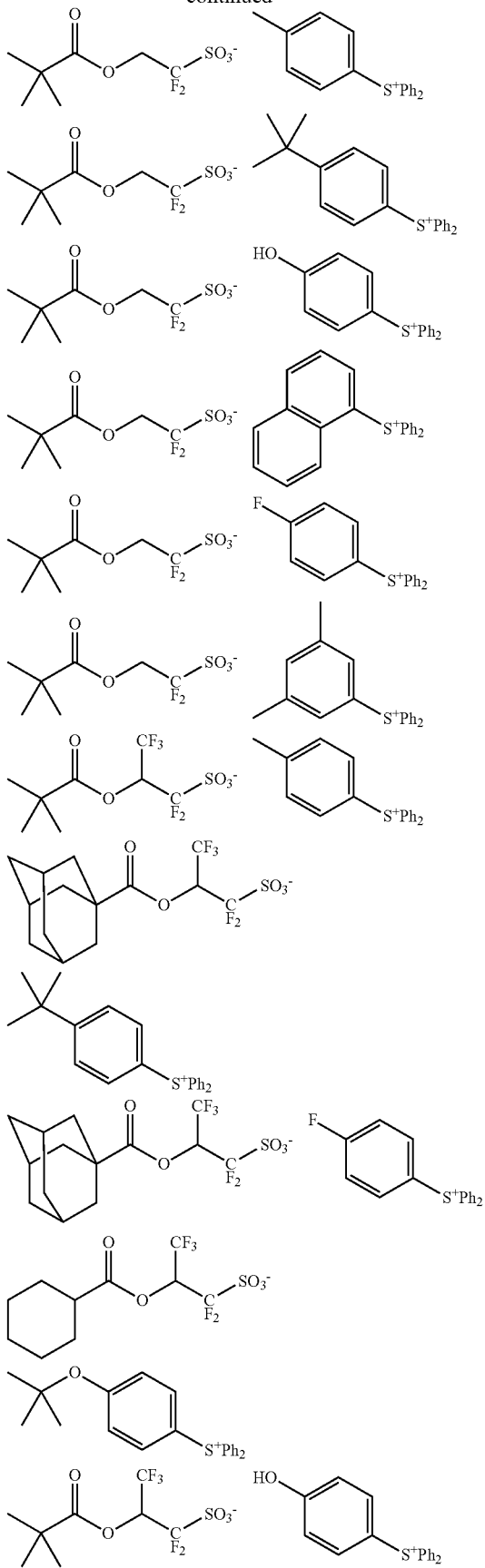

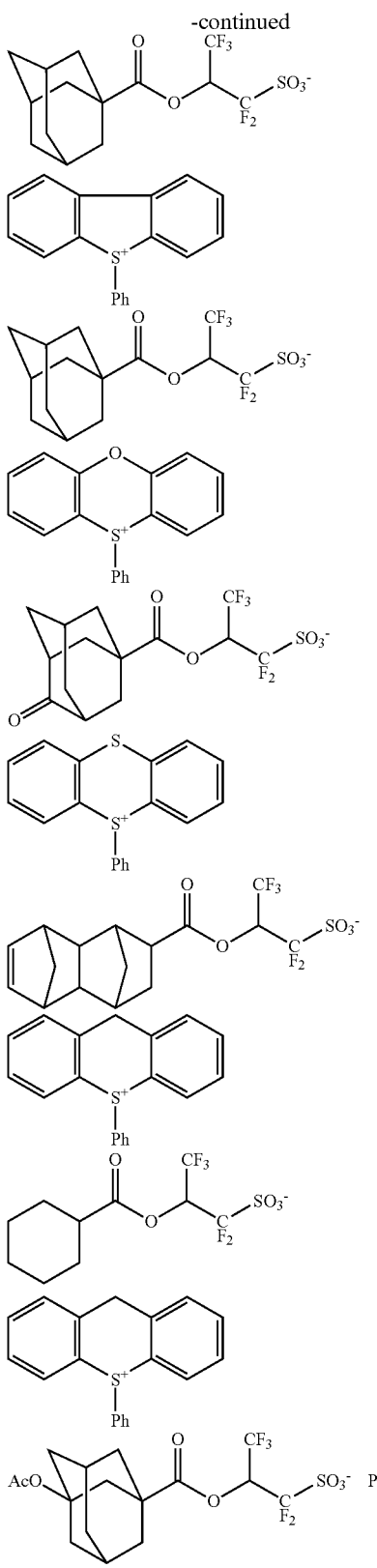

Herein Ac stands for acetyl and Ph stands for phenyl.

An appropriate amount of the PAG having formula (P1) added is 0 to 40 parts by weight, and if added, 0.1 to 40 parts, and more preferably 0.1 to 20 parts by weight per 100 parts by weight of the base resin. Too high a proportion of the PAG may give rise to problems such as degraded resolution and foreign particles during development and resist film stripping. The PAG having formula (P1) may be used alone or in admixture of two or more or in admixture with another PAG. When the other PAG is added, its amount is arbitrary as long as the objects of the invention are not compromised. Typically the amount of the other PAG is 0 to 20 parts, preferably 0.1 to 10 parts by weight per 100 parts by weight of the base resin.

Notably, the resist composition comprises as base resin (A) a sulfonic acid anion-containing polymer having an alkylsulfonium cation, which also functions as PAG. Therefore, it is unnecessary to add PAG (B) although it is acceptable to use one or more PAGs (B) in combination with base resin (A).

(C) Quencher

The quencher (C) may be a compound capable of suppressing the rate of diffusion when the acid generated by the PAG diffuses within the resist film. The inclusion of quencher facilitates adjustment of resist sensitivity and holds down the rate of acid diffusion within the resist film, resulting in better resolution. In addition, it suppresses changes in sensitivity following exposure and reduces substrate and environment dependence, as well as improving the exposure latitude and the pattern profile. The inclusion of quencher is also effective for improving adhesion to the substrate.

Examples of suitable quenchers include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, carbamate derivatives, and ammonium salts.

Since highly nucleophilic compounds or strongly basic compounds can react with an alkylsulfonium salt in the inventive polymer, low nucleophilic or weakly basic compounds are preferred as the quencher. Suitable compounds include anilines such as aniline, N-methylaniline, N-ethylaniline, N-propylaniline, N,N-dimethylaniline, N,N-bis(hydroxyethyl)aniline, 2-methylaniline, 3-methylaniline, 4-methylaniline, ethylaniline, propylaniline, dimethylaniline, 2,6-diisopropylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine, and primary and secondary amines which have been protected with tert-butoxycarbonyl (tBOC). Also useful are the compounds described in JP-A 2007-298569 and JP-A 2010-020204.

The quenchers may be used alone or in admixture of two or more. The quencher is preferably used in an amount of 0.001 to 8 parts, more preferably 0.01 to 4 parts by weight per 100 parts by weight of the base resin. Less than 0.001 part of the quencher may achieve no addition effect whereas more than 8 parts may lead to too low a sensitivity.

(D) Organic Solvent

The organic solvent (D) used herein may be any organic solvent in which the polymer (or base resin), acid generator, quencher, and other components are soluble. Illustrative, non-limiting, examples of the organic solvent include ketones such as cyclohexanone and methyl amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, propylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, which may be used alone or in combinations of two or more. Of the above organic solvents, it is recommended to use 1-ethoxy-2-propanol, PGMEA, cyclohexanone, γ-butyrolactone, and mixtures thereof because the acid generator is most soluble therein.

An appropriate amount of the organic solvent used is 200 to 5,000 parts, more preferably 400 to 3,000 parts by weight per 100 parts by weight of the base resin.

(E) Surfactant

Component (E) is a surfactant which is insoluble or substantially insoluble in water and soluble in alkaline developer, and/or a surfactant which is insoluble or substantially insoluble in water and alkaline developer (hydrophobic resin). The surfactant (E) may be added to the resist composition. Reference should be made to those compounds defined as component (S) in JP-A 2010-215608 and JP-A 2011-016746.

While many examples of the surfactant which is insoluble or substantially insoluble in water and alkaline developer are described in these patent documents, preferred examples are FC-4430, Surflon S-381, Surfynol E1004, KH-20 and KH-30, which may be used alone or in admixture. Partially fluorinated oxetane ring-opened polymers having the structural formula (surf-1) are also useful.

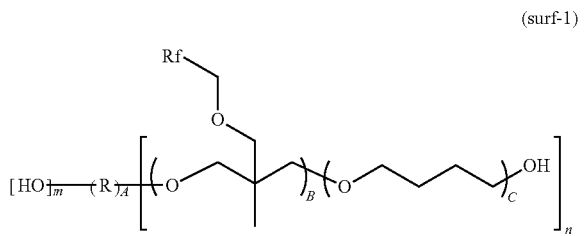
(surf-1)

It is provided herein that R, Rf, A, B, C, m, and n are applied to only formula (surf-1), independent of their descriptions other than for the surfactant. R is a di- to tetra-valent $C_2$-$C_5$ aliphatic group. Exemplary divalent groups include ethylene, 1,4-butylene, 1,2-propylene, 2,2-dimethyl-1,3-propylene and 1,5-pentylene. Exemplary tri- and tetra-valent groups are shown below.

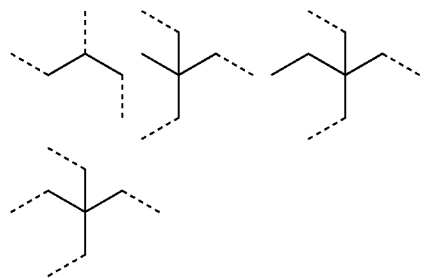

Herein the broken line denotes a valence bond. These formulae are partial structures derived from glycerol, trimethylol ethane, trimethylol propane, and pentaerythritol, respectively. Of these, 1,4-butylene and 2,2-dimethyl-1,3-propylene are preferably used.

Rf is trifluoromethyl or pentafluoroethyl, and preferably trifluoromethyl. The letter m is an integer of 0 to 3, n is an integer of 1 to 4, and the sum of m and n, which represents the valence of R, is an integer of 2 to 4. A is equal to 1, B is an integer of 2 to 25, and C is an integer of 0 to 10. Preferably, B is an integer of 4 to 20, and C is 0 or 1. Note that the above structural formula does not prescribe the arrangement of respective constituent units while they may be arranged either in blocks or randomly. For the preparation of surfactants in the form of partially fluorinated oxetane ring-opened polymers, reference should be made to U.S. Pat. No. 5,650,483, for example.

The surfactant which is insoluble or substantially insoluble in water and soluble in alkaline developer is useful when ArF immersion lithography is applied to the resist composition in the absence of a resist protective film. In this embodiment, the surfactant has a propensity to segregate on the resist surface after spin coating for achieving a function of minimizing water penetration or leaching. The surfactant is also effective for preventing water-soluble components from being leached out of the resist film for minimizing any damage to the exposure tool. The surfactant becomes solubilized during alkaline development following exposure and PEB, and thus forms few or no foreign particles which become defects. The preferred surfactant is a polymeric surfactant which is insoluble or substantially insoluble in water, but soluble in alkaline developer, also referred to as "hydrophobic resin" in this sense, and especially which is water repellent and enhances water slippage. Suitable polymeric surfactants are shown below.

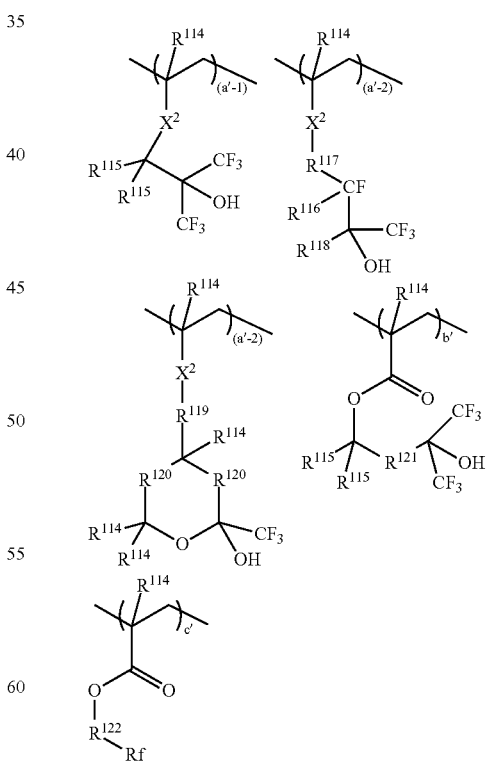

Herein $R^{114}$ is each independently hydrogen, fluorine, methyl or trifluoromethyl. $R^{115}$ is each independently hydrogen or a straight, branched or cyclic $C_1$-$C_{20}$ alkyl or fluoroalkyl group, or two $R^{115}$ in a common monomer may bond together to form a ring with the carbon atom to which they are attached, and in this event, they together represent a straight, branched or cyclic $C_2$-$C_{20}$ alkylene or fluoroalkylene group. $R^{116}$ is fluorine or hydrogen, or $R^{116}$ may bond with $R^{117}$ to form a non-aromatic ring of 3 to 10 carbon atoms in total with the carbon atom to which they are attached. $R^{117}$ is a straight, branched or cyclic $C_1$-$C_6$ alkylene group in which at least one hydrogen atom may be substituted by a fluorine atom. $R^{118}$ is a straight or branched $C_1$-$C_{10}$ alkyl group in which at least one hydrogen atom is substituted by a fluorine atom. Alternatively, $R^{117}$ and $R^{118}$ may bond together to form a non-aromatic ring with the carbon atoms to which they are attached. In this event, $R^{117}$, $R^{118}$ and the carbon atoms to which they are attached together represent a trivalent organic group of 2 to 12 carbon atoms in total. $R^{119}$ is a single bond or a $C_1$-$C_4$ alkylene. $R^{120}$ is each independently a single bond, —O—, or —$CR^{114}R^{114}$—. $R^{121}$ is a straight or branched $C_1$-$C_4$ alkylene group, or may bond with $R^{115}$ within a common monomer to form a $C_3$-$C_6$ non-aromatic ring with the carbon atom to which they are attached. $R^{122}$ is 1,2-ethylene, 1,3-propylene, or 1,4-butylene. Rf is a linear perfluoroalkyl group of 3 to 6 carbon atoms, typically 3H-perfluoropropyl, 4H-perfluorobutyl, 5H-perfluoropentyl, or 6H-perfluorohexyl. $X^2$ is each independently —C(=O)—O—, —O—, or —C(=O)—$R^{123}$—C(=O)—O—. $R^{123}$ is a straight, branched or cyclic $C_1$-$C_{10}$ alkylene group. The subscripts are in the range: $0 \leq (a'\text{-}1) < 1$, $0 \leq (a'\text{-}2) < 1$, $0 \leq (a'\text{-}3) < 1$, $0 < (a'\text{-}1) + (a'\text{-}2) + (a'\text{-}3) < 1$, $0 \leq b' < 1$, $0 \leq c' < 1$, and $0 < (a'\text{-}1) + (a'\text{-}2) + (a'\text{-}3) + b' + c' \leq 1$.

Examples of these units are shown below.

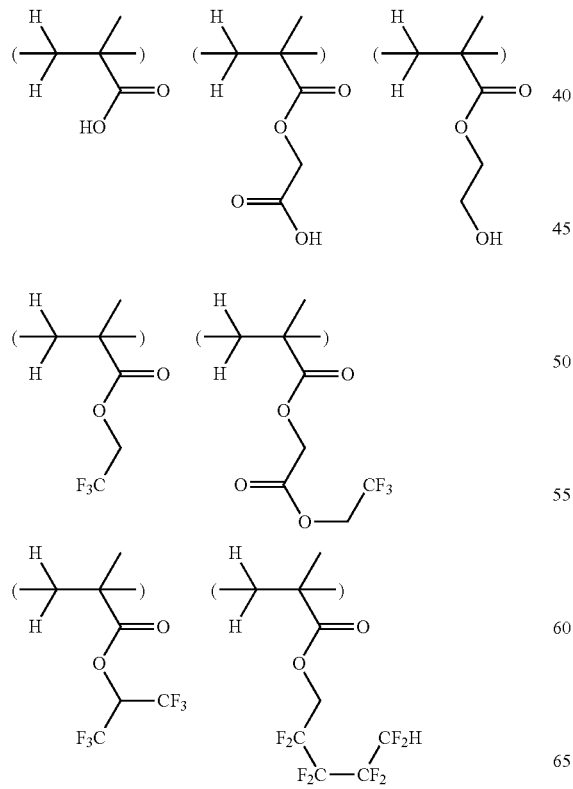

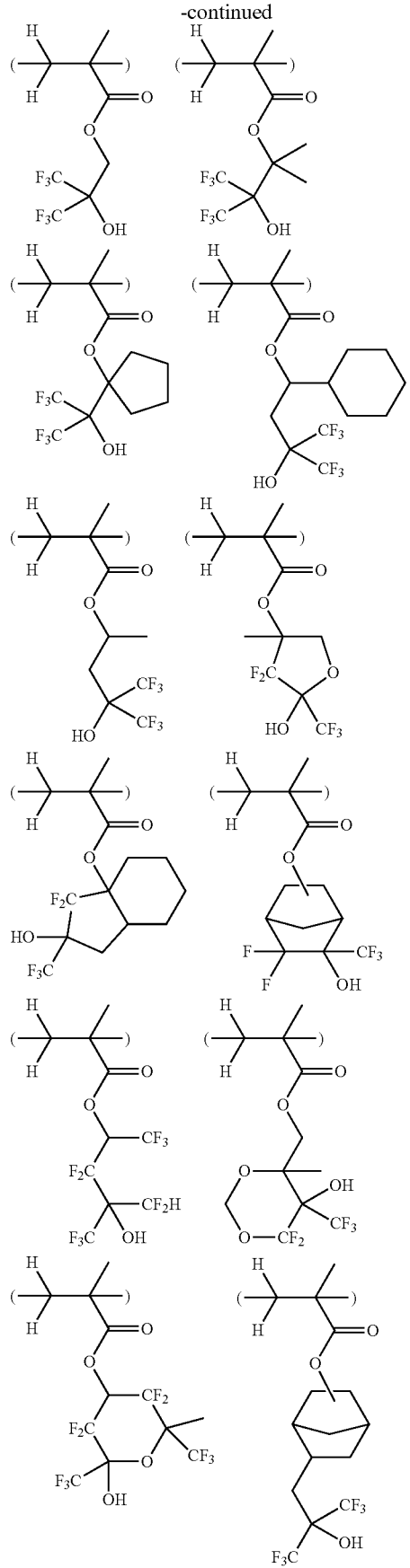

-continued
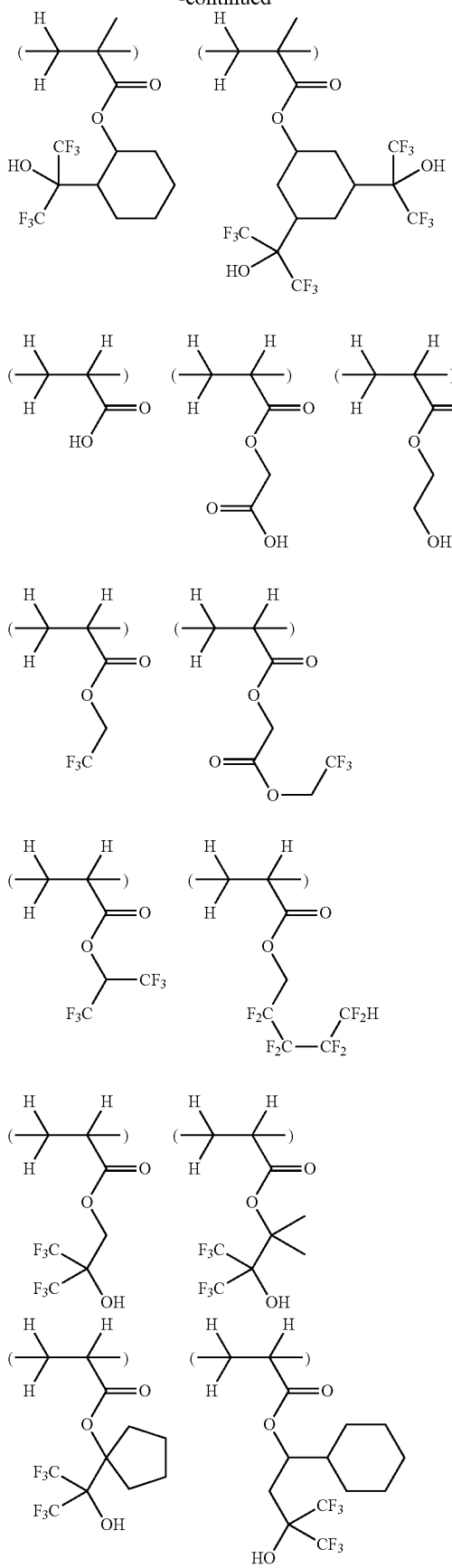
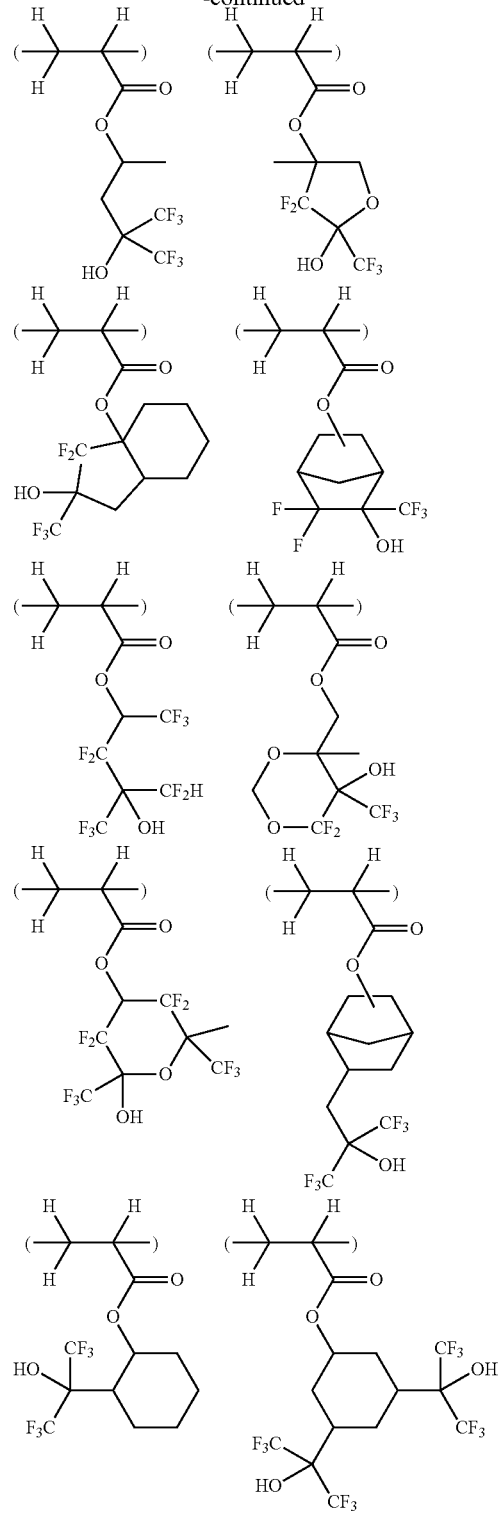
For the surfactant which is insoluble or substantially insoluble in water and soluble in alkaline developer, reference may be made to JP-A 2008-122932, 2010-134012, 2010-107695, 2009-276363, 2009-192784, 2009-191151, 2009-98638, 2010-250105, and 2011-42789.
The polymeric surfactant preferably has a Mw of 1,000 to 50,000, more preferably 2,000 to 20,000 as measured by GPC versus polystyrene standards. A surfactant with a Mw outside the range may be less effective for surface modification and cause development defects. The polymeric surfactant is preferably formulated in an amount of 0.001 to 20 parts, and more preferably 0.01 to 10 parts by weight per 100 parts by weight of the base resin. Reference should also be made to JP-A 2010-215608.

To the resist composition, a compound which is decomposed with an acid to generate another acid, that is, acid amplifier compound may be added. For these compounds, reference should be made to JP-A 2009-269953 and 2010-215608. In the resist composition, an appropriate amount of the acid amplifier compound is up to 2 parts, and especially up to 1 part by weight per 100 parts by weight of the base resin. Excessive amounts of the acid amplifier compound make diffusion control difficult, leading to degradation of resolution and pattern profile.

Optionally, an organic acid derivative or a compound having a Mw of up to 3,000 which changes its solubility in alkaline developer under the action of an acid, also referred to as dissolution inhibitor, may be added. Reference may be made to JP-A 2009-269953 and 2010-215608.

Process

A further embodiment of the invention is a pattern forming process using the resist composition defined above. A pattern may be formed from the resist composition using any well-known lithography process. The preferred process includes at least the steps of forming a resist film on a substrate, exposing it to high-energy radiation, and developing it in a developer.

The resist composition is applied onto a substrate for integrated circuit fabrication (e.g., Si, $SiO_2$, SiN, SiON, TiN, WSi, BPSG, SOG or organic antireflective coating) by a suitable coating technique such as spin coating. The coating is prebaked on a hot plate at a temperature of 60 to 150° C. for 1 to 10 minutes, preferably 80 to 140° C. for 1 to 5 minutes, to form a resist film of 0.05 to 2.0 μm thick. The resist film is then exposed by the ArF immersion lithography. A mask having the desired pattern is placed over the resist film, a liquid, typically water, is interposed between the mask and the resist film, and the resist film is exposed to ArF excimer laser radiation in a dose of 1 to 200 $mJ/cm^2$, and preferably 10 to 100 $mJ/cm^2$. Prior to exposure, a protective film which is insoluble in water may be formed on the resist film, if desired.

After exposure, the resist film is baked (PEB) on a hot plate at 60 to 150° C. for 1 to 5 minutes, and preferably at 80 to 140° C. for 1 to 3 minutes. This is followed by development in a developer which is an alkaline aqueous solution, typically an aqueous solution of 0.1 to 5 wt %, more typically 2 to 3 wt % of tetramethylammonium hydroxide (TMAH). Development may be carried out by a conventional method such as dip, puddle, or spray development for 0.1 to 3 minutes, and preferably 0.5 to 2 minutes. These steps result in the formation of the desired pattern on the substrate.

The water-insoluble protective film which is used in the immersion lithography is to prevent any components from being leached out of the resist film and to improve water slippage at the film surface and is generally divided into two types. The first type is an organic solvent-strippable protective film which must be stripped, prior to alkaline development, with an organic solvent in which the resist film is not dissolvable. The second type is an alkali-soluble protective film which is soluble in an alkaline developer so that it can be removed simultaneously with the removal of solubilized regions of the resist film. The protective film of the second type is preferably of a material comprising a polymer having a 1,1,1,3,3,3-hexafluoro-2-propanol residue (which is insoluble in water and soluble in an alkaline developer) as a base in an alcohol solvent of at least 4 carbon atoms, an ether solvent of 8 to 12 carbon atoms or a mixture thereof. Alternatively, the aforementioned surfactant which is insoluble in water and soluble in an alkaline developer may be dissolved in an alcohol solvent of at least 4 carbon atoms, an ether solvent of 8 to 12 carbon atoms or a mixture thereof to form a material from which the protective film of the second type is formed.

Any desired step may be added to the pattern forming process. For example, after a photoresist film is formed, a step of rinsing with pure water (post-soaking) may be introduced to extract the acid generator or the like from the film surface or wash away particles. After exposure, a step of rinsing (post-soaking) may be introduced to remove any water remaining on the film after exposure.

The technique enabling the ArF lithography to survive to the 32-nm node is a double patterning process. The double patterning process includes a trench process of processing an underlay to a 1:3 trench pattern by a first step of exposure and etching, shifting the position, and forming a 1:3 trench pattern by a second step of exposure for forming a 1:1 pattern; and a line process of processing a first underlay to a 1:3 isolated left pattern by a first step of exposure and etching, shifting the position, processing a second underlay formed below the first underlay by a second step of exposure through the 1:3 isolated left pattern, for forming a half-pitch 1:1 pattern.

In the pattern forming process, an alkaline aqueous solution, typically an aqueous solution of 0.1 to 5 wt %, more typically 2 to 3 wt % of tetramethylammonium hydroxide (TMAH) is often used as the developer. The negative tone development technique wherein the unexposed region is developed and dissolved in an organic solvent is also applicable.

In the organic solvent development, the organic solvent used as the developer is preferably selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate. These organic solvents may be used alone or in admixture of two or more.

EXAMPLE

Examples of the invention are given below by way of illustration and not by way of limitation. Mw and Mn are weight and number average molecular weights, respectively, and Mw/Mn is a polydispersity index. Me stands for methyl.

Synthesis Example 1-1

Synthesis of 1-(4-hydroxy-1-naphthalenyl)tetrahydrothiophenium chloride

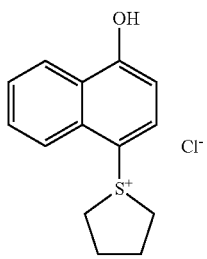 [SMILES: Oc1ccc([S+]2CCCC2)c2ccccc12 ; [Cl-]]

In 50 g of methanol were dissolved 10 g (0.069 mol) of 1-naphthol and 7.2 g (0.069 mol) of tetramethylene sulfoxide. The solution was cooled at −16° C. An excessive amount of hydrogen chloride was fed to the solution at a temperature below 20° C. Nitrogen was bubbled into the solution to expel the excess of hydrogen chloride gas, after which the reaction solution was concentrated. Water and isopropyl ether were added to the concentrate, from which the water layer which was an aqueous solution of the target, 1-(4-hydroxy-1-naphthalenyl)tetrahydrothiophenium chloride was separated. Without further isolation, the aqueous solution was used in the subsequent reaction.

Synthesis Example 1-2

Synthesis of 1-(2,2,2-trifluoroethoxy)naphthalene

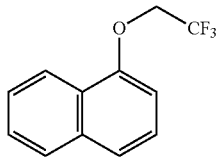 [SMILES: FC(F)(F)COc1cccc2ccccc12]

In a nitrogen atmosphere, a suspension of 34 g of 1-naphthol, 40 g of 2,2,2-trifluoroethyl p-toluenesulfonate, 33 g of potassium carbonate, and 80 g of dimethyl sulfoxide was heated and stirred at 100° C. for 12 hours. After cooling, 100 g of water and 200 g of toluene were added to the suspension, from which the organic layer was separated. The organic layer was washed 5 times with 100 g of 5 wt % sodium hydroxide aqueous solution and then 4 times with 100 g of water, and concentrated, yielding 36 g of oily matter. On vacuum distillation (75° C./13 Pa), 28 g of the target, 1-(2,2,2-trifluoroethoxy)naphthalene was collected (yield 76%).

Synthesis Example 1-3

Synthesis of 1-[4-(2,2,2-trifluoroethoxy)-1-naphthalenyl]-tetrahydrothiophenium methanesulfonate

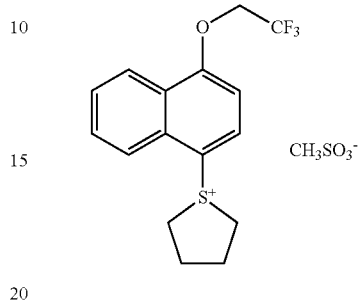

In 6 g of Eaton's Reagent (Aldrich Co., phosphorus pentoxide in methanesulfonic acid) was dispersed 3 g (0.0127 mol) of 1-(2,2,2-trifluoroethoxy)naphthalene prepared in Synthesis Example 1-2. To the dispersion, 2.6 g (0.0253 mol) of tetramethylene sulfoxide was added dropwise and mixed. The mixture was matured overnight at room temperature. 30 g of water and 30 g of diisopropyl ether were added to the mixture, from which the water layer was separated. The water layer was washed with 30 g of diisopropyl ether, obtaining an aqueous solution of 1-[4-(2,2,2-trifluoroethoxy)-1-naphthalenyl]tetrahydrothiophenium methanesulfonate. Without further isolation, the aqueous solution was used in the subsequent reaction.

Synthesis Example 1-4

Synthesis of 1-(2-methoxyethoxy)naphthalene

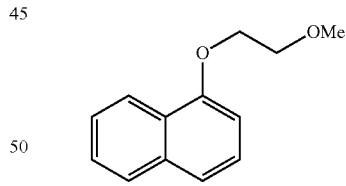

In 100 g of ethanol were dissolved 50.0 g (0.0347 mol) of 1-naphthol, 34.4 g (0.0364 mol) of 2-methoxyethyl chloride, 14.6 g (0.0364 mol) of sodium hydroxide, and 2.6 g (0.017 mol) of sodium iodide. The solution was heated and stirred at 80° C. for 8 hours. After cooling, 100 g of water and 200 g of toluene were added to the solution, from which the organic layer was separated. The organic layer was washed 5 times with 100 g of 5 wt % sodium hydroxide aqueous solution and then 4 times with 100 g of water, and concentrated, yielding 45 g of oily matter. On vacuum distillation (110° C./13 Pa), 41 g of the target, 1-(2-methoxyethoxy)naphthalene was collected (yield 58%).

Synthesis Example 1-5

Synthesis of 1-[4-(2-methoxyethoxy)-1-naphthalenyl]-tetrahydrothiophenium methanesulfonate

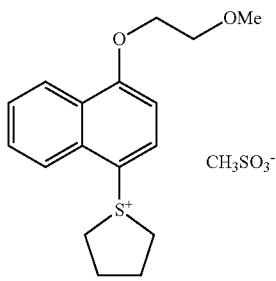

In 16 g of a solution of diphosphorus pentoxide in methanesulfonic acid (Tokyo Chemical Industry Co., Ltd.) was dispersed 8.1 g (0.04 mol) of 1-(2-methoxyethoxy) naphthalene prepared in Synthesis Example 1-4. To the dispersion, 4.1 g (0.04 mol) of tetramethylene sulfoxide was added dropwise and mixed. The mixture was matured overnight at room temperature. 100 g of water and 30 g of diisopropyl ether were added to the mixture, from which the water layer was separated. The water layer was washed with 30 g of diisopropyl ether, obtaining an aqueous solution of 1-[4-(2-methoxyethoxy)-1-naphthalenyl]tetrahydrothiophenium methanesulfonate. Without further isolation, the aqueous solution was used in the subsequent reaction.

Synthesis Example 1-6

Synthesis of triethylammonium 1,1,3,3,3-pentafluoro-2-hydroxypropane-1-sulfonate

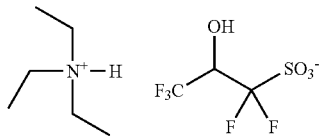

In accordance with the method of JP-A 2007-304490, triethylammonium 1,1,3,3,3-pentafluoro-2-(pivaloyloxy)-propane-1-sulfonate was synthesized. In accordance with the method of JP-A 2007-145804, the pivaloyl group was subjected to hydrolysis (or solvolysis), obtaining triethylammonium 1,1,3,3,3-pentafluoro-2-hydroxypropane-1-sulfonate as white crystals.

Synthesis Example 1-7

Synthesis of triethylammonium 1,1,3,3,3-pentafluoro-2-methacryloyloxypropane-1-sulfonate

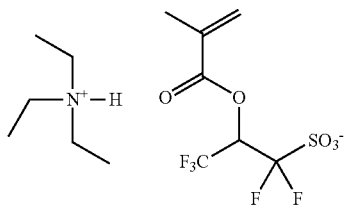

In 400 g of methylene chloride were dissolved 79 g (0.16 mol) of triethylammonium 1,1,3,3,3-pentafluoro-2-hydroxypropane-1-sulfonate obtained in Synthesis Example 1-6, 19 g (0.19 mol) of triethylamine, and 0.10 g (0.8 mmol) of N,N'-dimethylaminopyridine. Under ice cooling, 28 g (0.18 mol) of methacrylic anhydride was added dropwise to the solution, followed by stirring overnight at room temperature. Then dilute hydrochloric acid was added to quench the reaction. The organic layer was separated and washed with water. After water washing, the organic layer was concentrated, combined with methyl isobutyl ketone, and concentrated again. The residue was washed with diisopropyl ether, obtaining 45 g of the target, triethylammonium 1,1,3,3,3-pentafluoro-2-methacryloyloxypropane-1-sulfonate as oily matter. Yield 70%.

Synthesis Example 1-8

Synthesis of 1-[4-(2,2,2-trifluoroethoxy)-1-naphthalenyl]-tetrahydrothiophenium 1,1,3,3,3-pentafluoro-2-methacryloyloxypropane-1-sulfonate

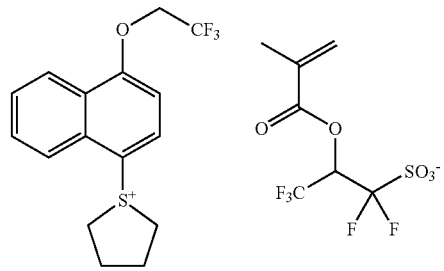

An amount (corresponding to 0.08 mol) of an aqueous solution of 1-[4-(2,2,2-trifluoroethoxy)-1-naphthalenyl]-tetrahydrothiophenium methanesulfonate obtained in Synthesis Example 1-3 and 32 g (0.08 mol) of triethylammonium 1,1,3,3,3-pentafluoro-2-methacryloyloxypropane-1-sulfonate obtained in Synthesis Example 1-7 were mixed with 150 g of methylene chloride and 100 g of water. The mixture was stirred for 30 minutes at room temperature, after which the organic layer was separated and washed with water. After water washing, the organic layer was concentrated, combined with methyl isobutyl ketone, and concentrated again. Diisopropyl ether was added to the residue for recrystallization. The crystals were collected and dried, obtaining 36 g of the target, 1-[4-(2,2,2-trifluoroethoxy)-1-naphthalenyl]tetrahydrothiophenium 1,1,3,3,3-pentafluoro-2-methacryloyloxypropane-1-sulfonate as white crystals. Yield 75%.

Synthesis Example 2-1

Synthesis of Polymer P-1

In a flask purged with nitrogen, 14 g of triethylammonium 1,1,3,3,3-pentafluoro-2-methacryloyloxypropane-1-sulfonate obtained in Synthesis Example 1-7, 44 g of 1-isopropylcyclopentyl methacrylate, 17 g of 2-oxotetrahydrofuran-3-yl methacrylate, 25 g of 9-methoxycarbonyl-4-oxatricyclo[4.2.1.0$^{3,7}$]nonan-5-on-2-yl methacrylate, 5 g of dimethyl 2,2'-azobis(2-methylpropionate), and 0.7 g of 2-mercaptoethanol were dissolved in 175 g of methyl ethyl ketone to form a monomer solution. Another flask purged with nitrogen was charged with 58 g of methyl ethyl ketone, which was stirred and heated at 80° C. Thereafter, the monomer solution was added dropwise over 4 hours. After the completion of dropwise addition, the polymerization solution was stirred for a further 2 hours while maintaining at 80° C. After the polymerization solution was cooled to room temperature, it was added dropwise to 1,000 g of hexane. A precipitating copolymer was filtered. The copolymer was washed 2 times with a mixture of 113 g of methyl ethyl ketone and 487 g of hexane, and vacuum dried at 50° C. for 20 hours, obtaining 87 g of the copolymer in white powder form. The copolymer was analyzed by $^1$H-NMR spectroscopy, finding a copolymer compositional ratio of 8/50/22/20 mol % in the described order of monomers.

at 50° C. for 20 hours, obtaining 32 g of the copolymer in white powder form. The copolymer was analyzed by $^1$H-NMR spectroscopy, finding a copolymer compositional ratio of 8/55/7/30 mol % in the described order of monomers.

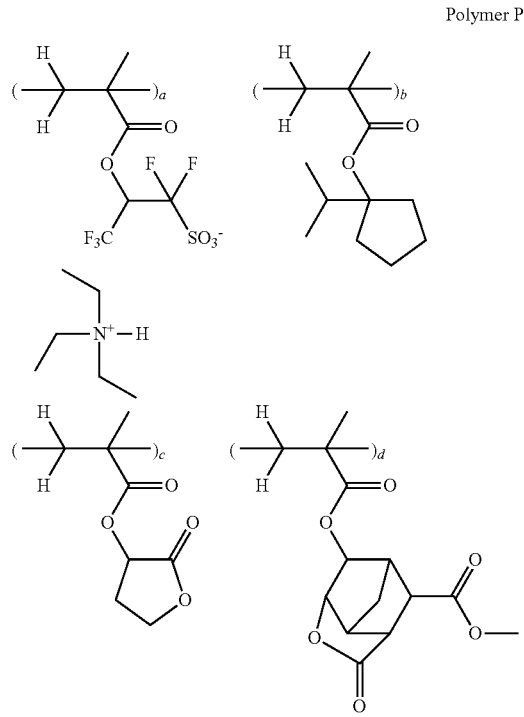

a/b/c/d = 8/50/22/20

Polymer P-1

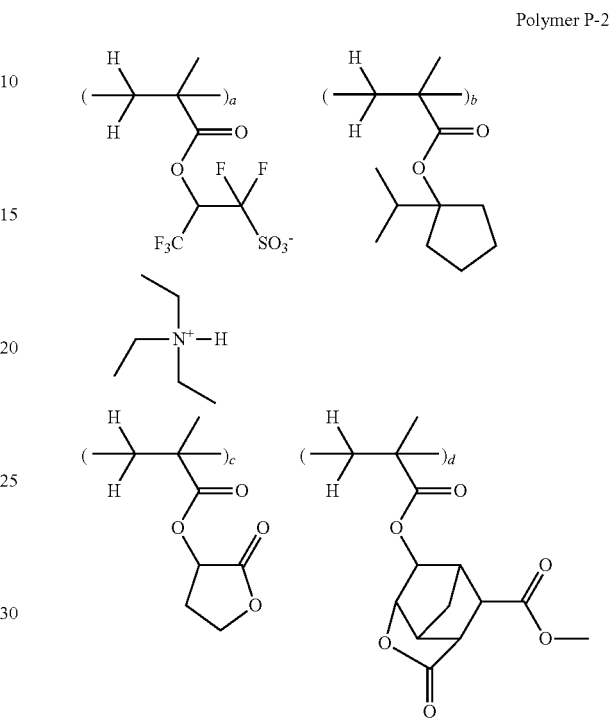

a/b/c/d = 8/55/7/30

Polymer P-2

FIG. 1 is the diagram of nuclear magnetic resonance spectroscopy ($^1$H-NMR/DMSO-$d_6$) of the target.

Synthesis Example 2-2

Synthesis of Polymer P-2

Figure 2:
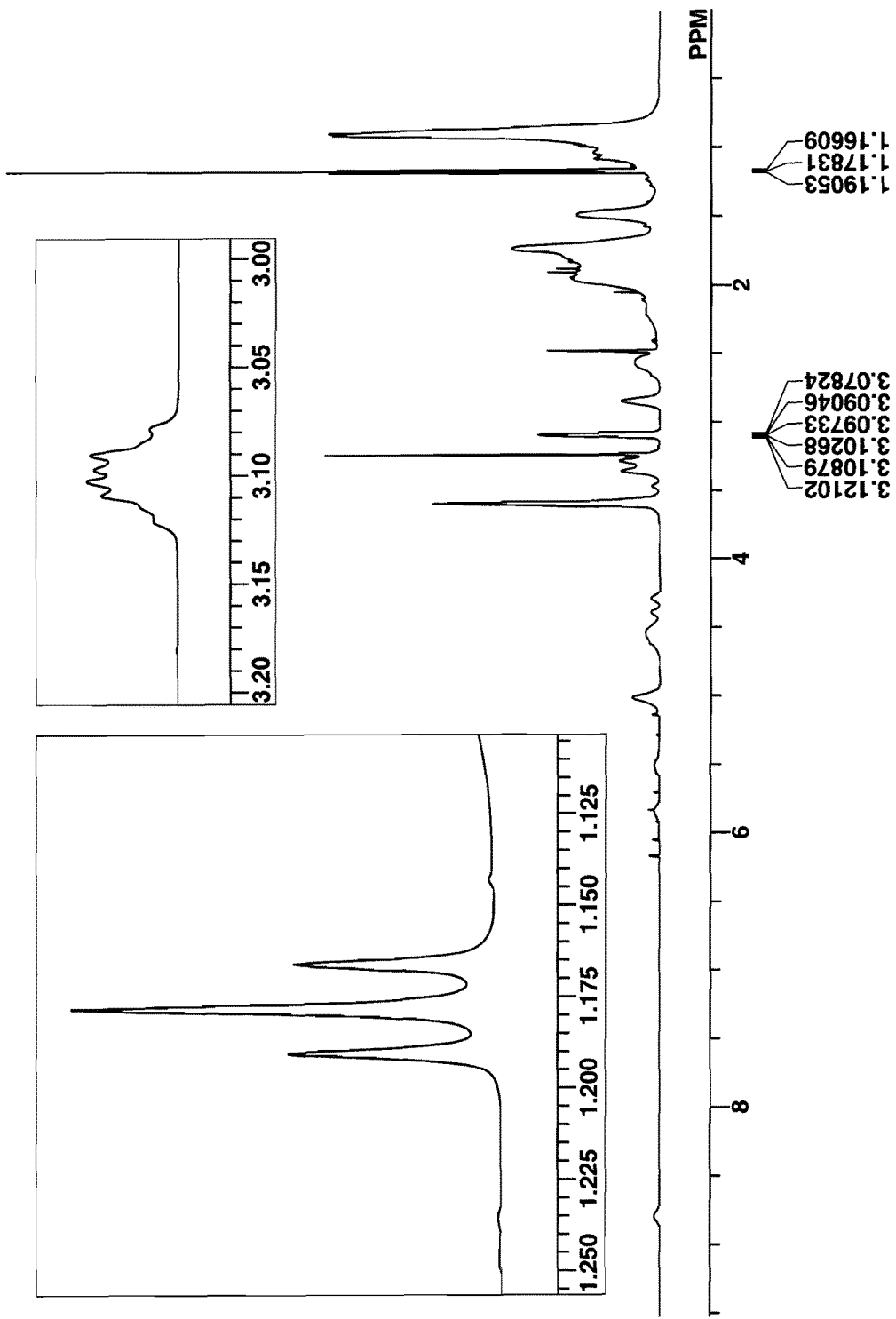
FIG. 2 is a diagram of $^1$H-NMR spectroscopy of Polymer P-2 in Synthesis Example 2-2.

In a flask purged with nitrogen, 5.4 g of triethylammonium 1,1,3,3,3-pentafluoro-2-methacryloyloxypropane-1-sulfonate obtained in Synthesis Example 1-7, 18 g of 1-isopropylcyclopentyl methacrylate, 2.0 g of 2-oxotetrahydrofuran-3-yl methacrylate, 14 g of 9-methoxycarbonyl-4-oxatricyclo[4.2.1.0$^{3,7}$]nonan-5-on-2-yl methacrylate, 2.0 g of dimethyl 2,2'-azobis(2-methylpropionate), and 0.26 g of 2-mercaptoethanol were dissolved in 77 g of methyl ethyl ketone to form a monomer solution. Another flask purged with nitrogen was charged with 23 g of methyl ethyl ketone, which was stirred and heated at 80° C. Thereafter, the monomer solution was added dropwise over 4 hours. After the completion of dropwise addition, the polymerization solution was stirred for a further 2 hours while maintaining at 80° C. After the polymerization solution was cooled to room temperature, it was added dropwise to 400 g of hexane. A precipitating copolymer was filtered. The copolymer was washed 2 times with a mixture of 48 g of methyl ethyl ketone and 192 g of hexane, and vacuum dried FIG. 2 is the diagram of spectroscopy ($^1$H-NMR/DMSO-$d_6$) of the target.

Synthesis Examples 2-3 to 2-10

Synthesis of Polymers P-3 to P-10

A series of resins as shown in Table 1 were prepared by the same procedure as in Synthesis Example 2-1 except that the type and ratio of monomers were changed. The units in Table 1 have the structure shown in Tables 2 to 4. In Table 1, the ratio of units is a molar ratio.

Synthesis Example 2-11

Synthesis of Polymer P-11

At room temperature, 10 g of Polymer P-1 obtained in Synthesis Example 2-1, an amount (corresponding to 2.9 mmol) of an aqueous solution of 1-(4-hydroxy-1-naphthalenyl)-tetrahydrothiophenium chloride prepared in Synthesis Example 1-1, 100 g of methylene chloride, and 50 g of water were mixed and stirred for 30 minutes at room temperature, after which the organic layer was separated. To the organic layer were added an amount (corresponding to 1.9 mmol) of an aqueous solution of 1-(4-hydroxy-1-naphthalenyl)tetrahydrothiophenium chloride and 50 g of water. The organic layer was separated, and washed 5 times with water. The reaction solution was concentrated, combined with methyl isobutyl ketone, and concentrated again. Diisopropyl ether was added to the concentrate for recrystallization. The solid was collected, washed with diisopropyl ether, and vacuum dried at 50° C., obtaining 8.9 g of the target, Polymer P-11. It had a copolymer compositional ratio of 8/50/22/20 mol % in the described order of monomers.

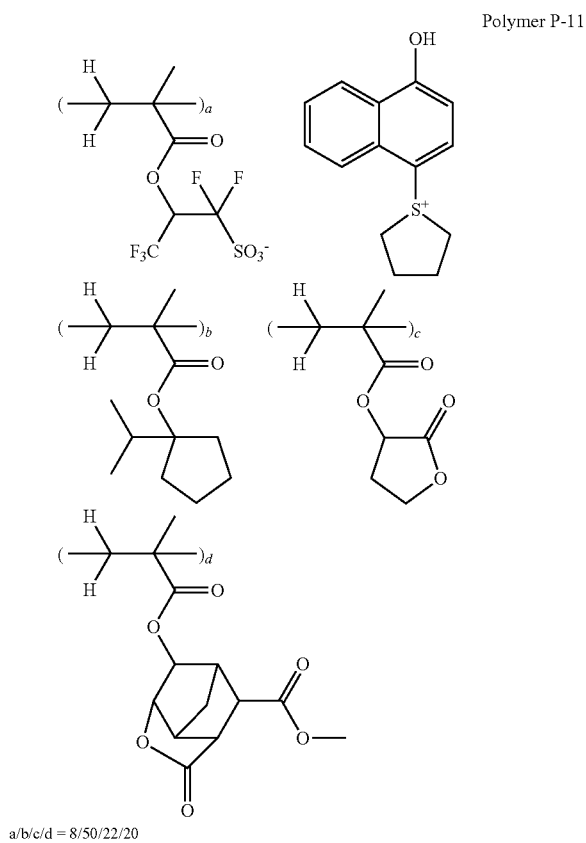

Figure 3:
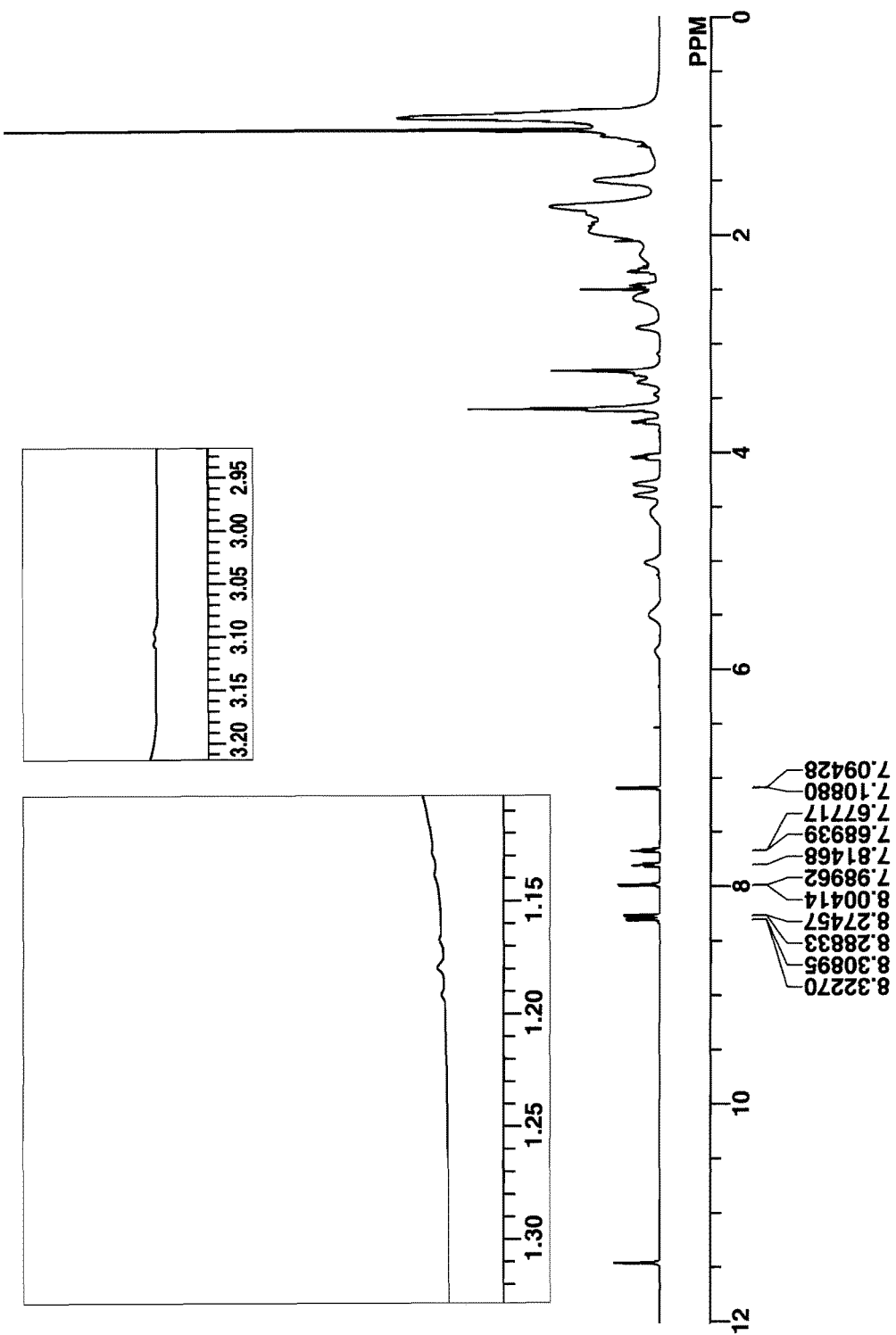
FIG. 3 is a diagram of $^1$H-NMR spectroscopy of Polymer P-11 in Synthesis Example 2-11.

FIG. 3 is the diagram of spectroscopy ($^1$H-NMR/DMSO-$d_6$) of the target. In $^1$H-NMR analysis, a trace amount of solvent (diisopropyl ether) was observed. A comparison of FIG. 3 with FIG. 1 reveals that in FIG. 3, the peak (9H, 1.2 ppm) assigned to methyl and the peak (6H, 3.1 ppm) assigned to methylene on the triethylammonium cation were extinguished, and instead, peaks indicative of alkylsulfonium salt (e.g., peaks at 7.0 ppm to 8.5 ppm assigned to aromatic) were detected. These results demonstrate that the cation moiety of the polymer was converted from triethylammonium to alkylsulfonium.

Synthesis Example 2-12

Synthesis of Polymer P-12

At room temperature, 27 g of Polymer P-2 obtained in Synthesis Example 2-2, an amount (corresponding to 13 mmol) of an aqueous solution of 1-[4-(2-methoxyethoxy-1-naphthalenyl)tetrahydrothiophenium methanesulfonate prepared in Synthesis Example 1-5, 250 g of methylene chloride, and 120 g of water were mixed and stirred for 30 minutes, after which the organic layer was separated. To the organic layer were added an amount (corresponding to 3 mmol) of an aqueous solution of 1-[4-(2-methoxyethoxy)-1-naphthalenyl)tetrahydrothiophenium methanesulfonate and 100 g of water. The organic layer was separated, and washed 5 times with water. The reaction solution was concentrated, combined with methyl isobutyl ketone, and concentrated again. Diisopropyl ether was added to the concentrate for recrystallization. The solid was collected, washed with diisopropyl ether, and vacuum dried at 50° C., obtaining 25 g of the target, Polymer P-12. It had a copolymer compositional ratio of 8/55/7/30 mol % in the described order of monomers.

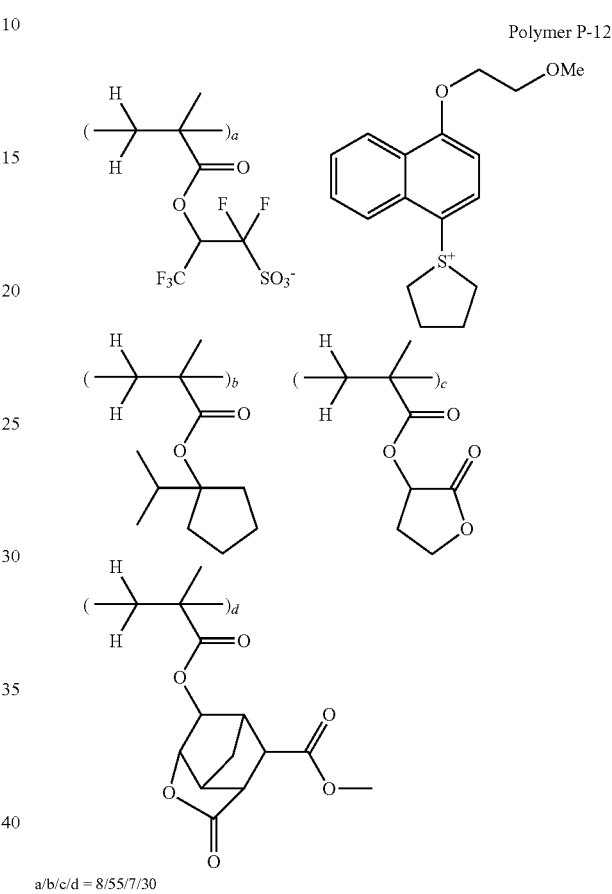

Figure 4:
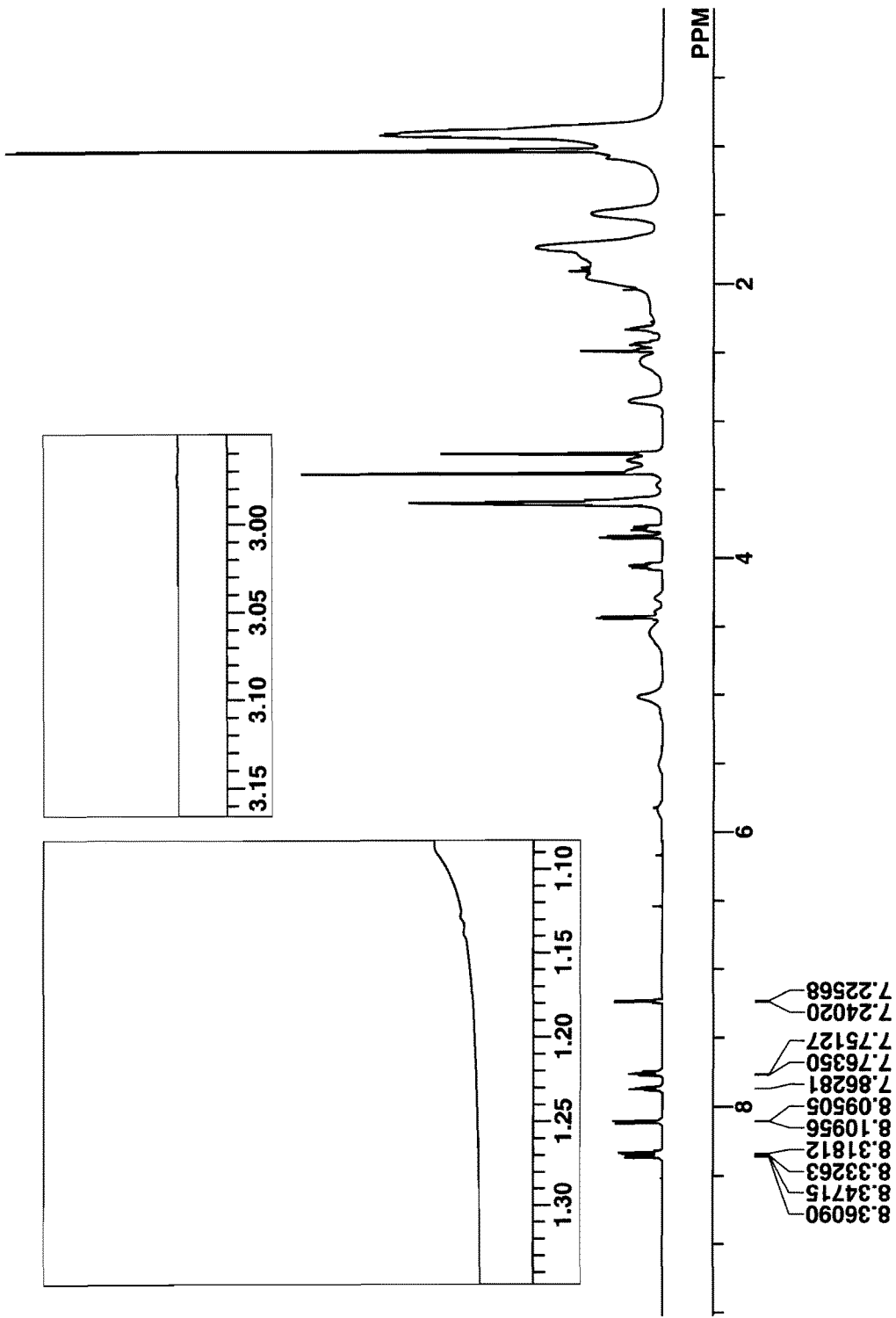
FIG. 4 is a diagram of $^1$H-NMR spectroscopy of Polymer P-12 in Synthesis Example 2-12.

FIG. 4 is the diagram of spectroscopy ($^1$H-NMR/DMSO-$d_6$) of the target. In $^1$H-NMR analysis, a trace amount of solvent (diisopropyl ether) was observed. A comparison of FIG. 4 with FIG. 2 reveals that in FIG. 4, the peak (9H, 1.2 ppm) assigned to methyl and the peak (6H, 3.1 ppm) assigned to methylene on the triethylammonium cation were extinguished, and instead, peaks indicative of alkylsulfonium salt (e.g., peaks at 7.0 ppm to 8.5 ppm assigned to aromatic) were detected. These results demonstrate that the cation moiety of the polymer was converted from triethylammonium to alkylsulfonium.

Synthesis Examples 2-13 to 2-22

Synthesis of Polymers P-13 to P-22

A series of resins shown in Table 1 were prepared by the same procedure as in Synthesis Example 2-11 except that the type and blending ratio (molar ratio) of monomers were changed.

Synthesis Examples 2-23 to 2-30

Synthesis of Polymers P-23 to P-30

A series of resins shown in Table 1 were prepared by the same procedure as in Synthesis Example 2-1 except that the type and blending ratio (molar ratio) of monomers were changed.

Comparative Synthesis Example 1

Trial Synthesis of Polymer P-31

In a flask purged with nitrogen, 3.2 g of 1-[4-(2,2,2-trifluoroethoxy)-1-naphthalenyl]tetrahydrothiophenium 1,1,3,3,3-pentafluoro-2-methacryloyloxypropane-1-sulfonate obtained in Synthesis Example 1-8, 2.4 g of 3-ethyl-3-exo-tetracyclo[4.4.0.1$^{2,5}$.1$^{7,10}$]dodecanyl methacrylate, 6.8 g of 1-isopropylcyclopentyl methacrylate, 4.4 g of 2-oxotetrahydrofuran-3-yl methacrylate, 3.4 g of 9-methoxycarbonyl-4-oxatricyclo[4.2.1.0$^{3,7}$]nonan-5-on-2-yl methacrylate, and 0.9 g of dimethyl 2,2'-azobis(2-methylpropionate) were dissolved in 35 g of methyl ethyl ketone to form a monomer solution. Another flask purged with nitrogen was charged with 12 g of methyl ethyl ketone, which was stirred and heated at 80° C. Thereafter, the monomer solution was added dropwise. An insoluble matter precipitated out during dropwise addition. As stirring became impossible, the reaction was stopped halfway.

Figure 5:
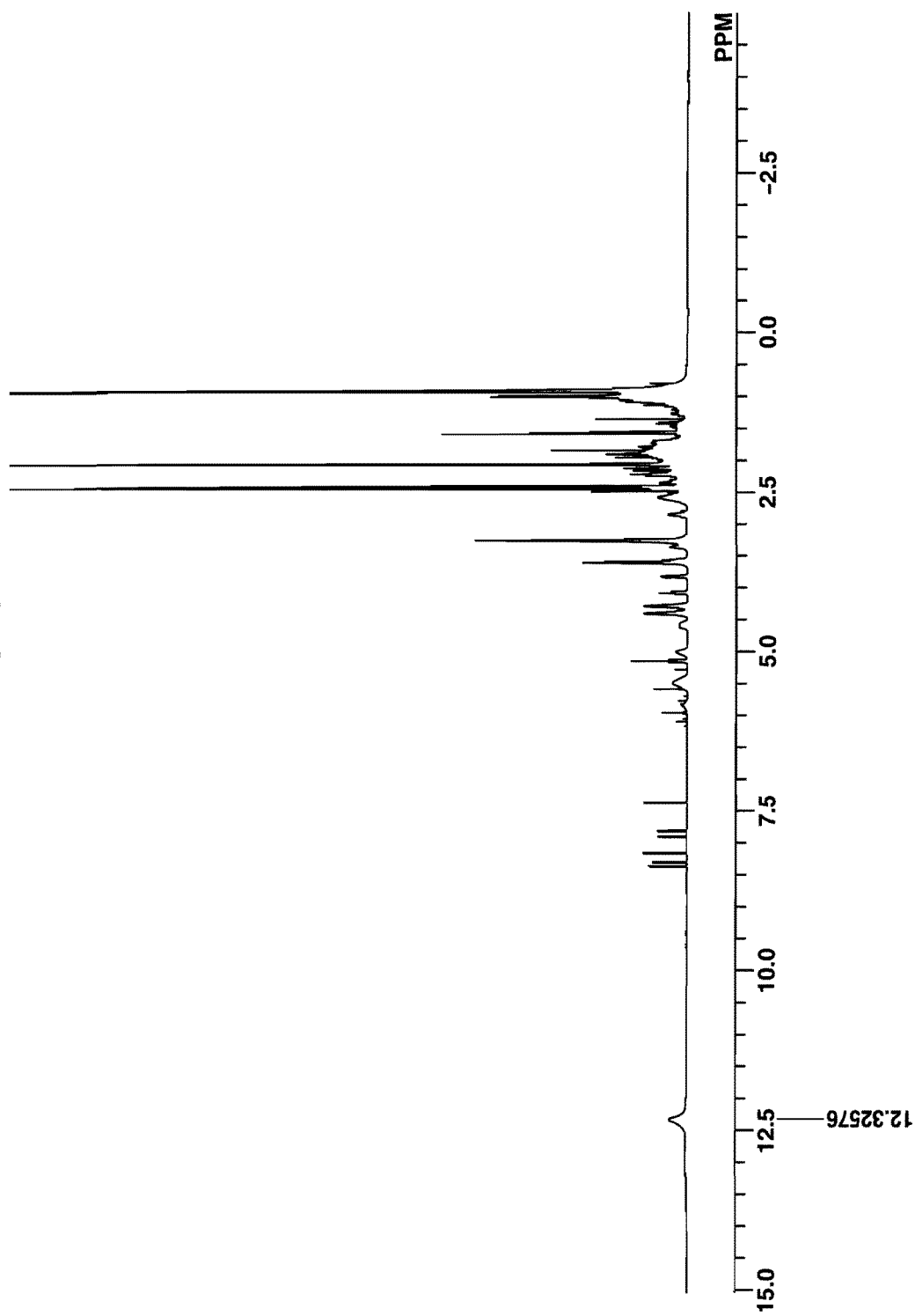
FIG. 5 is a diagram of $^1$H-NMR spectroscopy of the insoluble (corresponding to Polymer P-31) in Comparative Synthesis Example 1.

The insoluble matter was recovered from the reaction solution and analyzed by spectroscopy ($^1$H-NMR/DMSO-$d_6$), with the results shown in FIG. 5. Main peaks observed in FIG. 5 are assigned to the residual solvent, methyl ethyl ketone, and many other peaks are observed. Among others, a significant peak indicative of the presence of acid is observed at 12.3 ppm on the high magnetic field side. The reaction solution indicated an acidic pH value, suggesting that due to decomposition of alkylsulfonium and concomitant deprotection reaction of acid labile group, the desired polymer which should have the following compositional formula could not be formed.

Polymer P-31

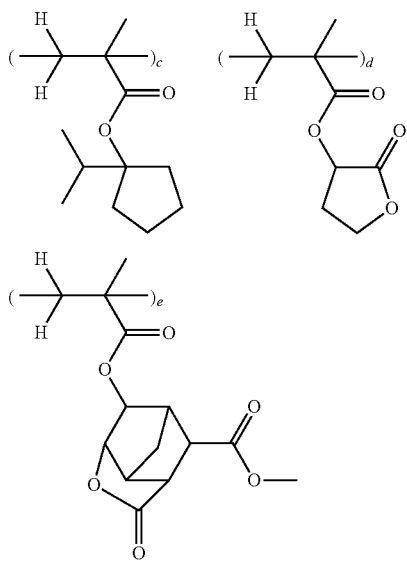

In contrast, as demonstrated by Synthesis Examples 2-11 and 2-12, the method of the invention was successful in producing the desired alkylsulfonium salt-containing polymer in a stable manner without the risk of decomposition.

TABLE 1

| Resin | Unit 1 (ratio) | Unit 2 (ratio) | Unit 3 (ratio) | Unit 4 (ratio) | Unit 5 (ratio) |
|---|---|---|---|---|---|
| P-1  | A-1 (0.08) | B-1 (0.50) | C-1 (0.22) | C-4 (0.20) | — |
| P-2  | A-1 (0.08) | B-1 (0.55) | C-1 (0.07) | C-4 (0.30) | — |
| P-3  | A-1 (0.04) | B-1 (0.55) | C-1 (0.11) | C-4 (0.30) | — |
| P-4  | A-1 (0.10) | B-3 (0.30) | C-3 (0.30) | C-7 (0.30) | — |
| P-5  | A-1 (0.10) | B-3 (0.30) | C-2 (0.40) | C-7 (0.20) | — |
| P-6  | A-1 (0.10) | B-3 (0.30) | C-3 (0.30) | C-6 (0.30) | — |
| P-7  | A-1 (0.10) | B-3 (0.30) | C-2 (0.30) | C-6 (0.30) | — |
| P-8  | A-1 (0.10) | B-2 (0.10) | B-4 (0.20) | C-3 (0.30) | C-7 (0.30) |
| P-9  | A-1 (0.10) | B-5 (0.30) | C-4 (0.30) | C-7 (0.30) | — |
| P-10 | A-1 (0.10) | B-3 (0.25) | C-2 (0.15) | C-5 (0.25) | C-7 (0.25) |
| P-11 | A-2 (0.08) | B-1 (0.50) | C-1 (0.22) | C-4 (0.20) | — |
| P-12 | A-3 (0.08) | B-1 (0.55) | C-1 (0.07) | C-4 (0.30) | — |
| P-13 | A-3 (0.04) | B-1 (0.55) | C-1 (0.11) | C-4 (0.30) | — |
| P-14 | A-4 (0.08) | B-1 (0.50) | C-1 (0.22) | C-4 (0.20) | — |
| P-15 | A-3 (0.08) | B-1 (0.50) | C-1 (0.22) | C-4 (0.20) | — |
| P-16 | A-3 (0.10) | B-3 (0.30) | C-3 (0.30) | C-7 (0.30) | — |
| P-17 | A-3 (0.10) | B-3 (0.30) | C-2 (0.40) | C-7 (0.20) | — |
| P-18 | A-3 (0.10) | B-3 (0.30) | C-3 (0.30) | C-6 (0.30) | — |
| P-19 | A-3 (0.10) | B-3 (0.30) | C-2 (0.30) | C-6 (0.30) | — |
| P-20 | A-3 (0.10) | B-2 (0.10) | B-4 (0.20) | C-3 (0.30) | C-7 (0.30) |
| P-21 | A-3 (0.10) | B-5 (0.30) | C-4 (0.30) | C-7 (0.30) | — |
| P-22 | A-3 (0.10) | B-3 (0.25) | C-2 (0.15) | C-5 (0.25) | C-7 (0.25) |
| P-23 | A-5 (0.08) | B-1 (0.50) | C-1 (0.22) | C-4 (0.20) | — |
| P-24 | A-5 (0.08) | B-1 (0.55) | C-1 (0.07) | C-4 (0.30) | — |
| P-25 | A-6 (0.08) | B-1 (0.55) | C-1 (0.07) | C-4 (0.30) | — |
| P-26 | A-5 (0.10) | B-3 (0.30) | C-3 (0.30) | C-6 (0.30) | — |
| P-27 | A-5 (0.10) | B-5 (0.30) | C-4 (0.30) | C-7 (0.30) | — |
| P-28 | B-1 (0.50) | C-1 (0.20) | C-4 (0.30) | — | — |
| P-29 | B-3 (0.40) | C-3 (0.30) | C-7 (0.30) | — | — |
| P-30 | B-5 (0.40) | C-4 (0.30) | C-7 (0.30) | — | — |

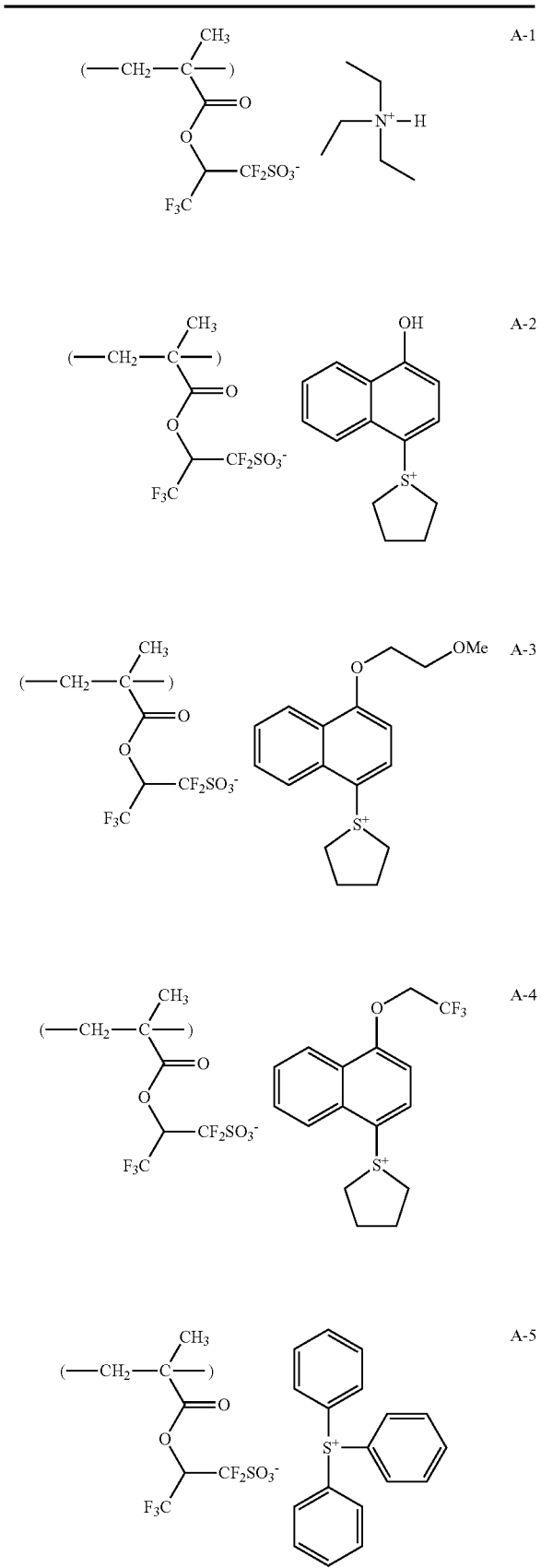

TABLE 3-continued

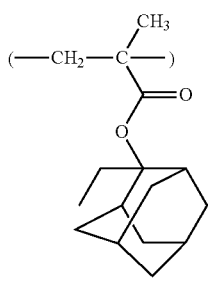
B-5

TABLE 4

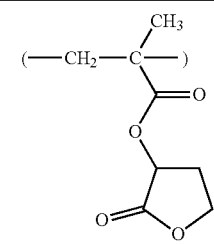
C-1

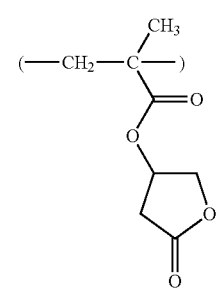
C-2

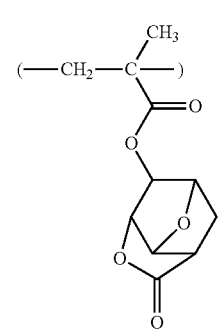
C-3

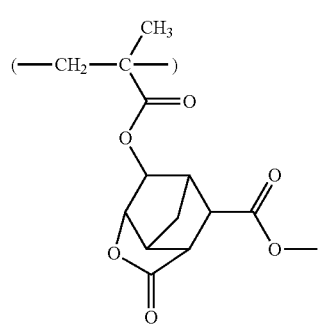
C-4

TABLE 4-continued

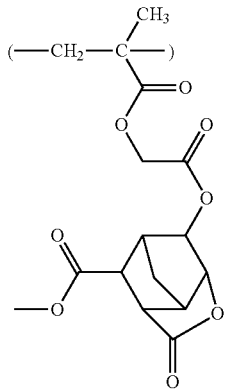
C-5

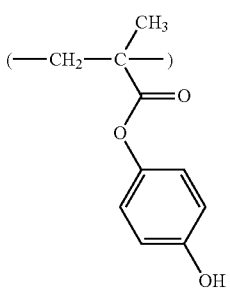
C-6

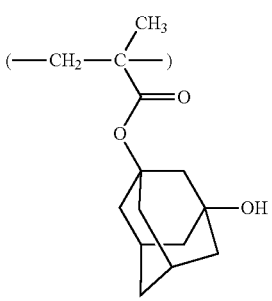
C-7

Preparation of Resist Composition

Examples 1-1 to 1-12 & Comparative Examples 1-1 to 1-8

Resist compositions in solution form were prepared by mixing and dissolving a polymer (obtained in Synthesis Examples), photoacid generator, amine quencher, and alkali-soluble surfactant (F-1) in a solvent according to the formulation shown in Table 5 and filtering through a Teflon® filter having a pore size of 0.2 μm. In all runs, the solvent contained 0.01 wt % of surfactant (F-2).

TABLE 5

|  |  | Resist | Resin (pbw) | PAG (pbw) | Quencher (pbw) | Surfactant (pbw) | Solvent 1 (pbw) | Solvent 2 (pbw) |
|---|---|---|---|---|---|---|---|---|
| Example | 1-1 | R-1 | P-11(80) | — | Q-1(1.6) | F-1(5.0) | PGMEA(1,728) | GBL(192) |
|  | 1-2 | R-2 | P-12(80) | — | Q-1(1.6) | F-1(5.0) | PGMEA(1,728) | GBL(192) |
|  | 1-3 | R-3 | P-13(80) | PAG-1(3.8) | Q-1(1.6) | F-1(5.0) | PGMEA(1,728) | GBL(192) |
|  | 1-4 | R-4 | P-14(80) | — | Q-1(1.6) | F-1(5.0) | PGMEA(1,728) | GBL(192) |
|  | 1-5 | R-5 | P-15(80) | — | Q-1(1.6) | F-1(5.0) | PGMEA(1,728) | GBL(192) |
|  | 1-6 | R-6 | P-16(80) | — | Q-1(1.6) | F-1(5.0) | PGMEA(1,344) | CyHO(576) |
|  | 1-7 | R-7 | P-17(80) | — | Q-1(1.6) | F-1(5.0) | PGMEA(1,344) | CyHO(576) |
|  | 1-8 | R-8 | P-18(80) | — | Q-1(1.6) | F-1(5.0) | PGMEA(1,344) | CyHO(576) |
|  | 1-9 | R-9 | P-19(80) | — | Q-1(1.6) | F-1(5.0) | PGMEA(1,344) | CyHO(576) |
|  | 1-10 | R-10 | P-20(80) | — | Q-1(1.6) | F-1(5.0) | PGMEA(1,344) | CyHO(576) |
|  | 1-11 | R-11 | P-21(80) | — | Q-1(1.6) | F-1(5.0) | PGMEA(1,344) | CyHO(576) |
|  | 1-12 | R-12 | P-22(80) | — | Q-1(1.6) | F-1(5.0) | PGMEA(1,344) | CyHO(576) |
| Comparative Example | 1-1 | R-13 | P-23(80) | — | Q-1(1.6) | F-1(5.0) | PGMEA(1,728) | GBL(192) |
|  | 1-2 | R-14 | P-24(80) | — | Q-1(1.6) | F-1(5.0) | PGMEA(1,728) | GBL(192) |
|  | 1-3 | R-15 | P-25(80) | — | Q-1(1.6) | F-1(5.0) | PGMEA(1,728) | GBL(192) |
|  | 1-4 | R-16 | P-26(80) | — | Q-1(1.6) | F-1(5.0) | PGMEA(1,344) | CyHO(576) |
|  | 1-5 | R-17 | P-27(80) | — | Q-1(1.6) | F-1(5.0) | PGMEA(1,344) | CyHO(576) |
|  | 1-6 | R-18 | P-28(80) | PAG-1(7.6) | Q-1(1.6) | F-1(5.0) | PGMEA(1,728) | GBL(192) |
|  | 1-7 | R-19 | P-29(80) | PAG-1(7.6) | Q-1(1.6) | F-1(5.0) | PGMEA(1,344) | CyHO(576) |
|  | 1-8 | R-20 | P-30(80) | PAG-2(6.6) | Q-1(1.6) | F-1(5.0) | PGMEA(1,344) | CyHO(576) |

The PAG, solvent, amine quencher, alkali-soluble surfactant (F-1) and surfactant (F-2) used herein are identified below.

Photoacid Generator

PAG-1: triphenylsulfonium nonafluoro-1-butanesulfonate

PAG-2: triphenylsulfonium 2-(adamantane-1-carbonyloxy)-1,1,3,3,3-pentafluoropropane-1-sulfonate (see JP-A 2007-145797)

Organic Solvent

PGMEA: propylene glycol monomethyl ether acetate

GBL: γ-butyrolactone

CyHO: cyclohexanone

Quencher

Q-1: 2,6-diisopropylaniline

Surfactant

F-1: poly(3,3,3-trifluoro-2-hydroxy-1,1-dimethyl-2-trifluoromethylpropyl methacrylate/1,1,1-trifluoro-2-hydroxy-6-methyl-2-trifluoromethylhept-4-yl methacrylate) (described in JP-A 2008-122932) Mw 7,300, Mw/Mn=1.86

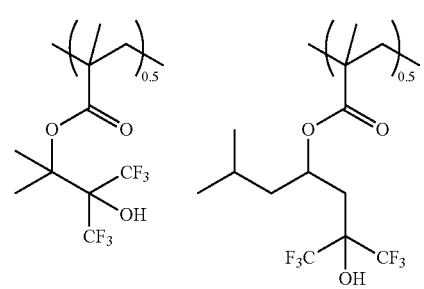

F-2: 3-methyl-3-(2,2,2-trifluoroethoxymethyl)oxetane/tetrahydrofuran/2,2-dimethyl-1,3-propane diol copolymer (Omnova Solutions, Inc.)

a:(b+b'):(c+c')=1:4-7:0.01-1 (molar ratio) Mw=1,500

Evaluation of Resist

Examples 2-1 to 2-12 and Comparative Examples 2-1 to 2-8

An antireflective coating solution (ARC-29A by Nissan Chemical Industries Co., Ltd.) was coated onto a silicon substrate and baked at 200° C. for 60 seconds to form an ARC film of 100 nm thick. The resist solution was spin coated onto the ARC film and baked on a hot plate at 100° C. for 60 seconds to form a resist film of 90 nm thick. The resist film was exposed according to the ArF immersion lithography on an ArF excimer laser scanner NSR-S610C (Nikon Corp., NA 1.30, dipole illumination, 6% halftone phase shift mask). The resist film was baked (PEB) at an arbitrary temperature for 60 seconds and developed in a 2.38 wt % aqueous solution of tetramethylammonium hydroxide for 60 seconds.

The resist was evaluated by observing a 40-nm 1:1 line-and-space pattern under an electron microscope. The optimum dose (Eop) was a dose (mJ/cm$^2$) which provided a line width of 40 nm. The profile of a L/S pattern at the optimum dose was compared and evaluated according to the following criterion.

Passed: Pattern of rectangular profile with perpendicular sidewall

Rejected: Pattern of tapered profile with sharply graded sidewall, or top-rounded profile due to top loss After a 80-nm pitch line-and-space pattern designed such that the line pattern after transfer increased at an increment of 2 nm from 36 nm to 44 nm was printed at the optimum exposure, the line width of the resist pattern was measured under SEM. The line width of the resist pattern was plotted relative to the line width of the mask, from which a slope was computed by linear approximation and reported as a mask error enhancement factor (MEEF). A smaller value of MEEF is better because it indicates that the influence of a finish error of the mask pattern is minimized. Further a width variation of lines of a 40-nm 1:1 line-and-space pattern was measured under SEM and reported as line width roughness (LWR). A smaller value of LWR is better because it indicates minimized fluctuation of a line pattern.

The collapse limit was a minimum width (nm) of lines which could be resolved without collapse when the line size was narrowed by increasing the exposure dose. A smaller value indicates better collapse resistance.

The test results of inventive and comparative resist compositions in Table 5 are shown in Table 6.

TABLE 6

| | | Resist | Eop (mJ/cm²) | Profile | MEEF | Collapse limit (nm) | LWR (nm) |
|---|---|---|---|---|---|---|---|
| Example | 2-1 | R-1 | 34 | Passed | 2.2 | 32 | 3.8 |
| | 2-2 | R-2 | 32 | Passed | 2.1 | 31 | 4.0 |
| | 2-3 | R-3 | 33 | Passed | 2.0 | 29 | 4.2 |
| | 2-4 | R-4 | 32 | Passed | 2.2 | 30 | 3.9 |
| | 2-5 | R-5 | 33 | Passed | 2.1 | 30 | 3.9 |
| | 2-6 | R-6 | 36 | Passed | 2.4 | 32 | 4.0 |
| | 2-7 | R-7 | 35 | Passed | 2.4 | 31 | 4.1 |
| | 2-8 | R-8 | 35 | Passed | 2.3 | 32 | 4.1 |
| | 2-9 | R-9 | 34 | Passed | 2.3 | 32 | 4.0 |
| | 2-10 | R-10 | 37 | Passed | 2.4 | 31 | 4.2 |
| | 2-11 | R-11 | 35 | Passed | 2.4 | 32 | 4.3 |
| | 2-12 | R-12 | 39 | Passed | 2.3 | 32 | 4.2 |
| Comparative Example | 2-1 | R-13 | 32 | Rejected | 3.2 | 36 | 5.1 |
| | 2-2 | R-14 | 31 | Rejected | 3.4 | 36 | 5.0 |
| | 2-3 | R-15 | 31 | Rejected | 3.6 | 37 | 5.6 |
| | 2-4 | R-16 | 35 | Rejected | 3.1 | 35 | 5.4 |
| | 2-5 | R-17 | 36 | Rejected | 3.1 | 36 | 5.5 |
| | 2-6 | R-18 | 35 | Rejected | 3.5 | 36 | 5.6 |
| | 2-7 | R-19 | 38 | Rejected | 3.4 | 37 | 5.7 |
| | 2-8 | R-20 | 40 | Rejected | 3.6 | 37 | 5.8 |

Because of good pattern profile, low values of MEEF and LWR, collapse resistance and high resolution as seen from the data in Table 6, the resist compositions comprising an alkylsulfonium salt-containing polymer within the scope of the invention are superior to the resist compositions comprising a triarylsulfonium salt-containing polymer or sulfonium salt-free polymer.

While the invention has been illustrated and described in typical embodiments, it is not intended to be limited to the details shown. Any modified embodiments having substantially the same features and achieving substantially the same results as the technical idea disclosed herein are within the spirit and scope of the invention.

Japanese Patent Application No. 2012-039622 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A sulfonic acid anion-containing polymer comprising a recurring unit which is one selected from the group consisting of the following formulae:

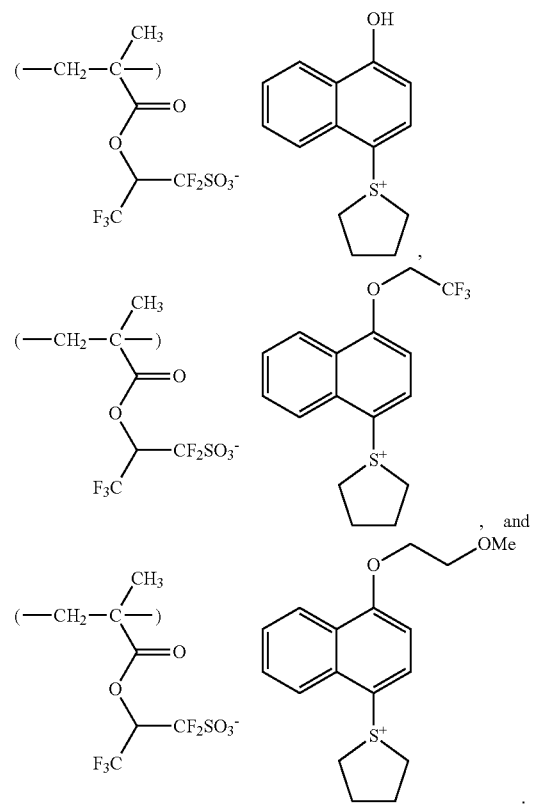

2. The polymer of claim 1, comprising recurring units having the general formula (2):

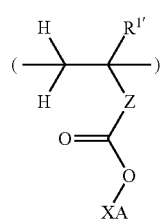

(2)

wherein $R^{1'}$ is hydrogen, fluorine, methyl or trifluoromethyl, Z is a single bond, phenylene, naphthylene or (backbone)-C(=O)—O—Z'—, Z' is a straight, branched or cyclic $C_1$-$C_{10}$ alkylene group which may contain a hydroxyl radical, ether bond, ester bond, or lactone ring, or a phenylene or naphthylene group, and XA is an acid labile group.

3. The polymer of claim 1, comprising recurring units having the general formula (3):

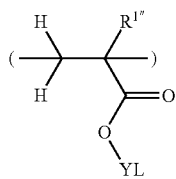 (3)

wherein $R^{1'''}$ is hydrogen, fluorine, methyl or trifluoromethyl, and YL is a polar group having one or more structures selected from the group consisting of hydroxyl, cyano, carbonyl, ether bond, ester bond, sulfonic acid ester bond, carbonate, lactone ring, sultone ring, and carboxylic anhydride.

4. A resist composition comprising the polymer of claim 1.

5. The resist composition of claim 4, further comprising a photoacid generator.

6. The resist composition of claim 4, further comprising a quencher.

7. The resist composition of claim 4, further comprising a solvent.

8. The resist composition of claim 4, further comprising a surfactant.

9. A pattern forming process comprising the steps of coating the resist composition of claim 4 onto a substrate, baking to form a resist film, exposing the resist film to high-energy radiation, and developing it in a developer.

10. The pattern forming process of claim 9 wherein the high-energy radiation has a wavelength in the range of 180 to 250 nm.

11. The pattern forming process of claim 9 wherein the step of exposing to high-energy radiation includes immersion lithography of exposing the resist film to radiation via a liquid.

12. The pattern forming process of claim 11, further comprising the step of forming a protective film on the resist film, so that the protective film intervenes between the resist film and the liquid during the immersion lithography.

13. The pattern forming process of claim 9 wherein the high-energy radiation is EUV or EB.

* * * * *